(12) United States Patent
Nakagawa et al.

(10) Patent No.: US 10,559,499 B2
(45) Date of Patent: Feb. 11, 2020

(54) SEMICONDUCTOR DEVICE, DISPLAY SYSTEM, AND ELECTRONIC DEVICE

(71) Applicant: Semiconductor Energy Laboratory Co., Ltd., Atsugi-shi, Kanagawa-ken (JP)

(72) Inventors: Takashi Nakagawa, Kanagawa (JP); Yuki Okamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/653,646

(22) Filed: Jul. 19, 2017

(65) Prior Publication Data

US 2018/0033696 A1 Feb. 1, 2018

(30) Foreign Application Priority Data

Jul. 29, 2016 (JP) ................................. 2016-149119

(51) Int. Cl.
*G06F 17/50* (2006.01)
*G09G 5/399* (2006.01)
(Continued)

(52) U.S. Cl.
CPC ........ *H01L 21/822* (2013.01); *G06F 17/5054* (2013.01); *G09G 3/3659* (2013.01); *G09G 5/001* (2013.01); *G09G 5/399* (2013.01); *G11C 8/10* (2013.01); *G09G 2320/0276* (2013.01); *G09G 2320/0673* (2013.01)

(58) Field of Classification Search
CPC . H01L 21/822; G06F 17/5054; G09G 3/3659; G09G 5/001; G09G 5/399; G09G 2320/0276; G09G 2320/0673; G11C 8/10
See application file for complete search history.

(56) References Cited

U.S. PATENT DOCUMENTS 7,061,504 B1 * 6/2006 Glen .................... G09G 3/2011
345/600
9,065,438 B2 6/2015 Aoki et al.
(Continued)

FOREIGN PATENT DOCUMENTS

JP 2007-096055 A 4/2007
JP 2007-123861 A 5/2007

*Primary Examiner* — Stephen G Sherman
(74) *Attorney, Agent, or Firm* — Fish & Richardson P.C.

(57) ABSTRACT

A novel semiconductor device, a semiconductor device with low power consumption, a semiconductor device capable of displaying a high-quality image, or a semiconductor device with a small area is provided. The semiconductor device includes an image processing portion and a driver circuit. The image processing portion includes a processor and a correction circuit. The correction circuit includes a PLD. The correction circuit is capable of correcting data input from the processor using the PLD. The processor is capable of outputting data corrected by the correction circuit to the driver circuit as a video signal. The PLD is capable of executing first gamma correction by input of first configuration data. The PLD is capable of executing second gamma correction by input of second configuration data. The content of the first gamma correction is different from that of the second gamma correction.

16 Claims, 26 Drawing Sheets

(51) Int. Cl.
  *H01L 21/822*  (2006.01)
  *G09G 3/36*  (2006.01)
  *G09G 5/00*  (2006.01)
  *G11C 8/10*  (2006.01)

(56) References Cited

U.S. PATENT DOCUMENTS

| | | | |
|---|---|---|---|
| 9,172,370 B2 | 10/2015 | Ikeda et al. | |
| 9,276,577 B2 | 3/2016 | Kurokawa | |
| 9,294,096 B2 | 3/2016 | Takemura | |
| 9,379,706 B2 | 6/2016 | Kurokawa | |
| 9,384,813 B2 | 7/2016 | Aoki et al. | |
| 9,461,646 B2 | 10/2016 | Kozuma et al. | |
| 9,479,145 B2 | 10/2016 | Okamoto et al. | |
| 9,774,331 B2 | 9/2017 | Takemura | |
| 9,793,905 B2 | 10/2017 | Okamoto et al. | |
| 9,886,883 B2 * | 2/2018 | Ahn | G09G 3/2003 |
| 2007/0072439 A1 | 3/2007 | Akimoto et al. | |
| 2007/0081191 A1 * | 4/2007 | Moriya | G09G 3/2003 |
| | | | 358/3.01 |
| 2010/0225571 A1 * | 9/2010 | Sakariya | G09G 3/2011 |
| | | | 345/102 |
| 2012/0154462 A1 * | 6/2012 | Hempson | G09G 3/342 |
| | | | 345/691 |
| 2014/0334227 A1 * | 11/2014 | Ueda | H01L 29/7869 |
| | | | 365/154 |
| 2016/0261272 A1 | 9/2016 | Ikeda et al. | |
| 2017/0019117 A1 | 1/2017 | Okamoto et al. | |
| 2017/0085264 A1 | 3/2017 | Kozuma et al. | |
| 2017/0141776 A1 | 5/2017 | Kozuma | |
| 2017/0187379 A1 | 6/2017 | Kurokawa | |
| 2017/0337884 A1 | 11/2017 | Kurokawa | |

\* cited by examiner

SEMICONDUCTOR DEVICE, DISPLAY SYSTEM, AND ELECTRONIC DEVICE

BACKGROUND OF THE INVENTION

1. Field of the Invention

One embodiment of the present invention relates to a semiconductor device, a display system, and an electronic device.

Note that one embodiment of the present invention is not limited to the above technical field. Examples of the technical field of one embodiment of the present invention disclosed in this specification and the like include a semiconductor device, a display device, a light-emitting device, a power storage device, a memory device, a display system, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device may each include a semiconductor device.

2. Description of the Related Art

Flat panel displays typified by liquid crystal display devices and light-emitting display devices are widely used for displaying images. Although transistors used in these display devices are mainly manufactured using silicon semiconductors, attention has been drawn to a technique in which, instead of a silicon semiconductor, a metal oxide exhibiting semiconductor characteristics is used for transistors in recent years. For example, in Patent Documents 1 and 2, a technique is disclosed in which a transistor manufactured using zinc oxide or an In—Ga—Zn-based oxide for a semiconductor layer is used in a pixel of a display device.

REFERENCE

Patent Document

[Patent Document 1] Japanese Published Patent Application No. 2007-96055
[Patent Document 2] Japanese Published Patent Application No. 2007-123861

SUMMARY OF THE INVENTION

An object of one embodiment of the present invention is to provide a novel semiconductor device. Another object of one embodiment of the present invention is to provide a semiconductor device with low power consumption. Another object of one embodiment of the present invention is to provide a semiconductor device capable of displaying a high-quality image. Another object of one embodiment of the present invention is to provide a semiconductor device with a small area.

One embodiment of the present invention does not necessarily achieve all the objects listed above and only needs to achieve at least one of the objects. The description of the above objects does not preclude the existence of other objects. Other objects will be apparent from and can be derived from the description of the specification, the claims, the drawings, and the like.

A semiconductor device of one embodiment of the present invention includes an image processing portion and a driver circuit. The image processing portion includes a processor and a correction circuit. The correction circuit includes a programmable logic device. The correction circuit is capable of correcting data input from the processor using the programmable logic device. The processor is capable of outputting data corrected by the correction circuit to the driver circuit as a video signal. The programmable logic device is capable of executing first gamma correction by input of first configuration data. The programmable logic device is capable of executing second gamma correction by input of second configuration data. The content of the first gamma correction is different from the content of the second gamma correction.

In the semiconductor device of one embodiment of the present invention, the programmable logic device includes a first context and a second context, the first context is capable of configuring a circuit configured to execute the first gamma correction, and the second context is capable of configuring a circuit configured to execute the second gamma correction.

In the semiconductor device of one embodiment of the present invention, table approximation is used for the first gamma correction, and polygonal line approximation is used for the second gamma correction.

In the semiconductor device of one embodiment of the present invention, the correction circuit includes a memory device and a switch circuit, the memory device is capable of storing a look-up table used for the first gamma correction, the switch circuit is capable of stopping power supply to the memory device in a period during which the second gamma correction is executed, and the memory device includes a transistor including a metal oxide in a channel formation region.

In the semiconductor device of one embodiment of the present invention, the programmable logic device includes a configuration memory, and the configuration memory includes a transistor including a metal oxide in a channel formation region.

A display system of one embodiment of the present invention includes a control portion including the above semiconductor device and a display portion. The control portion is capable of generating a video signal using image data input to the control portion, and the display portion is capable of performing display using the video signal generated in the control portion.

In the display system of one embodiment of the present invention, the display portion includes a first pixel group including a plurality of first pixels and a second pixel group including a plurality of second pixels, the plurality of first pixels each include a light-emitting element, the plurality of second pixels each include a reflective liquid crystal element, a video signal subjected to the first gamma correction using table approximation is supplied to the first pixel group, and a video signal subjected to the second gamma correction using polygonal line approximation is supplied to the second pixel group.

An electronic device of one embodiment of the present invention includes the above display system in which a character, a figure, or an image is identified using a touch sensor provided in the display portion.

According to one embodiment of the present invention, a novel semiconductor device can be provided. According to another embodiment of the present invention, a semiconductor device with low power consumption can be provided. According to another embodiment of the present invention, a semiconductor device capable of displaying a high-quality image can be provided. According to another embodiment of the present invention, a semiconductor device with a small area can be provided.

Note that the description of these effects does not preclude the existence of other effects. One embodiment of the present invention does not necessarily achieve all of these effects. Other effects will be apparent from and can be derived from the description of the specification, the claims, the drawings, and the like.

BRIEF DESCRIPTION OF THE DRAWINGS

FIG. 9 illustrates a configuration example of a PLD.

FIGS. 17A, 17B1, and 17B2 illustrate a structure example of a display device.

DETAILED DESCRIPTION OF THE INVENTION

Figure 1:
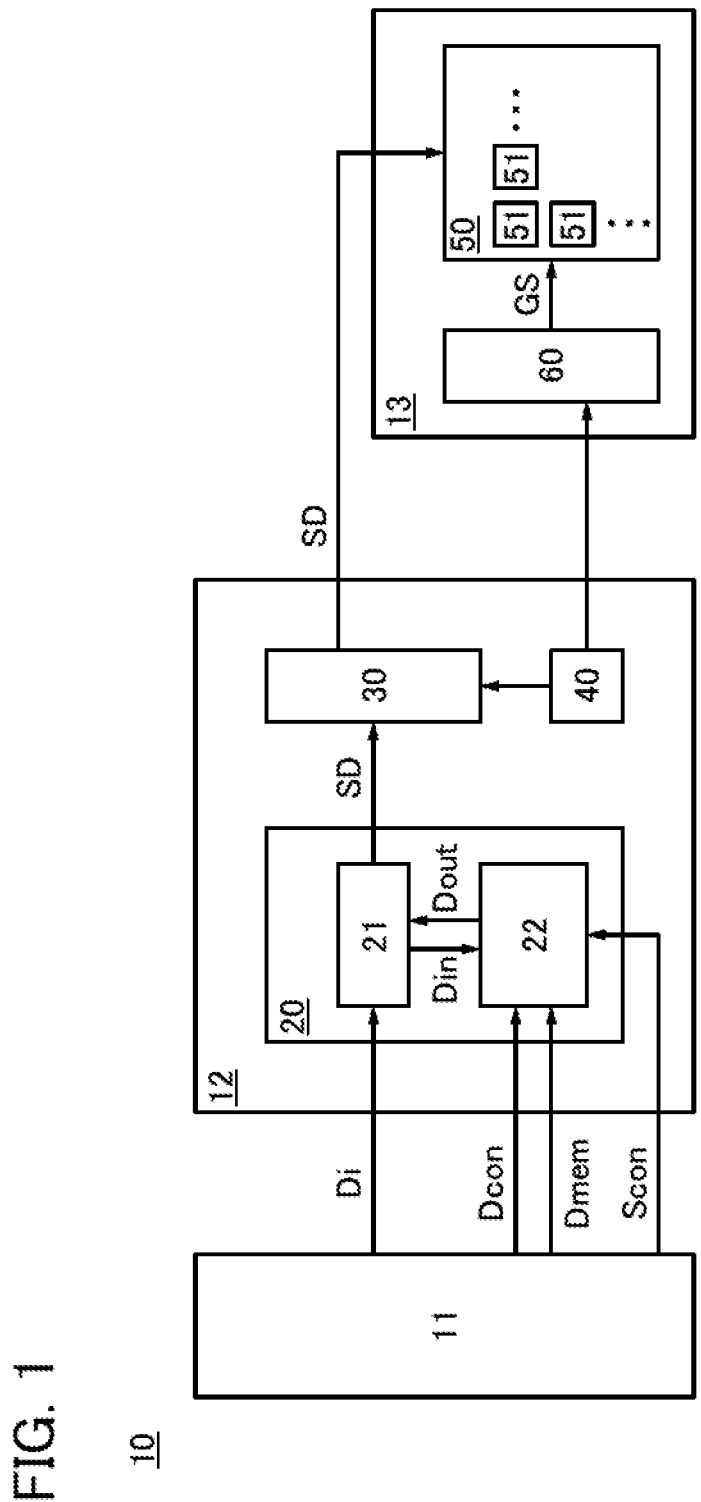
FIG. 1 illustrates a configuration example of a display system.

Embodiments of the present invention will be described below in detail with reference to the accompanying drawings. Note that one embodiment of the present invention is not limited to the following description of the embodiments and it is easily understood by those skilled in the art that the mode and details can be variously changed without departing from the spirit and scope of the present invention. Therefore, the present invention should not be interpreted as being limited to the description of the embodiments below.

One embodiment of the present invention includes, in its category, devices such as a semiconductor device, a memory device, a display device, an imaging device, and a radio frequency (RF) tag. The display device includes, in its category, a liquid crystal display device, a light-emitting device including pixels each provided with a light-emitting element typified by an organic light-emitting element, electronic paper, a digital micromirror device (DMD), a plasma display panel (PDP), a field emission display (FED), and the like.

In this specification and the like, a metal oxide means an oxide of a metal in a broad sense. Metal oxides are classified into an oxide insulator, an oxide conductor (including a transparent oxide conductor), an oxide semiconductor (also simply referred to as an OS), and the like. For example, a metal oxide used in a channel formation region of a transistor is called an oxide semiconductor in some cases. That is, a metal oxide that has at least one of an amplifying function, a rectifying function, and a switching function can be called a metal oxide semiconductor, or OS for short. In the following description, a transistor including a metal oxide in a channel formation region is also referred to as an OS transistor.

In this specification and the like, a metal oxide including nitrogen is also called a metal oxide in some cases. Moreover, a metal oxide including nitrogen may be called a metal oxynitride.

Furthermore, in this specification and the like, an explicit description "X and Y are connected" means that X and Y are electrically connected, X and Y are functionally connected, and X and Y are directly connected. Accordingly, without limitation to a predetermined connection relation, for example, a connection relation shown in drawings or text, another connection relation is included in the drawings or the text. Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is turned on or off to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power supply circuit (e.g., a step-up converter circuit or a step-down converter circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

In addition, components denoted by the same reference numerals in different drawings represent the same components unless otherwise specified.

Even when independent components are electrically connected to each other in the drawing, one component has functions of a plurality of components in some cases. For example, when part of a wiring also functions as an electrode, one conductive film functions as a wiring and an electrode. Thus, "electrical connection" in this specification includes, in its category, such a case where one conductive film has functions of a plurality of components.

Embodiment 1

In this embodiment, a display system of one embodiment of the present invention will be described.
<Configuration Example of Display System>
FIG. 1 illustrates a configuration example of a display system 10 including a processor 11, a control portion 12, and a display portion 13. The display system 10 has a function of generating a signal for displaying a predetermined image (hereinafter also referred to as a video signal) and displaying an image based on the video signal.

The processor 11 is a host of the display system 10 and has a function of outputting data Di to the control portion 12. The data Di is data corresponding to an image displayed on the display portion 13 (hereinafter also referred to as image data) and is used for generation of a video signal in the control portion 12.

The control portion 12 has a function of generating a video signal and a function of controlling an image displayed on the display portion 13. The control portion 12 can be formed using a semiconductor device; thus, it is hereinafter also referred to a semiconductor device 12. The semiconductor device 12 includes an image processing portion 20, a driver circuit 30, and a timing controller 40.

The display portion 13 has a function of displaying an image with the use of a video signal input from the control portion 12. The display portion 13 includes a pixel group 50 including a plurality of pixels 51 and a driver circuit 60.

The image processing portion 20 has a function of generating a video signal on the basis of the data Di. The image processing portion 20 includes a processor 21 to which the data Di is input and a correction circuit 22 connected to the processor 21.

The processor 21 has a function of generating a video signal by controlling the operation of each circuit in the image processing portion 20. A video signal generated by the processor 21 is output to the driver circuit 30 as a signal SD.

The correction circuit 22 has a function of executing correction of the data Din input from the processor 21. Specifically, the correction circuit 22 has a function of executing gamma correction. Then, data which has been subjected to gamma correction in the correction circuit 22 is output to the processor 21 as data Dout. In this manner, the processor 21 can output a video signal which has been subjected to gamma correction to the driver circuit 30.

The driver circuit 30 has a function of supplying the signal SD to the display portion 13. The signal SD is input from the image processing portion 20 to the driver circuit 30, and the signal SD is output from the driver circuit 30 to the pixel group 50 at a predetermined timing. The signal SD is input to the display portion 13, and the display portion 13 displays a predetermined image based on the signal SD. Note that the driver circuit 30 may alternatively be provided in the display portion 13.

The timing controller 40 has a function of generating a timing signal. A timing signal generated in the timing controller 40 is used to control the timing of the driver circuit 30 to output the signal SD or is used to control the timing of the driver circuit 60 to output a signal GS, for example.

The pixel group 50 includes the plurality of pixels 51 and has a function of displaying an image. The pixel 51 includes a display element and has a function of displaying a predetermined gray level. The plurality of pixels 51 each display a predetermined gray level, whereby the pixel group 50 displays a predetermined image.

Examples of the display element in the pixel 51 include a liquid crystal element and a light-emitting element. As the liquid crystal element, a transmissive liquid crystal element, a reflective liquid crystal element, a transflective liquid crystal element, or the like can be used. Alternatively, for example, a micro electro mechanical systems (MEMS) shutter element, an optical interference type MEMS element, or a display element using a microcapsule method, an electrophoretic method, an electrowetting method, an Electronic Liquid Powder (registered trademark) method, or the like can be used as the display element.

Examples of the light-emitting element include a self-luminous element such as an organic light-emitting diode (OLED), a light-emitting diode (LED), a quantum-dot light-emitting diode (QLED), and a semiconductor laser.

The driver circuit 60 has a function of supplying the signal GS for selecting a predetermined pixel 51 (hereinafter, the signal is also referred to as a selection signal). A video signal is supplied to the pixel 51 to which a selection signal has been supplied, and the pixel 51 displays a predetermined gray level.

The value of the signal SD is not always proportional to the gray level displayed in the pixel 51 by the influence of, for example, a circuit configuration of the pixel 51 and characteristics of the display element. That is, the value of the signal SD does not directly influence the gray level of the pixel 51 in some cases. Therefore, in order to accurately control the gray level of the pixel 51, it is preferable to execute gamma correction in the correction circuit 22 so that the characteristics of the pixel 51 are incorporated in the signal SD.

Figure 2A:
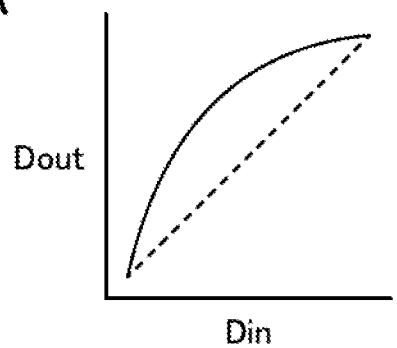
FIGS. 2A to 2C each show an example of gamma correction.
Figure 2B:
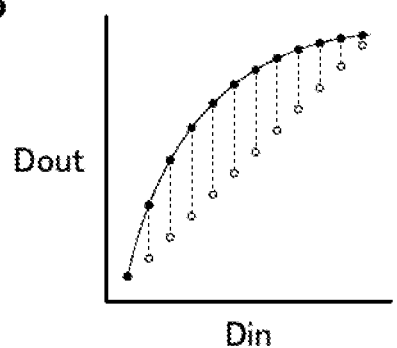
Figure 2C:
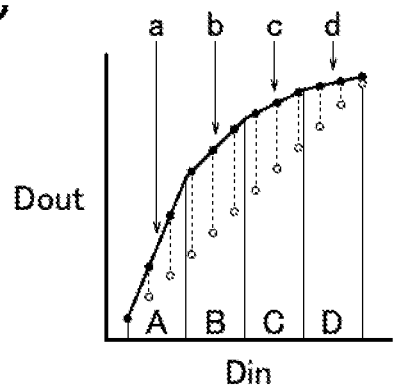

FIGS. 2A to 2C each show an example of gamma correction. FIG. 2A is a graph showing a relation between the data Din input to the correction circuit 22 and the data Dout output from the correction circuit 22. The correction circuit 22 has a function of executing gamma correction of the data Din to convert it into the data Dout. In FIG. 2A, the dashed line represents the case where gamma correction is not executed, whereas the solid line represents the case where gamma correction is executed. FIGS. 2B and 2C each show a specific gamma correction method for obtaining the characteristics represented by the solid line in FIG. 2A.

FIG. 2B shows a method in which the values of the data Dout corresponding to the respective values of the data Din that can be input to the correction circuit 22 are stored in advance in the correction circuit 22 and the data Dout having a specific value corresponding to the input data Din is output. In this method, a look-up table showing the correspondence between input data and output data is stored in a memory device provided in the correction circuit 22. As shown in FIG. 2B, the values of the input data Din are corrected to predetermined values (in the drawing, an open circle is corrected to a black circle) in accordance with the look-up table and output as the data Dout. In the following description, such gamma correction is referred to as table approximation.

In order to execute table approximation, a look-up table showing the correspondence between the values of the data Din and the values of the data Dout needs to be stored in the memory device, and the amount of data read and written in the memory device is relatively large. Therefore, the power consumption or the area of the memory device might be increased. However, the values of the data Din can be independently corrected, so that gamma correction can be executed with high accuracy. Thus, the quality of an image displayed on the display portion 13 can be improved.

FIG. 2C shows a method in which the range of the data Din that can be input to the correction circuit 22 is divided into a plurality of regions and the value of the input data Din is corrected to a value calculated using an approximate straight line of the corresponding region. Specifically, first, the solid line in FIG. 2A is divided into a plurality of regions (here, four regions A to D) and curves in the respective regions are made to approximate straight lines (here, four straight lines a to d). The value of the data Din input to the correction circuit 22 is assigned to an approximate straight line of a region of the data Din, and the data Dout is output. In the following description, such correction is referred to as polygonal line approximation.

Note that there is no particular limitation on the number of divided regions. The larger the number of divided regions is, the higher the accuracy of correction can be; the smaller the number of divided regions is, the easier the correction can be.

Polygonal line approximation is a method in which the value of the data Dout is calculated using an approximate straight line, so that the accuracy of the correction is lower than that in table approximation in which the value of the data Dout corresponding to the data Din is directly output. However, in polygonal line approximation, the amount of data needed for correction is less than that in table approximation; thus, the power needed for reading and writing data can be reduced and the power consumption of the correction circuit 22 can be suppressed.

In one embodiment of the present invention, the correction circuit 22 includes a programmable logic device (PLD) which is a circuit capable of changing the circuit configuration. As the PLD, an SPLD, a CPLD, a GAL, an FPGA, or the like can be freely used. By reconfiguring the PLD, a plurality of kinds of gamma correction can be executed in the correction circuit 22. Accordingly, for example, table approximation and polygonal line approximation can be selectively used; thus, an improvement in quality of an image and a reduction in power consumption can both be achieved.

In the case where a plurality of gamma correction circuits of different kinds are independently provided in the correction circuit 22, the area of the correction circuit 22 is increased. However, in one embodiment of the present invention, a plurality of kinds of gamma correction circuits can be achieved by reconfiguration of the PLD, so that an increase in the area of the correction circuit 22 can be suppressed.

Figure 3A:
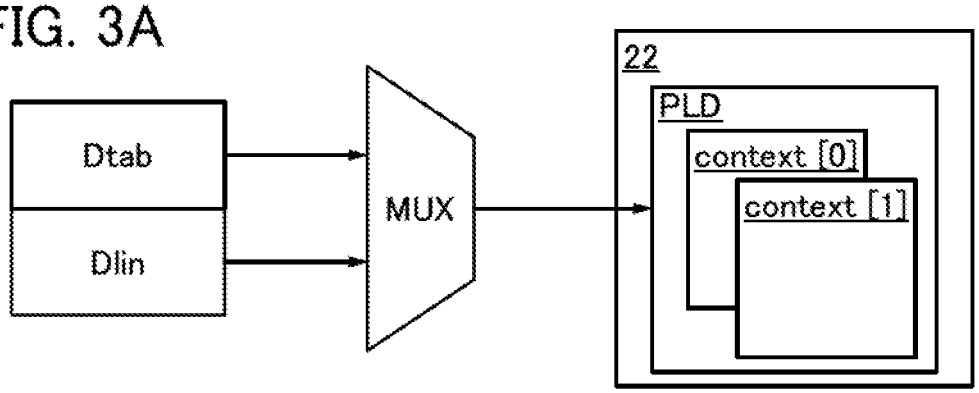
FIGS. 3A to 3C each illustrate a configuration example of a correction circuit.
Figure 3B:
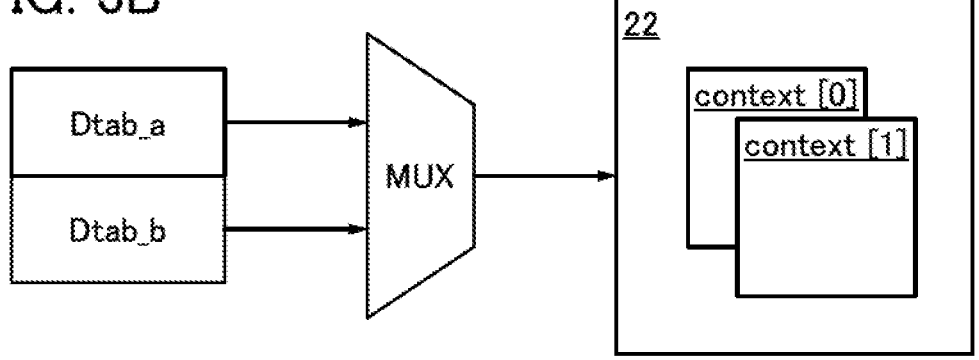
Figure 3C:
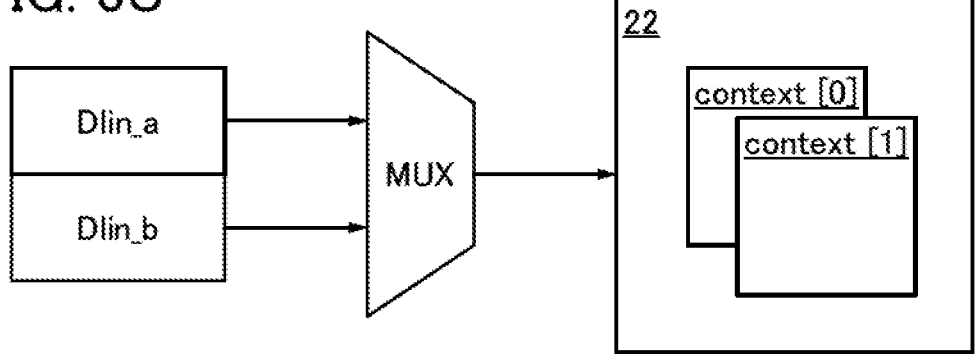

In the case where two or more kinds of gamma correction are executed in the correction circuit 22, the PLD in the correction circuit 22 is preferably a multi-context PLD. Specifically, it is preferable to employ a method in which a plurality of sets of configuration data corresponding to predetermined configurations of the gamma correction circuit are prepared and the configuration of the gamma correction circuit is quickly switched by selecting a set of configuration data stored in the PLD. FIGS. 3A to 3C each illustrate a configuration example of the multi-context PLD.

FIG. 3A shows the correction circuit 22 provided with a PLD having a plurality of contexts. Here, a configuration example in which the PLD has two contexts (contexts [0] and [1]) is illustrated. To the PLD, configuration data (Dtab) for configuring a gamma correction circuit which executes table approximation or configuration data (Dlin) for configuring a gamma correction circuit which executes polygonal line approximation is selectively input. A multiplexer MUX selects the data Dtab or the data Dlin to be input.

When the context [0] is selected and the data Dtab is input to the PLD, the PLD functions as a gamma correction circuit which executes table approximation using the context [0]. In contrast, when the context [1] is selected and the data Dlin is input to the PLD, the PLD functions as a gamma correction circuit which executes polygonal line approximation using the context [1]. In this manner, the gamma correction executed by the PLD can be switched.

Note that a plurality of kinds of gamma correction executed by the PLD have different contents which are not limited to table approximation and polygonal line approximation. For example, as shown in FIG. 3B, configuration data (Dtab_a or Dtab_b) corresponding to one of two kinds of table approximation having different characteristics may be input to the PLD. In addition, as shown in FIG. 3C, configuration data (Dlin_a or Dlin_b) corresponding to one of two kinds of polygonal line approximation having different numbers of divided regions may be input to the PLD. Furthermore, the number of contexts in the PLD can be three or more, and three or more kinds of gamma correction circuits can be configured by the PLD.

As illustrated in FIG. 1, data Dcon corresponding to configuration data of the PLD, a signal Scon corresponding to a signal for selecting a context of the PLD, and data Dmem corresponding to data to be stored in the memory circuit included in the correction circuit 22 are input from the processor 11 to the correction circuit 22. Data contained in the look-up table used in table approximation corresponds to the data Dmem.

As described above, by providing the PLD in the correction circuit 22, gamma correction having a content corresponding to configuration data input to the PLD can be executed. Accordingly, a plurality of kinds of gamma correction can be selectively used, so that an improvement in quality of an image and a reduction in power consumption can both be achieved. Furthermore, the area of the correction circuit 22 can be reduced.

<Configuration Example of Correction Circuit>

Figure 4:
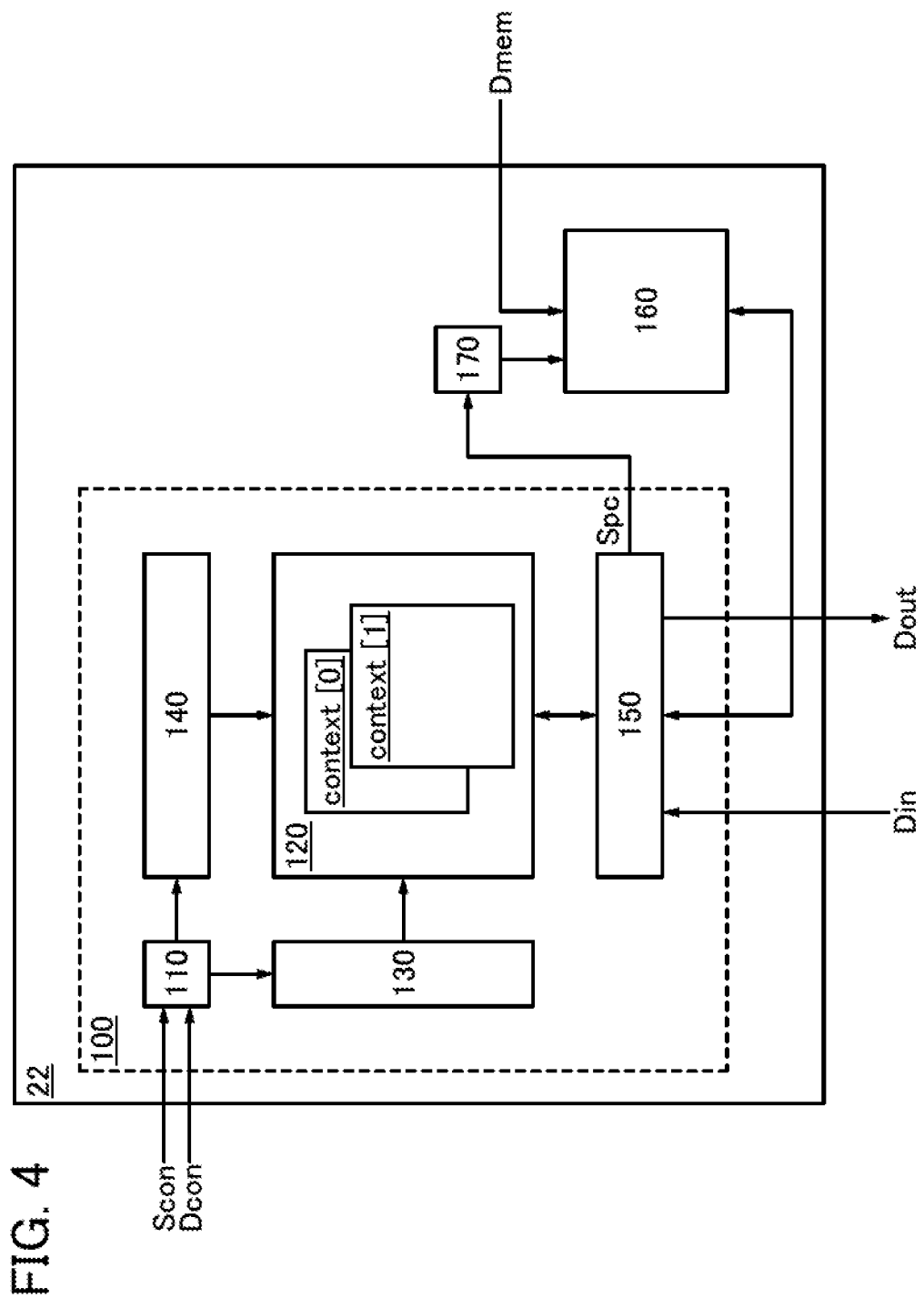
FIG. 4 illustrates a configuration example of a correction circuit.

Next, a specific configuration example of the correction circuit 22 is described. FIG. 4 illustrates a configuration example of the correction circuit 22.

The correction circuit 22 includes a PLD 100, a memory device 160, and a switch circuit 170. The PLD 100 has a function of executing gamma correction of the data Din and outputting the corrected data Din as the data Dout.

The memory device 160 has a function of storing data used for gamma correction. The data Dmem stored in the memory device 160 is input from the processor 11. A look-up table and the like for table approximation are input to the memory device 160 as the data Dmem.

The switch circuit 170 has a function of controlling the supply of power to the memory device 160. In accordance with a control signal (a signal Spc) input from the PLD 100, it is determined whether to supply power to the memory device 160. In a period during which the memory device 160 is not used, the switch circuit 170 is turned off by the signal Spc, so that the supply of power to the memory device 160 can be stopped. Thus, the power consumption of the correction circuit 22 can be reduced.

With the use of an OS transistor for the memory device 160, data can be retained even in a period during which power supply to the memory device 160 is stopped. The details of a configuration example of the memory device including an OS transistor will be described in Embodiment 2.

The PLD 100 includes a control circuit 110, an array 120, a driver circuit 130, a driver circuit 140, and an input/output circuit 150. The control circuit 110 has a function of controlling the configuration of the array 120. Specifically, the control circuit 110 has a function of, in accordance with the data Dcon and the signal Scon input from the processor 11, determining whether to reconfigure the PLD 100, selecting a context used for correction, and transmitting configuration data to the driver circuit 140.

The array 120 includes a plurality of programmable logic elements (LEs) and programmable switches (RSs) provided between the LEs. By changing data stored in memory elements in the LEs, the functions of the LEs can be changed. Furthermore, by changing data stored in memory elements in the RSs, the connection between the LEs can be changed.

In this specification and the like, data that controls the function of the LE or data that controls the connection between the LEs is referred to as configuration data, and a memory element that stores configuration data is referred to as a configuration memory. Moreover, updating configuration data stored in the configuration memory is referred to as reconfiguration.

With the use of an OS transistor for the configuration memory, data can be retained even in a period during which power supply to the PLD is stopped. Thus, power gating of the PLD can be performed. The details of a configuration example of the configuration memory including an OS transistor will be described in Embodiment 2.

The driver circuit 130 has a function of generating a signal for selecting the LE or the RS. The driver circuit 140 has a function of outputting, to the array 120, configuration data or a signal for selecting a context input from the control circuit 110. The signal for selecting a context is input to the array 120, and a context contained in the array 120 can be selected. In addition, configuration data is input to the LE or the RS selected by the driver circuit 130, and the PLD 100 is reconfigured.

The input/output circuit 150 has a function of transmitting data between the correction circuit 22 and the processor 21 and transmitting data between the array 120 and the memory device 160. The input/output circuit 150 has a function of outputting the signal Spc to the switch circuit 170 and thus controlling the power supply to the memory device 160.

A plurality of contexts (contexts [0] and [1]) are included in the array 120, and the contexts are capable of configuring different kinds of gamma correction circuits from each other, so that the correction circuit 22 can have a function of executing various kinds of gamma correction.

<Operation Example of PLD>

Figure 5A:
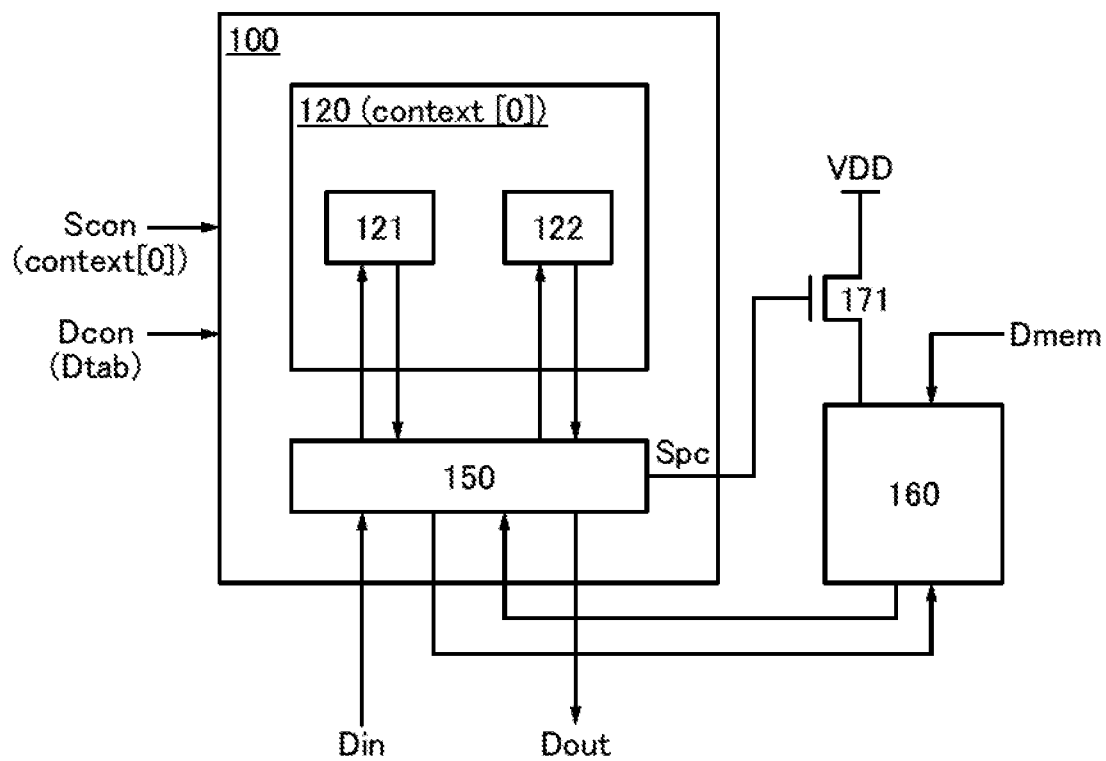
FIGS. 5A and 5B each illustrate an operation example of a PLD.
Figure 5B:
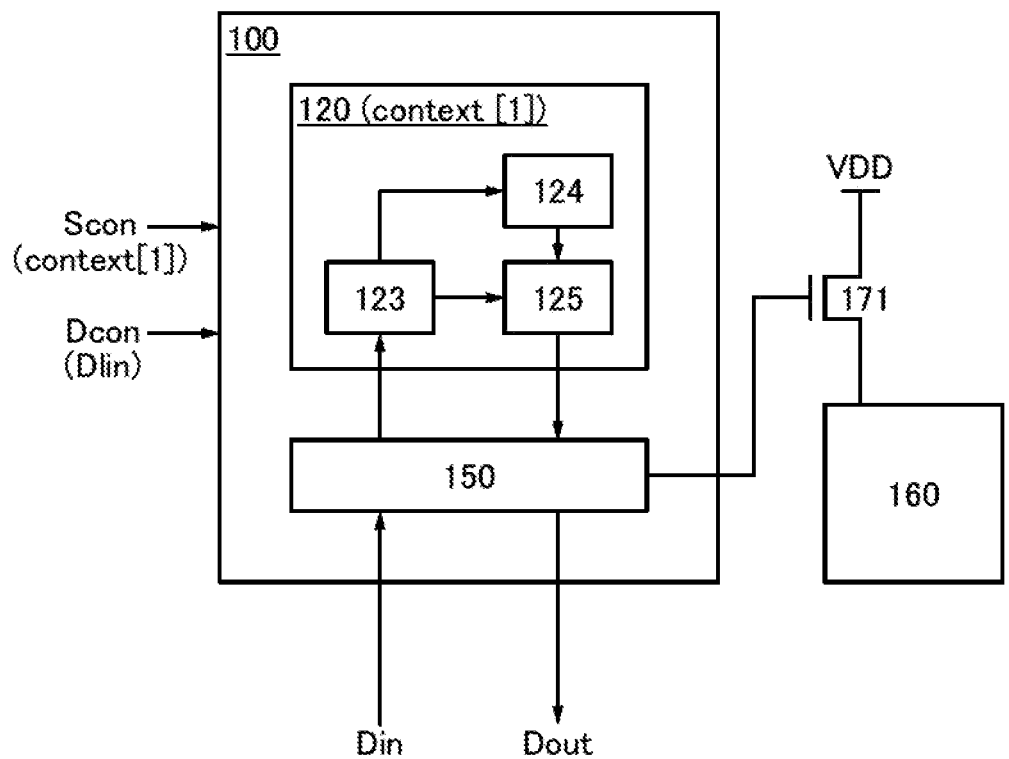

Next, operation examples in the case of executing various kinds of gamma correction using the PLD 100 will be described with reference to FIGS. 5A and 5B. FIGS. 5A and 5B each illustrate an example in which a transistor 171 is used as the switch circuit 170. Here, operation examples of table approximation and polygonal line approximation executed using two contexts (contexts [0] and [1]) will be described.

[Table Approximation]

FIG. 5A shows an operation example of the PLD 100 in which table approximation is executed using the context [0]. The signal Scon for selecting the context [0] is input to the PLD 100. As the data Dcon, the reconfiguration data (Dtab) for reconfiguring the context [0] to a circuit which executes table approximation is input.

A look-up table for executing table approximation is input to and stored in the memory device 160 as the data Dmem. The signal Spc for turning on the transistor 171 is input to a gate of the transistor 171. In this manner, a power supply potential VDD is supplied to the memory device 160.

By the signal Scon, the context [0] is selected, and the data Dtab is input to the PLD 100, so that the PLD 100 is reconfigured and blocks 121 and 122 are formed in the array 120. Then, the data Din is input from the processor 21 to the block 121 through the input/output circuit 150. The block 121 outputs an access signal corresponding to the data Din to the memory device 160 through the input/output circuit 150. The memory device 160 to which the access signal is input determines the data Dout which corresponds to the data Din in accordance with the look-up table and outputs it to the block 122. The data Dout is output to the processor 21 from the block 122 through the input/output circuit 150. In this manner, data which has been subjected to table approximation can be output to the processor 21.

[Polygonal Line Approximation]

FIG. 5B shows an operation example of the PLD 100 in which polygonal line approximation is executed using the context [1]. The signal Scon for selecting the context [1] is input to the PLD 100. As the data Dcon, the reconfiguration data (Dlin) for reconfiguring the context [1] to a circuit which executes polygonal line approximation is input.

By the signal Scon, the context [1] is selected, and the data Dlin is input to the PLD 100, so that the PLD 100 is reconfigured and blocks 123 to 125 are formed in the array 120. Then, the data Din is input from the processor 21 to the block 123 through the input/output circuit 150. To the block 124, the block 123 outputs a signal corresponding to a region of polygonal line approximation to which the data Din belongs. In addition, the block 123 outputs the data Din to the block 125.

To the block 125, the block 124 outputs data corresponding to an approximate straight line of a region to which the data Din belongs in accordance with the signal input from the block 123. Specifically, an approximate straight line in the case of polygonal line approximation is represented by y=ax+b. Sets of parameters (a set of values a and b) are stored in the block 124; the number of sets equals to the number of divided regions in polygonal line approximation. When receiving the signal from the block 123, the block 124 outputs, to the block 125, the values a and b of an approximate curve in the region to which the data Din belongs.

In the block 125, the value of data after correction is calculated from the data Din input from the block 123 and the values a and b input from the block 124. Then, the value corresponding to the calculation results is output as the data Dout to the processor 21 through the input/output circuit 150. In this manner, data which has been subjected to polygonal line approximation can be output to the processor 21.

In the case of polygonal line approximation, large-capacity data such as a look-up table is not needed, and gamma correction can be executed using the values a and b which are parameters of an approximate straight line stored in the block 124, so that writing and reading of data in the memory device 160 are not performed. Therefore, in a period for polygonal line approximation, the signal Spc for turning off the transistor 171 is input to the gate of the transistor 171, so that the power supply to the memory device 160 can be stopped. Thus, the power consumption of the correction circuit 22 can be reduced.

Through the above operation, the context of the PLD 100 is switched, and two kinds of gamma correction can be executed.

Note that the transistor 171 is preferably an OS transistor. A metal oxide has a larger energy gap and a lower minority carrier density than a semiconductor such as silicon; therefore, the off-state current of a transistor including a metal oxide is extremely low. Accordingly, when an OS transistor is used as the transistor 171, leakage of power can be suppressed as compared with the case where a transistor in which the channel formation region includes silicon (such a transistor is hereinafter also referred to as a Si transistor) or the like is used. Thus, the power consumption of the correction circuit 22 can be more effectively reduced.

[Dynamic Reconfiguration]

Figure 6A:
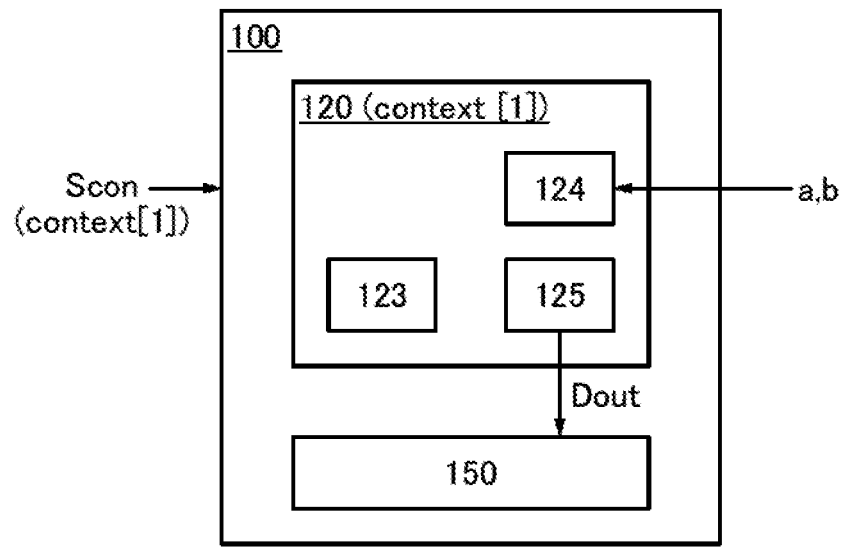
FIGS. 6A and 6B each illustrate an operation example of a PLD.

Regions in the array 120 shown in FIGS. 5A and 5B can also be reconfigured independently. For example, the blocks 123 to 125 shown in FIG. 5B are arranged in different regions and can be independently reconfigured. In that case, as shown in FIG. 6A, new values a and b are input to the block 124 to update an approximate straight line in a period during which the block 125 calculates and outputs the data Dout. Thus, dynamic reconfiguration of the PLD 100 can be performed.

Figure 6B:
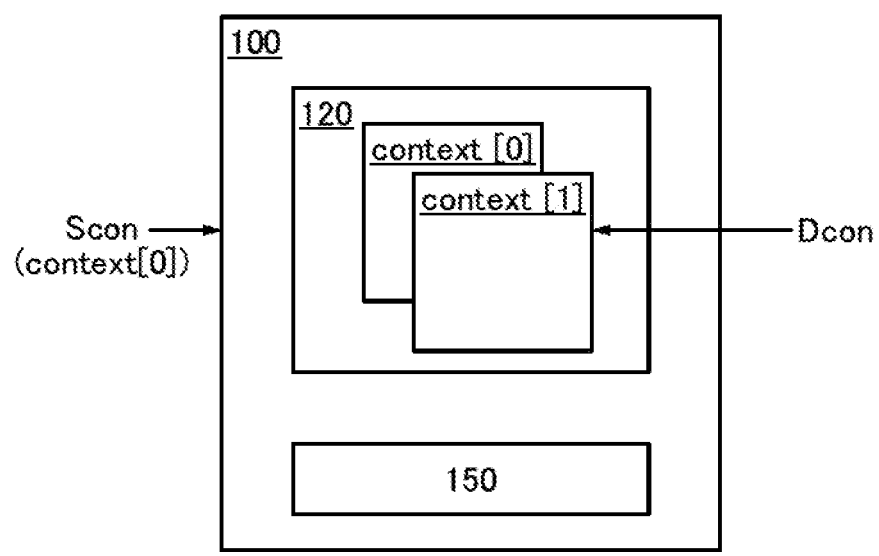

In addition, in a period during which gamma correction is executed using one context, another context can be reconfigured. For example, as shown in FIG. 6B, in a period during which the context [0] is selected and table approximation is executed, configuration data stored in the LEs and the RSs forming the context [1] is updated to change the content of gamma correction.

As described above, a plurality of kinds of gamma correction can be executed by the multi-context PLD 100.

<Modification Example of Display System>

Next, a modification example of the display system will be described. Here, a configuration in which the display portion includes a plurality of pixel groups 50 will be described.

Figure 7:
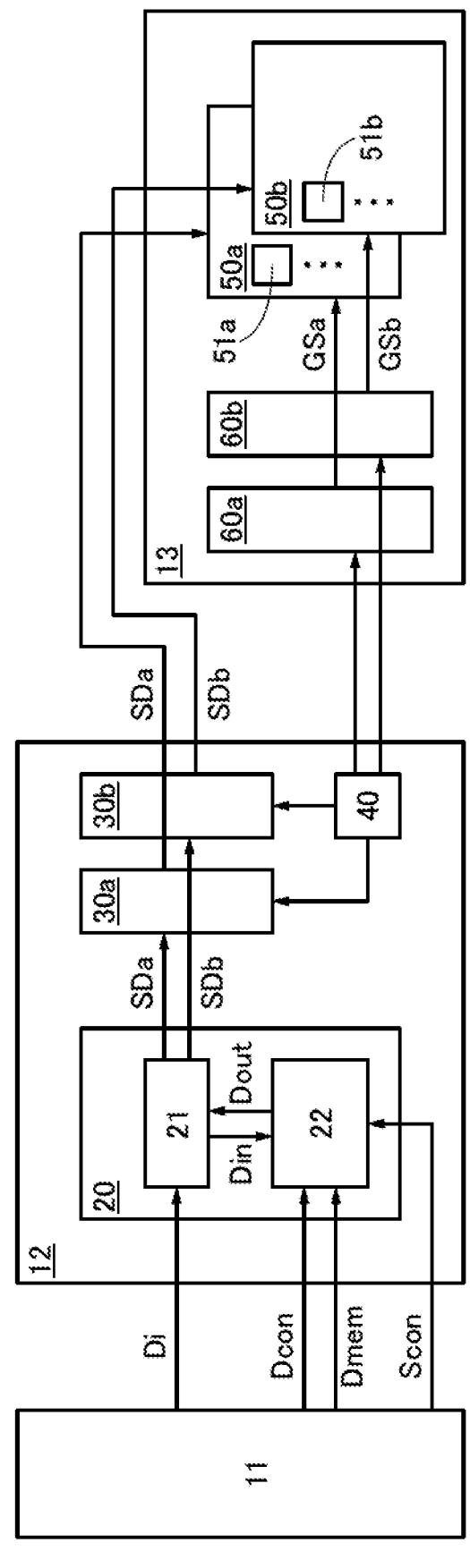
FIG. 7 illustrates a configuration example of a display system.

The display system 10 illustrated in FIG. 7 is different from the display system 10 illustrated in FIG. 1 in that a plurality of driver circuits 30, a plurality of pixel groups 50, and a plurality of driver circuits 60 are provided. A configuration is described here as an example in which the semiconductor device 12 includes two driver circuits 30 (30a and 30b) and the display portion 13 includes two pixel groups 50 (50a and 50b) and two driver circuits 60 (60a and 60b). Note that the number of these circuits can also be three or more.

The image processing portion 20 generates the signal SD (SDa) output to the driver circuit 30a and the signal SD (SDb) output to the driver circuit 30b. The signal SDa is supplied to the pixel group 50a, and the signal SDb is supplied to the pixel group 50b. Timing signals are supplied to the driver circuits 30a and 30b from the timing controller 40.

The pixel group 50a includes a plurality of pixels 51a, and the pixel group 50b includes a plurality of pixels 51b. The driver circuit 60a has a function of supplying a selection signal (signal GSa) to the pixel group 50a, and the driver circuit 60b has a function of supplying a selection signal (signal GSb) to the pixel group 50b. Timing signals are supplied to the driver circuits 60a and 60b from the timing controller 40.

With the plurality of driver circuits 30, the plurality of pixel groups 50, and the plurality of driver circuits 60, an image can be displayed using the plurality of pixel groups 50.

The pixels 51a and 51b each include a display element. The same kind of display elements or different kinds of display elements may be included in the pixels 51a and 51b. In addition, the pixels 51a and 51b may each include a plurality of subpixels.

An image may be displayed using either the pixel group 50a or the pixel group 50b, or both. In the case where both the pixel group 50a and the pixel group 50b are used, the pixel group 50a and the pixel group 50b may display one image, or the pixel group 50a and the pixel group 50b may display different images from each other.

In the case where either the pixel group 50a or the pixel group 50b is used for displaying an image, the pixel group 50 which displays an image can be selected automatically or manually. By using different display elements in the pixels 51a and 51b, the characteristics, the quality, and the like of images displayed in the pixel group 50a and the pixel group 50b can be made different from each other. In that case, the pixel group 50 which performs display can be selected in accordance with the surroundings, the content of a displayed image, and the like.

For example, a reflective liquid crystal element can be provided in the pixel 51a, and a light-emitting element can be provided in the pixel 51b. In that case, in an environment with intense external light such as outdoors in fine weather during the daytime, the light-emitting element is made not to emit light, and only the reflective liquid crystal element capable of display using external light is used to perform display, whereby the power consumption can be reduced. On the other hand, in an environment with weak external light, e.g., at night or in a dark place, the light-emitting element is made to emit light to perform display, whereby an image with high visibility can be displayed.

In addition, the color tone can be corrected by using light emission from the light-emitting element at the time of display of an image by the reflective liquid crystal element. For example, in the case where the display portion 13 displays an image in a reddish environment at evening, a blue (B) component is not sufficient only with the display by the reflective liquid crystal element in some cases; thus, the color tone can be corrected by making the light-emitting element emit light.

Since the reflective liquid crystal element does not need a light source other than external light at the time of display, an image can be displayed with low power consumption. On the other hand, the light-emitting element operates at higher speed than the liquid crystal element and thus can switch displayed images quickly. Here, for example, a still image that is a background, characters, and the like are displayed by the reflective liquid crystal element, whereas a moving image and the like are displayed by the light-emitting element. Accordingly, the display system can reduce the power consumption and can display high-quality images. Such a structure is suitable for the case where the display system is used as a teaching material such as a textbook, a notebook, or the like.

Furthermore, at the time of displaying an image using the reflective liquid crystal element, the frequency of rewriting displayed images is reduced, and the operation of the driver circuit 30a or the driver circuit 60a can be stopped in a period during which images are not rewritten. Thus, the power consumption can be further reduced.

When the above structure is used, the image processing portion 20 generates a video signal (signal SDa) for the reflective liquid crystal element and a video signal (signal SDb) for the light-emitting element. The image processing portion 20 can selectively generate, in accordance with the brightness of external light, a video signal for performing display using only the pixel group 50a, a video signal for performing display using only the pixel group 50b, and a video signal for performing display using a combination of the pixel groups 50a and 50b.

When a video signal is generated, it is preferable to execute gamma correction in the correction circuit 22 in accordance with the characteristics of the pixel. Specifically, it is preferable that the signal SDa be generated by executing gamma correction suitable for the characteristics of the pixel 51a including the reflective liquid crystal element and the signal SDb be generated by executing gamma correction suitable for the characteristics of the pixel 51b including the light-emitting element. Therefore, the correction circuit 22 preferably has a function of executing two different kinds of gamma correction.

Figure 8A:
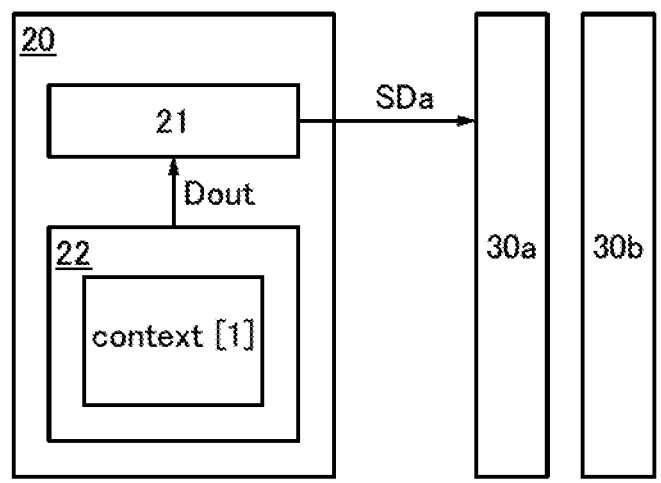
FIGS. 8A and 8B illustrate an operation example of an image processing portion.
Figure 8B:
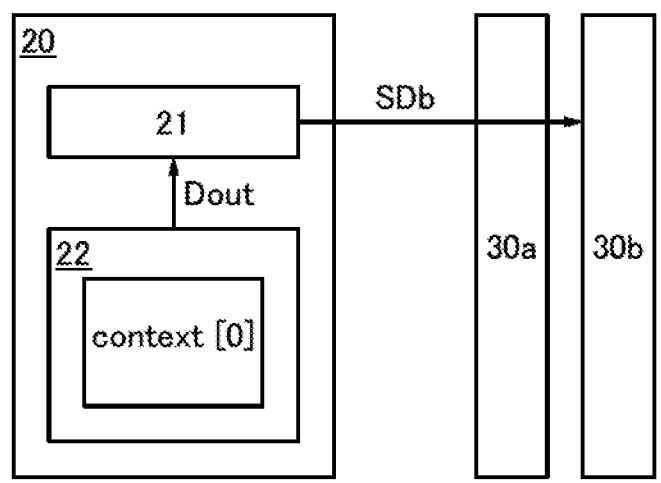

The image processing portion 20 has a function of executing a plurality of kinds of gamma correction using the PLD. FIGS. 8A and 8B each show an operation example of the image processing portion 20. For example, gamma correction is executed using the context [1] as shown in FIG. 8A when the signal SDa is generated, and gamma correction is executed using the context [0] as shown in FIG. 8B when the signal SDb is generated. Accordingly, gamma correction suitable for the pixel groups 50a and 50b can be executed.

In the case where a still image, characters, and the like are displayed using the pixel group 50a including the reflective liquid crystal element and a moving image and the like are displayed using the pixel group 50b including the light-emitting element, polygonal line approximation with low power consumption is preferably used for generating the signal SDa and table approximation with high accuracy is preferably used for generating the signal SDb. In this manner, a reduction in power consumption of the reflective liquid crystal element and an improvement in display quality of the light-emitting element can be promoted.

Here, as an example, the case is described where the pixel 51a includes the reflective liquid crystal element and the pixel 51b includes the light-emitting element; however, there is no particular limitation on the display elements provided in the pixels 51a and 51b, and the kind of display element can be freely selected. For example, a transmissive liquid crystal element may be provided in one of the pixels 51a and 51b, and a reflective liquid crystal element may be provided in the other. In that case, a transflective liquid crystal element can be achieved using the pixels 51a and 51b. Alternatively, different kinds of light-emitting elements can be provided in the pixels 51a and 51b.

As described above, the display system of one embodiment of the present invention can execute correction of a video signal using the PLD. Accordingly, a plurality of kinds of correction can be executed, and an appropriate correction can be selectively executed in accordance with the content of an image displayed on the display portion 13 and the surroundings. In addition, it is not necessary to independently provide a plurality of correction circuits, suppressing an increase in the area of the correction circuit. Furthermore, in the case where the display portion includes a plurality of different kinds of display elements, the display system of one embodiment of the present invention can execute appropriate correction on the respective display elements.

The display system of one embodiment of the present invention can have low power consumption when it includes an OS transistor in the semiconductor device.

This embodiment can be combined with any of the other embodiments as appropriate.

Embodiment 2

In this embodiment, configuration examples of a PLD and a memory device that can be used in the semiconductor device described in the above embodiment will be described.

<Configuration Example of PLD>

Figure 9:
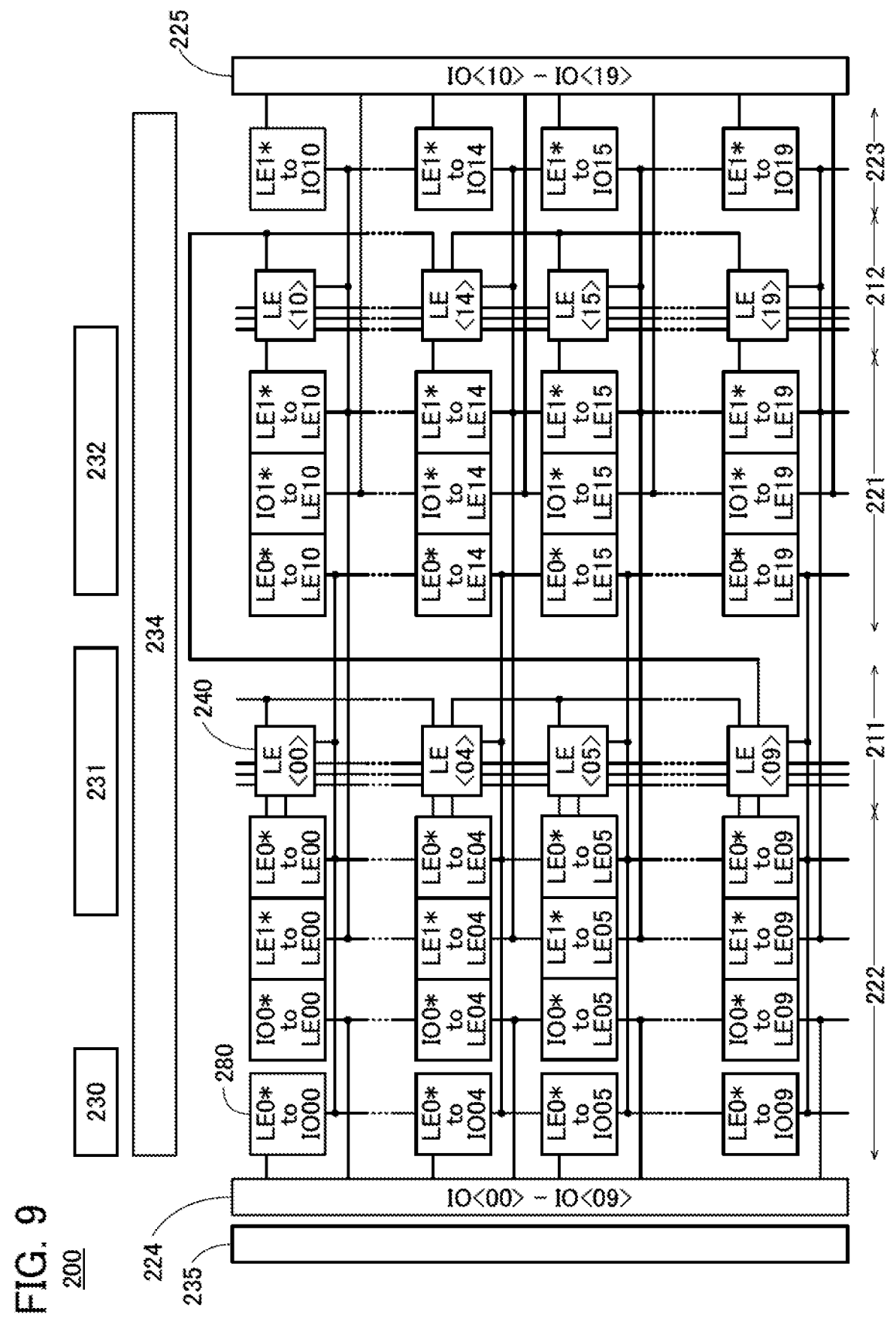

FIG. 9 illustrates the configuration of a PLD 200. The PLD 200 can be used as the PLD 100 of the above embodiment. A multi-context PLD can be used as the PLD 200.

The PLD 200 includes a logic unit, an input/output unit, and a peripheral circuit unit. The logic unit includes logic arrays (LAs) 211 and 212 and switch arrays (SWAs) 221 to 223. The input/output unit includes input/output arrays (IOAs) 224 and 225. The peripheral circuit unit includes circuits having a function of driving the logic unit and the input/output unit. For example, the peripheral circuit unit includes a clock signal generator 230, a configuration controller 231, a context controller 232, a column driver circuit 234, and a row driver circuit 235.

The configuration controller 231 and the context controller 232 correspond to the control circuit 110 illustrated in FIG. 4, and the column driver circuit 234 and the row driver circuit 235 correspond to the driver circuit 140 and the driver circuit 130 illustrated in FIG. 4, respectively.

The LAs 211 and 212 each include a plurality of LEs 240. In the configuration example of FIG. 9, the LA 211 includes 10 LEs 240 (LE <00> to LE <09>), and the LA 212 includes 10 LEs 240 (LE <10> to LE <19>); however, the number of LEs 240 can be determined freely. The IOAs 224 and 225 have a function of controlling input and output of signals between external terminals of the PLD 200 and the LAs 211 and 212.

The IOAs 224 and 225 each include a plurality of input/output circuits (IOs). In the configuration example of FIG. 9, the IOA 224 includes 10 input/output circuits (IO <00> to IO <09>), and the IOA 225 includes 10 input/output circuits (IOs <10> to <19>). The IO <00> to IO <19> are connected to different external terminals from each other.

The SWAs 221 to 223 each include a plurality of RSs 280. The expressions in the RSs 280 in the drawing represent the functions of the RSs 280. For example, an RS 280 expressed as "LE0* to IO00" has a function of a switch between the output nodes of the LE <00> to LE <09> and the input node of the IO<00>, and determines the connection between the LE <00> to LE <09> and the IO<00> in accordance with configuration data and data for selecting a context (hereinafter also referred to as context data).

The clock signal generator 230 has a function of generating one or more clock signals used in the PLD 200. The column driver circuit 234 has a function of generating configuration data. The row driver circuit 235 has a function of generating a signal for selecting a configuration memory. The configuration controller 231 has a function of controlling the column driver circuit 234 and the row driver circuit 235. The context controller 232 has a function of generating context data.

[Configuration Example of LE]

Figure 10:
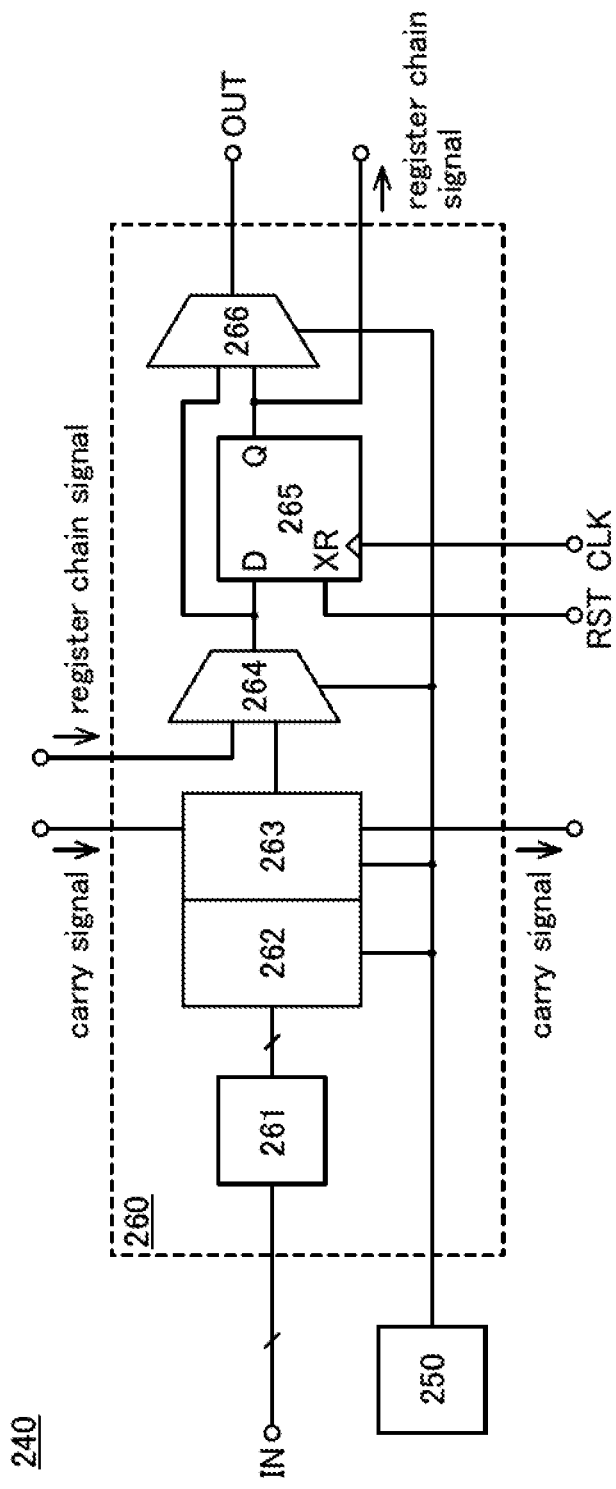
FIG. 10 illustrates a configuration example of an LE.

FIG. 10 illustrates a configuration example of the LE 240. The LE 240 is a programmable logic circuit and includes a configuration memory unit 250 and a logic cell (LCELL) 260.

The configuration memory unit 250 has a function of storing configuration data. The function of the LE 240 is determined in accordance with configuration data stored in the configuration memory unit 250.

The LE 240 has a function of generating data by subjecting input data IN to a predetermined logical operation and outputting the data as output data OUT. The LE 240 includes an exclusive OR (XOR) circuit group 261, an LUT 262, a carry logic 263, a selector (SEL) 264, a flip-flop (FF) 265, and a selector (SEL) 266. The FF 265 has a function of a register. The FF 265 includes a terminal D to which data is input, a terminal XR to which a reset signal RST is input, a terminal to which a clock signal CLK is input, and a terminal Q from which data is output. The logic function of the LCELL 260 is controlled by the configuration data output from the configuration memory unit 250.

The data IN is input from an RS 280. Furthermore, the data OUT is output to another RS 280. In the case where a carry chain is formed with a plurality of LEs 240, input and output of carry signals are performed between the plurality of LEs 240. In the case where a register chain is formed with a plurality of LEs 240, input and output of register chain signals are performed between the adjacent LEs 240.

[Configuration Example of Configuration Memory]

The LEs 240 and the RSs 280 in the PLD 200 each include a configuration memory. Configuration examples of a configuration memory that can be used in the LEs 240 and the RSs 280 are described below.

A configuration memory includes a memory circuit having a function of storing configuration data. The memory circuit included in the configuration memory may be volatile or nonvolatile. Examples of the volatile memory circuit include an SRAM. Examples of the nonvolatile memory circuit include a flash memory, a ferroelectric random access memory (FeRAM), a magnetoresistive random access memory (MRAM), a phase change random access memory (PRAM), and a resistive random access memory (ReRAM).

It is particularly preferable to use an OS transistor in the memory circuit. When an OS transistor is included in the configuration memory, the configuration memory can retain configuration data for a significantly long time.

Figure 11A:
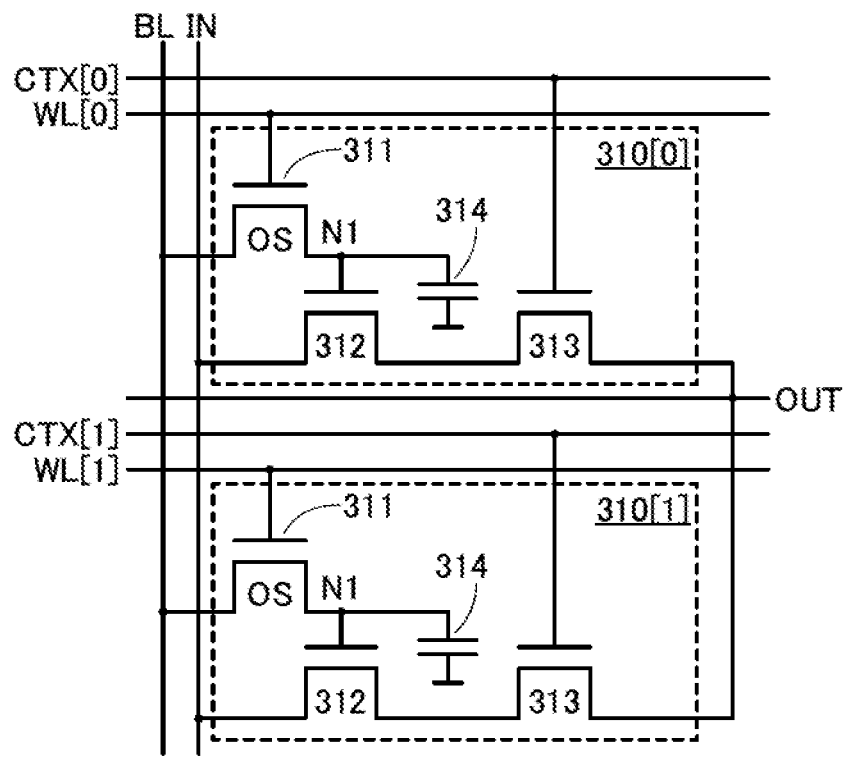
FIGS. 11A and 11B each illustrate a configuration example of a memory circuit.

FIG. 11A illustrates a configuration example of a memory circuit that can be used as the configuration memory. A memory circuit 300 includes a plurality of circuits 310. Although two circuits 310 (circuits 310[0] and 310[1]) are illustrated in the example illustrated in FIG. 11A, the number of circuits 310 is not limited to two. Predetermined configuration data is stored in the circuit 310; thus, the connection between a wiring IN and a wiring OUT can be controlled. Therefore, the memory circuit 300 can be used as the RS 280.

The circuit 310 includes transistors 311, 312, and 313 and a capacitor 314. Although the transistors 311, 312, and 313 are n-channel transistors here, they may be p-channel transistors. A transistor marked with "OS" is an OS transistor.

A gate of the transistor 311 is connected to a wiring WL, one of a source and a drain of the transistor 311 is connected to a gate of the transistor 312 and one electrode of the capacitor 314, and the other of the source and the drain is connected to a wiring BL. One of a source and a drain of the transistor 312 is connected to the wiring IN, and the other of the source and the drain is connected to one of a source and a drain of the transistor 313. A gate of the transistor 313 is connected to a wiring CTX, and the other of the source and the drain of the transistor 313 is connected to the wiring OUT. The other electrode of the capacitor 314 is connected to a wiring to which a predetermined potential is supplied. Here, a node which is connected to the one of the source and the drain of the transistor 311, the gate of the transistor 312, and the one electrode of the capacitor 314 is referred to as a node N1.

Next, an operation of the circuit 310 is described. First, the potential of the wiring WL is set to turn on the transistor 311. The potential of the wiring BL is supplied to the node N1 (writing of configuration data). Note that the wiring WL is connected to the row driver circuit 235 (see FIG. 9). The potential of the wiring WL can be controlled by the row driver circuit 235.

Then, the potential of the wiring WL is set to turn off the transistor 311. Thus, the node N1 is brought into a floating state, and the potential at the node N1 is retained (retention of configuration data). Here, the conduction state of the transistor 312 provided between the wiring IN and the wiring OUT is determined by the potential of the node N1. Accordingly, the conduction state between the wiring IN and the wiring OUT can be controlled by the control of the potential of the node N1. Since the memory circuit 300 including such a circuit 310 functions as a switch for controlling the conduction state between wirings, the memory circuit 300 can be used as a configuration memory of the RS 280. In the case where the memory circuit 300 is used as a configuration memory of the RS 280, the wiring IN and the wiring OUT are connected to the IO and the LE 240, respectively.

Note that the memory circuit 300 includes the circuit 310[0] and the circuit 310[1] which share the wiring OUT. By the supply of predetermined potentials to the wirings CTX[0] and CTX[1], one of the circuit 310[0] and the circuit 310[1] can be selected. Thus, the memory circuit 300 can be used as a multi-context configuration memory.

Specifically, in the case where the context [0] is selected, the wiring CTX[0] is set to turn on the transistor 313 of the circuit 310[0]. In addition, the wiring CTX[1] is set to turn off the transistor 313 of the circuit 310[1]. In this way, the conduction state between the wiring IN and the wiring OUT is controlled by the potential of the node N1 in the circuit 310[0]. In the case where the context [1] is selected, the wiring CTX[0] is set to turn off the transistor 313 of the circuit 310[0], and the wiring CTX[1] is set to turn on the transistor 313 of the circuit 310[1]. In this way, the conduction state between the wiring IN and the wiring OUT is controlled by the potential of the node N1 in the circuit 310[1]. Thus, the context for controlling the conduction state between the wiring IN and the wiring OUT can be selected by controlling the potentials of the wirings CTX[0] and CTX[1].

Here, the transistor 311 is an OS transistor and has an extremely low off-state current. Therefore, the potential of the node N1 can be kept for a long time in a period during which the transistor 311 is in an off state. Consequently, the frequency of updates of configuration data can be drastically reduced, whereby the power consumption of the PLD 200 can be reduced. Moreover, even in a period during which the power supply to the circuit 310 is stopped, configuration data can be retained for a long time.

Moreover, by using an OS transistor, the circuit 310 can be formed of fewer transistors (three transistors in the circuit 310). Consequently, the area of the PLD 200 can be reduced. Furthermore, an OS transistor can be stacked over another transistor. When the transistor 311 is stacked over the transistor 312 or the transistor 313, the area of the circuit 310 can be reduced; as a result, the area of the PLD 200 can be further reduced.

Moreover, in the case where the multi-context PLD 200 is used, configuration data corresponding to a plurality of contexts needs to be stored in a configuration memory, which might cause a significant increase in the area of the configuration memory. However, as described above, the usage of the memory circuit 300 including an OS transistor can suppress an increase in the area of the configuration memory. For these reasons, it is particularly preferable to use an OS transistor in the multi-context PLD 200.

Note that there is no particular limitation on materials of the transistors other than the OS transistor in FIG. 11A. For example, a transistor whose channel formation region is formed in part of a substrate including a single crystal semiconductor (the transistor is hereinafter also referred to as a single crystal transistor) may be used. As the substrate including a single crystal semiconductor, a single crystal silicon substrate, a single crystal germanium substrate, or the like can be given. Since the single crystal transistor can perform high-speed operation, the use of the single crystal transistor in the memory circuit allows the memory circuit to operate at higher speed. As each of the transistors other than the OS transistor, a transistor whose channel formation region is formed in a film including a material other than a metal oxide can also be used. Examples of the material other than a metal oxide include silicon, germanium, silicon germanium, silicon carbide, gallium arsenide, aluminum gallium arsenide, indium phosphide, gallium nitride, and an organic semiconductor. Each of the above semiconductors other than a metal oxide may be a single crystal semiconductor or a non-single-crystal semiconductor such as an amorphous semiconductor, a microcrystalline semiconductor, or a polycrystalline semiconductor. These transistors can be used as the transistors other than the OS transistor described below.

Figure 11B:
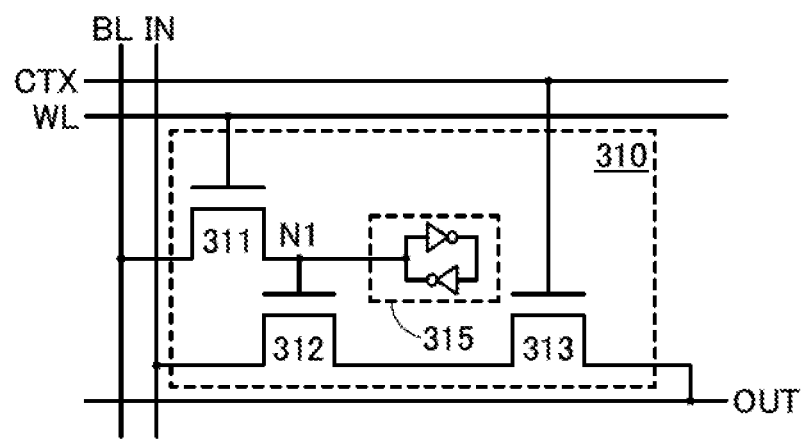

FIG. 11B illustrates another configuration example of the circuit 310. The circuit 310 illustrated in FIG. 11B has a configuration including a circuit 315 instead of the capacitor 314 of FIG. 11A. The circuit 315 forms an inverter loop. The potential of the node N1 can be kept to be a high-level potential or a low-level potential by the circuit 315. Note that the above-described transistors other than the OS transistor can be used as the transistor 311. In that case, the circuit 310 is volatile.

Figure 12:
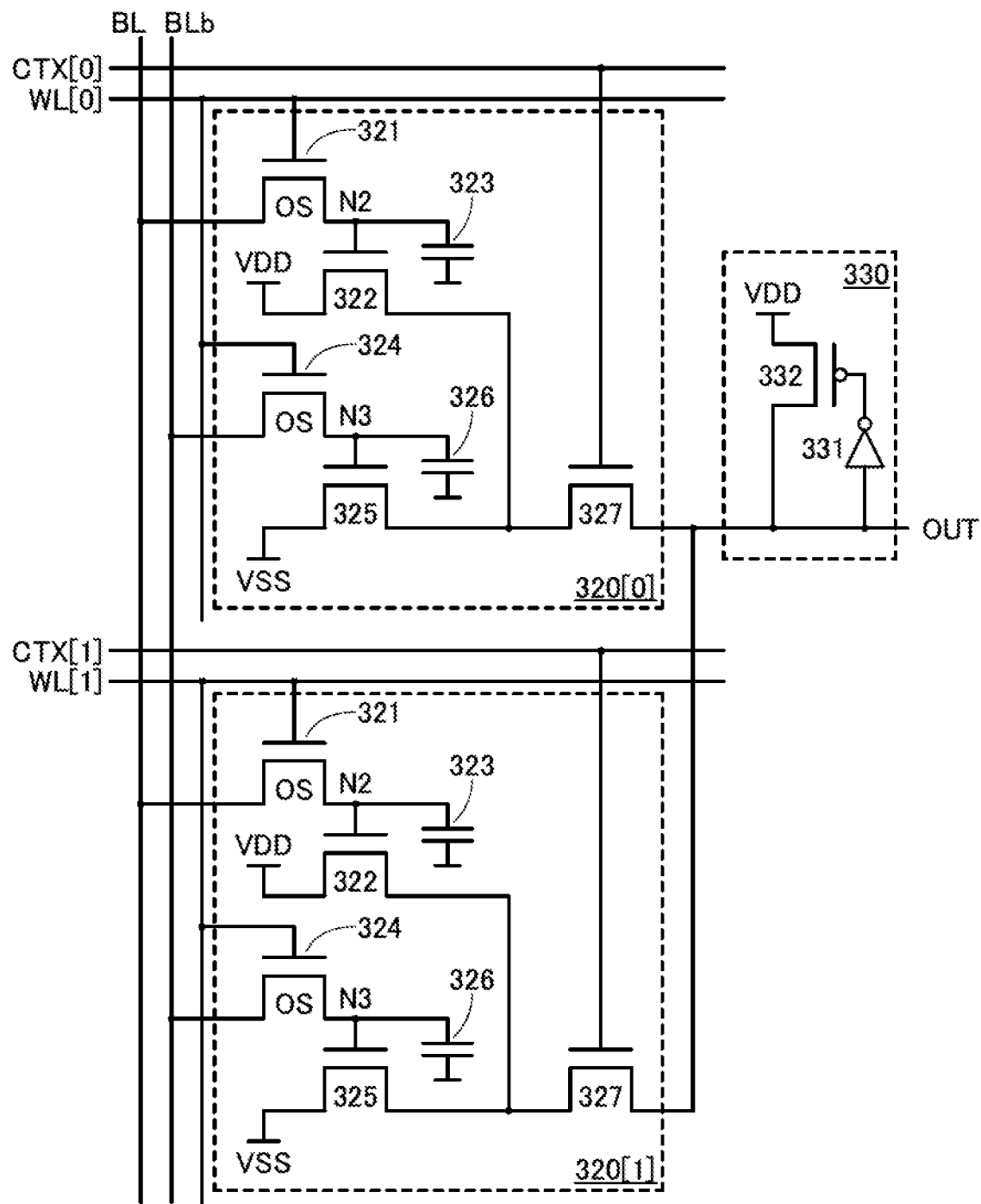
FIG. 12 illustrates a configuration example of a memory circuit.

FIG. 12 illustrates a configuration example of another memory circuit that can be used as the configuration memory. A memory circuit 301 includes a circuit 320. Although two circuits 320 (circuits 320[0] and 320[1]) are illustrated in the example illustrated in FIG. 12, the number of circuits 320 is not limited to two.

The circuit 320 includes transistors 321 and 322, a capacitor 323, transistors 324 and 325, a capacitor 326, and a transistor 327. Note that the transistors 321, 322, 324, 325, and 327 are n-channel transistors here; however, the transistors 321, 322, 324, 325, and 327 may be p-channel transistors.

A gate of the transistor 321 is connected to a wiring WL, one of a source and a drain of the transistor 321 is connected to a gate of the transistor 322 and one electrode of the capacitor 323, and the other of the source and the drain is connected to a wiring BL. One of a source and a drain of the transistor 322 is connected to a wiring to which a predetermined potential (here, a high power supply potential VDD) is supplied, and the other of the source and the drain is connected to one of a source and a drain of the transistor 327. The other electrode of the capacitor 323 is connected to a wiring to which a predetermined potential is supplied. A gate of the transistor 324 is connected to the wiring WL, one of a source and a drain of the transistor 324 is connected to a gate of the transistor 325 and one electrode of the capacitor 326, and the other of the source and the drain is connected to a wiring BLb. One of a source and a drain of the transistor 325 is connected to a wiring to which a predetermined potential (here, a low power supply potential VSS, e.g., a ground potential) is supplied, and the other of the source and the drain is connected to the one of the source and the drain of the transistor 327. The other electrode of the capacitor 326 is connected to a wiring to which a predetermined potential is supplied. A gate of the transistor 327 is connected to a wiring CTX, and the other of the source and the drain of the transistor 327 is connected to the wiring OUT.

Here, a node which is connected to the one of the source and the drain of the transistor 321, the gate of the transistor 322, and the one electrode of the capacitor 323 is referred to as a node N2. Furthermore, a node which is connected to the one of the source and the drain of the transistor 324, the gate of the transistor 325, and the one electrode of the capacitor 326 is referred to as a node N3. Note that an inversion signal of a signal that is supplied to the wiring BL is supplied to the wiring BLb.

A high-level potential is stored in one of the node N2 and the node N3 as configuration data, and a low-level potential is stored in the other of the node N2 and the node N3 as configuration data. Accordingly, one of the transistors 322 and 325 is on, and the other thereof is off. Thus, a high- or low-level potential can be selectively supplied to the wiring OUT. Since the memory circuit 301 including such a circuit 320 has a function of controlling a logical value output to the wiring OUT, the memory circuit 301 can be used as a configuration memory of the LE 240. In the case where the memory circuit 301 is used as a configuration memory of the LE 240, the wiring OUT is connected to other logic circuits, the RS 280, and the like. Note that storing the configuration data in the node N2 and the node N3 can be performed by an operation similar to the operation of the circuit 310 in FIG. 11A.

Note that the memory circuit 301 includes the circuit 320[0] and the circuit 320[1] which share the wiring OUT. By the supply of predetermined potentials to the wirings CTX[0] and CTX[1], one of the circuit 320[0] and the circuit 320[1] can be selected. Thus, the memory circuit 300 can be used as a multi-context configuration memory.

Specifically, when the context [0] is selected, the wiring CTX[0] is set to turn on the transistor 327 of the circuit 320[0]. In addition, the wiring CTX[1] is set to turn off the transistor 327 of the circuit 320[1]. In this way, the potential of the wiring OUT is controlled by the potentials of the nodes N2 and N3 in the circuit 320[0]. In the case where the context [1] is selected, the wiring CTX[0] is set to turn off the transistor 327 of the circuit 320[0], and the wiring CTX[1] is set to turn on the transistor 327 of the circuit 320[1]. In this way, the potential of the wiring OUT is controlled by the potentials of the nodes N2 and N3 in the circuit 320[1]. Thus, the context for controlling the potential of the wiring OUT can be selected by controlling the potentials of the wirings CTX[0] and CTX[1].

In the circuit 320, OS transistors are used as the transistors 321 and 324. Therefore, the power consumption and the area can be reduced in the circuit 320, as in the circuit 310.

Furthermore, the memory circuit 301 may include a circuit 330. The circuit 330 includes an inverter 331 and a transistor 332. An input terminal and an output terminal of the inverter 331 are connected to the wiring OUT and a gate of the transistor 332, respectively. One of a source and a drain of the transistor 332 is connected to the wiring OUT, and the other of the source and the drain is connected to a wiring to which a predetermined potential (here, a high power supply potential VDD) is supplied. The circuit 330 has a function of retaining the potential of the wiring OUT, whereby the wiring OUT can be prevented from being floating. Thus, the potential of the wiring OUT can be prevented from being the intermediate potential, and generation of a shoot-through current in a circuit element connected to the wiring OUT can be avoided.

Although the gate of the transistor 321 and the gate of the transistor 324 are connected to the same wiring WL in FIG. 12, they may be connected to different wirings WL.

Figure 13A:
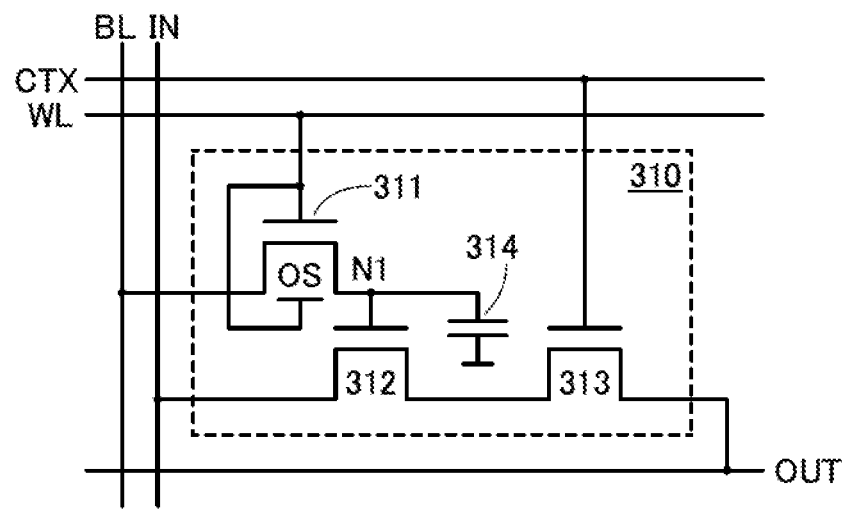
FIGS. 13A and 13B each illustrate a configuration example of a circuit.
Figure 13B:
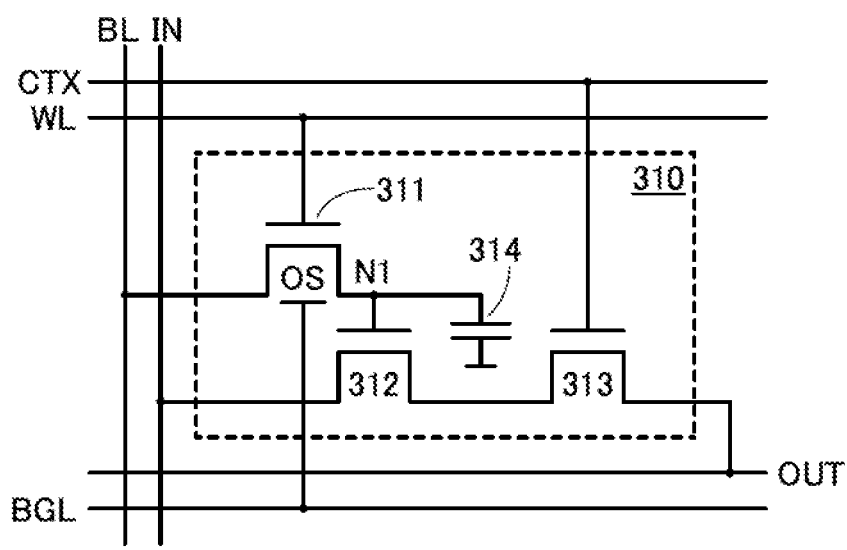

The OS transistor described in this embodiment may include a pair of gates. Taking the circuit 310 illustrated in FIG. 11A as an example, the configurations in which the OS transistor is provided with a pair of gates are illustrated in FIGS. 13A and 13B. Note that one of a pair of gates in a transistor can be referred to as a front gate or, simply, a gate, and the other thereof can be referred to as a back gate.

The transistor 311 illustrated in FIG. 13A includes a back gate which is connected to a front gate. In that case, the potential of the front gate is equal to the potential of the back gate, increasing the on-state current of the transistor 311.

The transistor 311 illustrated in FIG. 13B includes a back gate connected to a wiring BGL. The wiring BGL has a function of supplying a predetermined potential to the back gate. The threshold voltage of the transistor 311 can be controlled by controlling the potential of the wiring BGL. The wiring BGL can be connected to the row driver circuit 235 (see FIG. 9). The potential of the wiring BGL can be controlled by the row driver circuit 235. Furthermore, the wiring BGL is shared by the circuits 310 in the same row.

Although the examples in which the back gate is provided in the transistor 311 of the circuit 310 are illustrated in FIGS. 13A and 13B, any of the OS transistors in this embodiment can similarly be provided with a back gate.

As described above, using an OS transistor in a configuration memory in one embodiment of the present invention enables reductions in the area and power consumption of the PLD.

<Configuration Example of Memory Device>

Next, a configuration example of a memory device which can be used in the above embodiment is described.

Figure 14A:
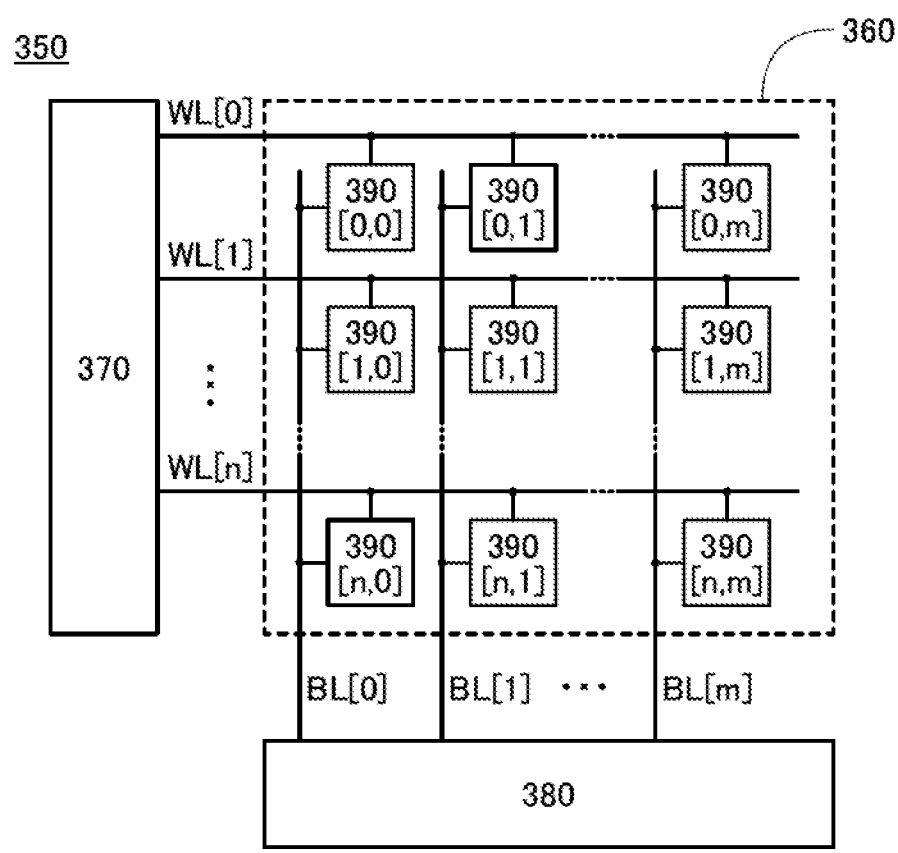
FIGS. 14A to 14D illustrate a configuration example of a memory device.

FIG. 14A illustrates a configuration example of a memory device 350. The memory device 350 can be used as the memory device 160 in the above embodiment. The memory device 350 includes a cell array 360, a driver circuit 370, and a driver circuit 380. The cell array 360 includes a plurality of memory cells 390. Here, the cell array 360 includes (n+1)×(m+1) memory cells 390 (390[0,0] to 390[n,m]) (n and m are natural numbers).

The power supply to the memory device 160 illustrated in FIG. 4 is stopped in a period during which the switch circuit 170 is off. Consequently, a configuration is preferable in which data can be retained in the memory cell 390 even in a period during which the power supply is stopped.

Figure 14B:
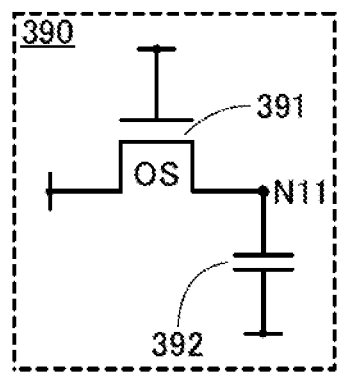

An OS transistor is preferably used as a transistor in the memory cell 390 because of its extremely low off-state current. Specifically, as illustrated in FIG. 14B, the memory cell 390 is preferably provided with a transistor 391 which is an OS transistor and a capacitor 392.

One of a source and a drain of the transistor 391 is connected to the capacitor 392. Here, a node which is connected to the one of the source and the drain of the transistor 391 and one electrode of the capacitor 392 is referred to as a node N11.

A potential to be retained in the memory cell 390 is supplied to the node N11 from a wiring BL or the like through the transistor 391. When the transistor 391 is in an off state, the node N11 is in a floating state and thus the potential of the node N11 is retained. Since the off-state current of the transistor 391 which is an OS transistor is extremely low, the potential of the node N11 can be retained for a long time. The conduction state of the transistor 391 can be controlled by supply of a predetermined potential to a wiring which is connected to a gate of the transistor 391.

The potential retained at the node N11 may be one of two (high- and low-level) potentials or three or more potentials. In the case where one of three or more potentials is retained at the node N11, the differences between the potentials to be retained are particularly small, and therefore slight leakage of charge might cause a change in data. However, since the off-state current of an OS transistor is extremely low, leakage of charge from the node N11 can be significantly suppressed. Therefore, the transistor 391 is preferably an OS transistor particularly in the case where one of three or more potentials is to be retained at the node N11.

In addition, the OS transistor has a higher withstand voltage than a Si transistor or the like. Therefore, when the transistor 391 is the OS transistor, the range of potentials to be retained at the node N11 can be widened. Accordingly, the number of data values to be retained in the memory cell 390 can be increased. For example, one of 16 potentials can be retained at the node N11. In that case, 4-bit data can be stored in the memory cell.

Figure 14C:
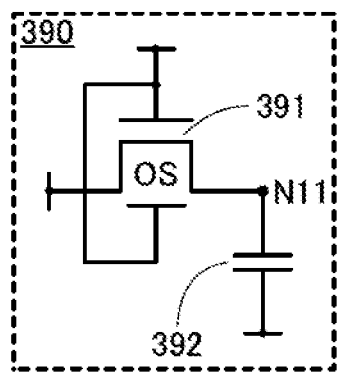
Figure 14D:
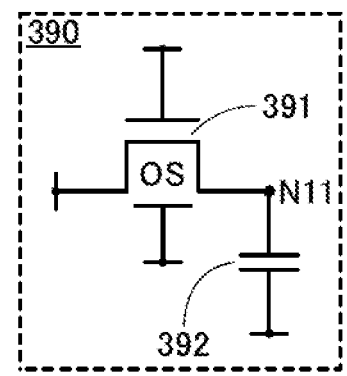

Note that the OS transistor may include a back gate. FIGS. 14C and 14D each illustrate an example in which the transistor 391 includes a back gate. The back gate of the transistor 391 in FIG. 14C is connected to a front gate of the transistor 391. The back gate of the transistor 391 in FIG. 14D is connected to a wiring to which a predetermined potential is supplied.

With the use of the OS transistor in the memory cell 390 in such a manner, a highly reliable semiconductor device in which data stored in the memory cell 390 can be retained for a long time can be provided. Specific configuration examples of the memory cell 390 will be described below.

Figure 15A:
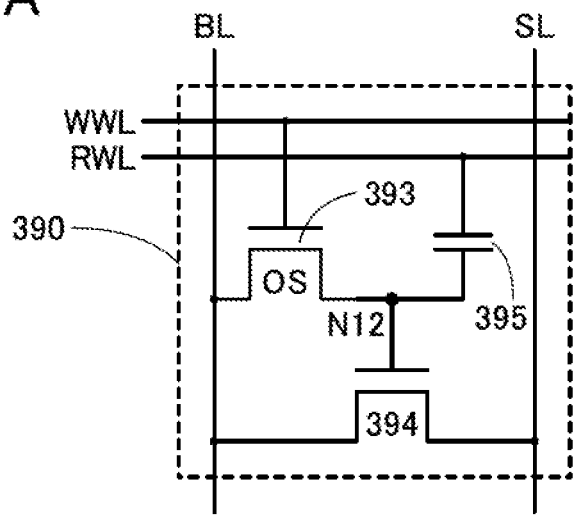
FIGS. 15A to 15C each illustrate a configuration example of a memory cell.

FIG. 15A illustrates a configuration example of the memory cell 390. The memory cell 390 illustrated in FIG. 15A includes transistors 393 and 394 and a capacitor 395. Note that the transistor 393 is an OS transistor. Although the transistor 394 is an n-channel transistor here, the transistor 394 may be a p-channel transistor.

A gate of the transistor 393 is connected to a wiring WWL. One of a source and a drain of the transistor 393 is connected to a gate of the transistor 394 and one electrode of the capacitor 395. The other of the source and the drain of the transistor 393 is connected to the wiring BL. One of a source and a drain of the transistor 394 is connected to the wiring SL, and the other of the source and the drain is connected to the wiring BL. The other electrode of the capacitor 395 is connected to a wiring RWL. Here, a node which is connected to the one of the source and the drain of the transistor 393, the gate of the transistor 394, and the one electrode of the capacitor 395 is referred to as a node N12.

The wiring WWL has a function of transmitting a selection signal to the memory cell 390 to which data is written. The wiring RWL has a function of transmitting a selection signal to the memory cell 390 from which data is read. The wiring BL has a function of transmitting a potential corresponding to data written to the memory cell 390 (hereinafter also referred to as a write potential) or a potential corresponding to data stored in the memory cell 390 (hereinafter also referred to as a read potential). The wiring SL is supplied with a predetermined potential. The predetermined potential may be a fixed potential, or may be two or more different potentials. Note that the wiring WWL and the wiring RWL correspond to the wiring WL in FIG. 14A and are connected to the driver circuit 370. The wiring SL may be connected to the driver circuit 370 or the driver circuit 380, or may be connected to a power supply line provided separately from the driver circuit 370 and the driver circuit 380.

When an OS transistor is used as the transistor 393, the transistor 393 in the off state enables the potential of the node N12 to be retained for an extremely long time.

Next, an operation of the memory cell 390 illustrated in FIG. 15A will be described. First, the potential of the wiring WWL is set to a potential at which the transistor 393 is turned on, so that the transistor 393 is turned on. Accordingly, the potential of the wiring BL is supplied to the node N12. That is, a predetermined charge is supplied to the gate electrode of the transistor 394 (data writing).

After that, the potential of the wiring WWL is set to a potential at which the transistor 393 is turned off, so that the transistor 393 is turned off. This makes the node N12 floating, so that the potential of the node N12 is retained (data retention).

Next, the potential of the wiring SL is fixed to a constant potential, and then, the potential of the wiring RWL is set to a predetermined potential, so that the potential of the wiring BL varies depending on the amount of charge retained at the node N12. This is because, in general, in the case where the transistor 394 is an n-channel transistor, an apparent threshold voltage $V_{th\_H}$ at the time when the potential of the gate of the transistor 394 is at the high level is lower than an apparent threshold voltage $V_{th\_L}$ at the time when the potential of the gate of the transistor 394 is at the low level. Here, the apparent threshold voltage refers to the potential of the wiring RWL which is needed to turn on the transistor 394. Thus, by setting the potential of the wiring RWL to a potential $V_0$ which is between $V_{th\_H}$ and $V_{th\_L}$, the potential of the node N12 can be determined. For example, in the case where the potential of the node N12 is at the high level, the transistor 394 is turned on when the potential of the wiring RWL becomes $V_0$ ($>V_{th\_H}$). In the case where the potential of the node N12 is at the low level, the transistor 394 remains in the off state even when the potential of the wiring RWL becomes $V_0$ ($<V_{th\_L}$). Thus, the data stored in the memory cell 390 can be read out by determining the potential of the wiring BL.

In the case where the data reading is not performed, a potential at which the transistor 394 is turned off regardless of the potential of the node N12, that is, a potential lower than $V_{th\_H}$ may be supplied to the wiring RWL.

Rewriting of data can be performed in a manner similar to that of the writing and retaining of data. Specifically, the potential of the wiring WWL is set to a potential at which the transistor 393 is turned on, so that the transistor 393 is turned on. Accordingly, the potential of the wiring BL which corresponds to data to be rewritten is supplied to the node N12. After that, the potential of the wiring WWL is set to a potential at which the transistor 393 is turned off, so that the transistor 393 is turned off. This makes the node N12 floating, so that the potential corresponding to the rewritten data is retained at the node N12.

Since the transistor 393 is an OS transistor with an extremely low off-state current, the potential of the node N12 can be maintained for a long time in the retention period. Consequently, even in a period during which the power supply to the memory cell 390 is stopped, data can be retained.

Note that the one of the source and the drain of the transistor 393 is connected to the gate of the transistor 394, thereby having a function similar to that of a floating gate of a floating-gate transistor which is used as a nonvolatile memory. Therefore, in FIG. 15A, a portion where the one of the source and the drain of the transistor 393 and the gate of the transistor 394 are connected to each other can also be called a floating gate portion. When the transistor 393 is in an off state, the floating gate portion can be regarded as being buried in an insulator, and charge is retained in the floating gate portion. The off-state current of the transistor 393 is less than or equal to 1/100,000 of the off-state current of a Si transistor; thus, a loss of the charge accumulated in the floating gate portion due to leakage of the transistor 393 is extremely small. Alternatively, a loss of the charge accumulated in the floating gate portion is negligible for a long time. Therefore, with the use of the transistor 393 which is an OS transistor, a memory device capable of retaining data for a long time even in a period during which the power supply is stopped can be obtained.

In the memory cell 390 in FIG. 15A, data can be directly rewritten by another writing of data. For that reason, an erase operation which is necessary for a flash memory or the like is not needed, so that a reduction in operation speed due to the erase operation can be prevented. In other words, high-speed operation of the semiconductor device can be realized.

Furthermore, in that case, the problem of deterioration of a gate insulating film (tunnel insulating film), which has been pointed out in a conventional floating gate transistor, does not exist. That is, the deterioration of a gate insulating film due to injection of electrons into a floating gate, which has been regarded as a problem, can be solved. This means that there is no limitation on the number of times of writing in principle. In addition, high voltage which is needed for writing or erasing data in a conventional floating-gate transistor is not necessary.

Although one of two potentials is retained at the node N12 here, one of three or more potentials may be retained. Thus, the memory cell 390 can store multilevel data.

It is supposed that 1-bit (2-level) data is retained at the node N12 for 10 years. In the case where the power supply potential is higher than or equal to 2 V and lower than or equal to 3.5 V, the capacitance of the capacitor 395 is 21 fF, and the acceptable amount of change in retained potential is less than 0.5 V, the leakage current of the node N12 needs to be lower than $33 \times 10^{-24}$ A in order that a change in retained potential is within the acceptable range for 10 years at 85° C. In the case where the leakage current of other components is lower than the above and a leakage current occurs almost exclusively in OS transistors, each OS transistor with a channel width of 350 nm preferably has a leakage current per unit area of lower than $93 \times 10^{-24}$ A/µm. In the memory cell 390 having the above configuration, data can be retained for 10 years at 85° C.

It is supposed that 4-bit (16-level) data is retained at the node N12 for 10 years. In the case where the power supply potential is higher than or equal to 2 V and lower than or equal to 3.5 V, the capacitance of the capacitor 395 is 0.1 fF, the distribution width of a retained potential is less than 30 mV, and the acceptable amount of change in retained potential is less than 80 mV, the leakage current of the node N12 needs to be lower than $0.025 \times 10^{-24}$ A in order that a change in retained potential is within the acceptable range for 10 years at 85° C. In the case where leakage current from other components is lower than the above and a leakage current occurs almost exclusively in OS transistors, each OS transistor with a channel width of 60 nm preferably has a leakage current per unit area of lower than $0.423 \times 10^{-24}$ A/µm. In the memory cell 390 having the above configuration, data can be retained for 10 years at 85° C.

It is supposed that 8-bit (256-level) data is retained at the node N12 for 10 years. In the case where the power supply potential is higher than or equal to 2 V and lower than or equal to 3.5 V, the storage capacitance is 0.1 fF, the distribution width of a retained potential is less than 2 mV, and the acceptable amount of change in retained potential is less than 5 mV, the leakage current of the node N12 needs to be lower than $0.0016 \times 10^{-24}$ A in order that a change in retained potential is within the acceptable range for 10 years at 85° C. In the case where the leakage current of other components is lower than the above and a leakage current occurs almost exclusively in OS transistors, each OS transistor with a channel width of 60 nm preferably has a leakage current per unit area of lower than $0.026 \times 10^{-24}$ A/µm. In the memory cell 390 having the above configuration, data can be retained for 10 years at 85° C.

Figure 15B:
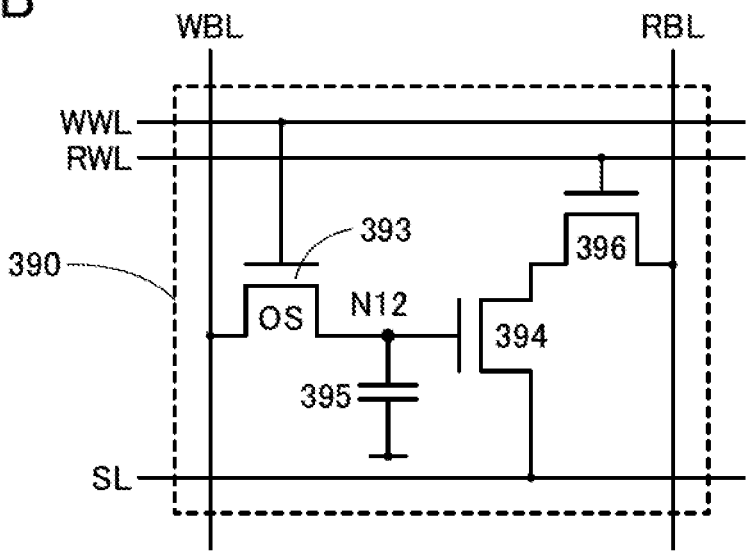

Although FIG. 15A illustrates a configuration in which the data writing and the data reading are performed using the same wiring BL, the data writing and the data reading may be performed using different wirings. In other words, the other of the source and the drain of the transistor 393 and the other of the source and the drain of the transistor 394 may be connected to different wirings. In addition, the transistor 394 may be connected to the wiring BL through another transistor, or the transistor 394 may be connected to the wiring SL through another transistor. FIG. 15B illustrates a modification example of the memory cell 390 in FIG. 15A.

The memory cell 390 illustrated in FIG. 15B includes the transistors 393 and 394, the capacitor 395, and a transistor 396. Although the transistors 394 and 396 are n-channel transistors here, the transistors 394 and 396 may be p-channel transistors.

A gate of the transistor 393 is connected to the wiring WWL. One of a source and a drain of the transistor 393 is connected to a gate of the transistor 394 and one electrode of the capacitor 395. The other of the source and the drain of the transistor 393 is connected to a wiring WBL. One of a source and a drain of the transistor 394 is connected to the wiring SL, and the other of the source and the drain is connected to one of a source and a drain of the transistor 396. A gate of the transistor 396 is connected to the wiring RWL, and the other of the source and the drain of the transistor 396 is connected to a wiring RBL. The other electrode of the capacitor 395 is connected to a wiring to which a predetermined potential is supplied.

The memory cell 390 in FIG. 15B includes different wirings, the wiring WBL and the wiring RBL, as the wiring BL. The wiring WBL has a function of transmitting the write potential, and the wiring RBL has a function of transmitting the read potential.

In FIG. 15B, the potential of the wiring RWL is set to a potential at which the transistor 396 is turned on, so that the transistor 396 is turned on. Accordingly, the read potential can be output to the wiring RBL. That is, data reading from the memory cell 390 can be controlled by a signal supplied to the wiring RBL.

Figure 15C:
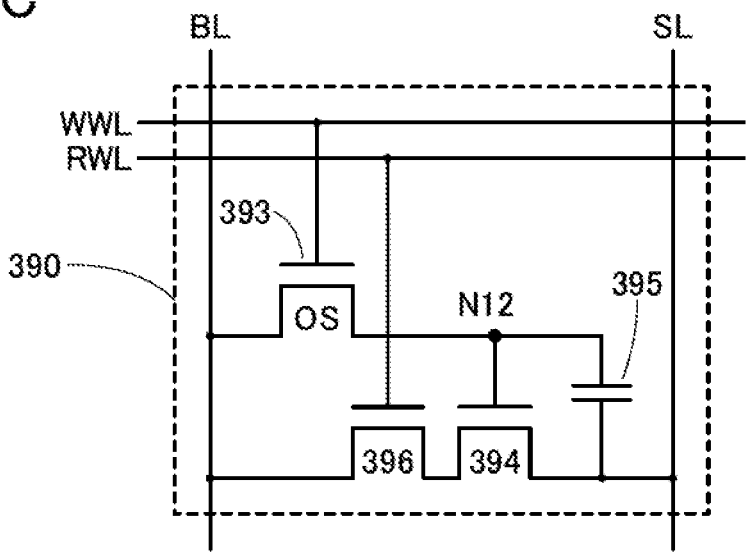

In FIG. 15B, the wiring WBL and the wiring RBL may be the single wiring BL. FIG. 15C illustrates such a configuration of the memory cell 390. In FIG. 15C, the transistor 393 and the transistor 396 are connected to the wiring BL. The capacitor 395 is connected to the wiring SL.

Note that the transistor 393 and the transistor 394 (and the transistor 396) in FIGS. 15A to 15C can be stacked. For example, an insulating layer can be provided above the transistor 394, and the transistor 393 which is an OS transistor and the capacitor 395 can be provided above the insulating layer. Accordingly, the area of the memory cell 390 can be reduced.

When the OS transistor is used in the memory cell 390 as described above, data stored in the memory cell 390 can be retained for a long time. Data stored in the memory cell 390 can be retained even in a period during which power supply to the memory cell 390 is stopped.

Note that there is no particular limitation on a material of the transistors other than the transistors indicated by "OS" in FIGS. 15A to 15C. In addition, each of the transistors illustrated in FIGS. 15A to 15C may include a pair of gates.

As described above, with the use of an OS transistor for the PLD or the memory circuit, the power consumption of the semiconductor device can be reduced.

This embodiment can be combined with any of the other embodiments as appropriate.

Embodiment 3

In this embodiment, a more specific configuration example of the display system described in the above embodiment will be described. In particular, a configuration in which the display portion includes a plurality of pixel groups as illustrated in FIG. 7 will be described.

Figure 16:
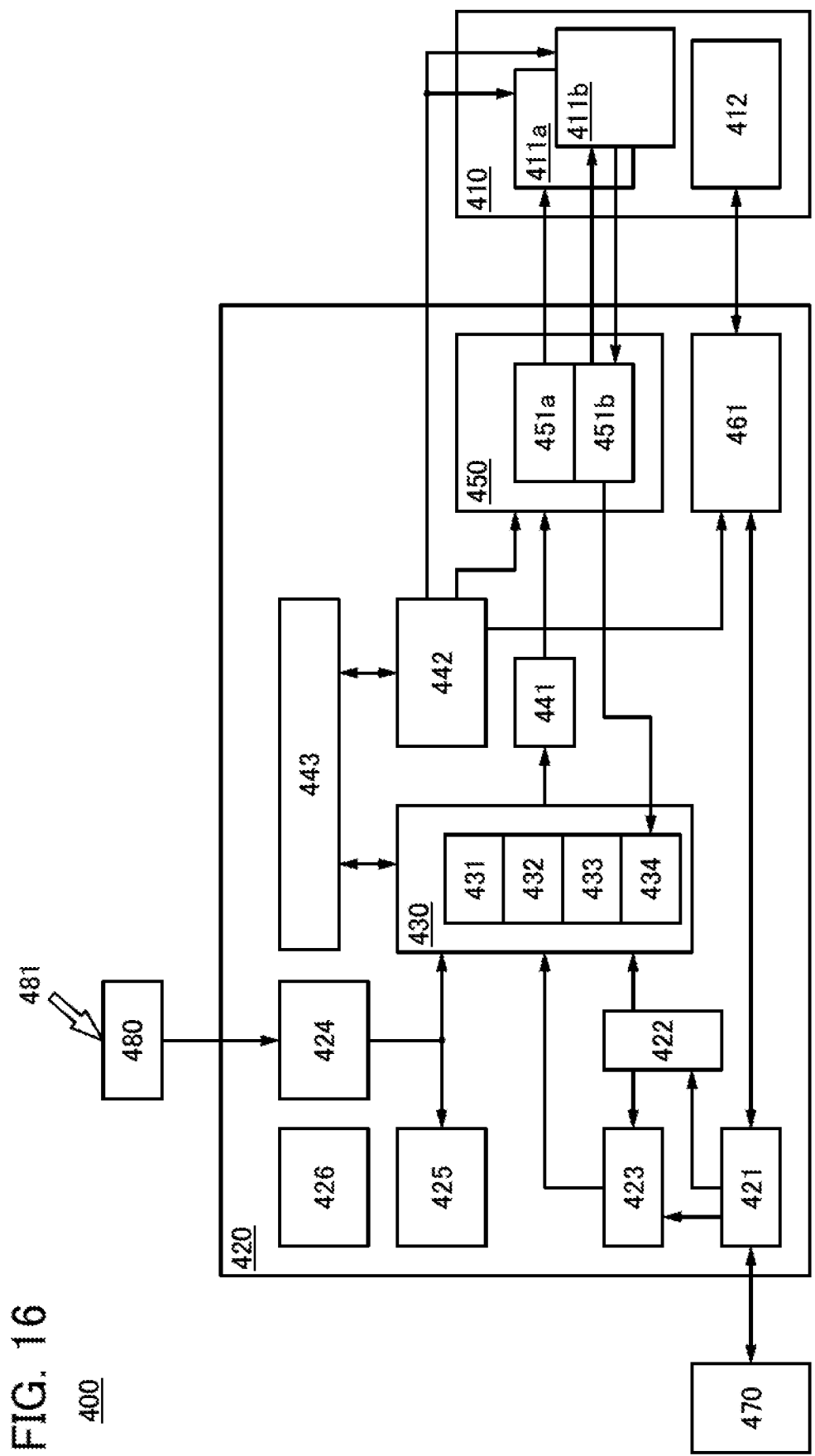
FIG. 16 illustrates a configuration example of a display system.

FIG. 16 illustrates a configuration example of a display system 400 including a display portion 410 and a control portion 420. The display portion 410 and the control portion 420 correspond to the display portion 13 and the semiconductor device 12 in the above embodiment, respectively.

The control portion 420 includes an interface 421, a frame memory 422, a decoder 423, a sensor controller 424, a controller 425, a clock generation circuit 426, an image processing portion 430, a memory device 441, a timing controller 442, a register 443, a driver circuit 450, and a touch sensor controller 461. The image processing portion 430 corresponds to the image processing portion 20 in the above embodiment.

The display portion 410 has a function of displaying an image on a display unit 411 using a video signal input from the control portion 420. In addition, the display portion 410 may include a touch sensor unit 412 having a function of obtaining information on whether an object touches, where an object touches, or the like. In the case where the display portion 410 does not include the touch sensor unit 412, the touch sensor controller 461 may be omitted.

As the display unit 411, a display unit which performs display using a liquid crystal element, a display unit which performs display using a light-emitting element, or the like can be used. The number of display units 411 provided in the display portion 410 may be one or two or more. FIG. 16 illustrates, as an example, a configuration in which the display portion 410 includes a display unit 411a that performs display using a reflective liquid crystal element and a display unit 411b that performs display using a light-emitting element. The display units 411a and 411b correspond to a unit including the pixel group 50a and the driver circuit 60a and a unit including the pixel group 50b and the driver circuit 60b in FIG. 7, respectively.

The driver circuit 450 includes a source driver 451. The source driver 451 is a circuit having a function of supplying a video signal to the display unit 411. Since the display portion 410 includes the display units 411a and 411b in FIG. 16, the driver circuit 450 includes source drivers 451a and 451b. The source drivers 451a and 451b correspond to the driver circuits 30a and 30b in FIG. 7, respectively.

Communication between the control portion 420 and a host 470 can be performed through the interface 421. Image data, various control signals, and the like are transmitted from the host 470 to the control portion 420. In addition, information on whether an object touches, where an object touches, or the like which the touch sensor controller 461 obtains is transmitted from the control portion 420 to the host 470. Note that the circuits included in the control portion 420 can be selected as appropriate in accordance with the standard of the host 470, the specifications of the display portion 410, and the like. The host 470 corresponds to the processor 11 in the above embodiment.

The frame memory 422 is a memory circuit having a function of storing image data input to the control portion 420. In the case where compressed image data is transmitted from the host 470 to the control portion 420, the frame memory 422 can store the compressed image data. The decoder 423 is a circuit for decompressing the compressed image data. When decompression of the image data is not needed, processing is not performed in the decoder 423. Note that the decoder 423 can be provided between the frame memory 422 and the interface 421.

The image processing portion 430 has a function of performing various kinds of image processing on image data input from the frame memory 422 or the decoder 423 and generating a video signal. For example, the image processing portion 430 includes a gamma correction circuit 431, a dimming circuit 432, and a toning circuit 433.

In the case where the source driver 451b includes a circuit (current sensing circuit) having a function of sensing current which flows to a light-emitting element included in the display unit 411b, an EL correction circuit 434 may be provided in the image processing portion 430. The EL correction circuit 434 has a function of adjusting the luminance of the light-emitting element on the basis of a signal transmitted from the current sensing circuit.

A video signal generated in the image processing portion 430 is output to the driver circuit 450 through the memory device 441. The memory device 441 has a function of temporarily storing image data. The source drivers 451a and 451b have a function of performing various kinds of processing on video signals input from the memory device 441 and outputting the signals to the display units 411a and 411b.

The timing controller 442 has a function of generating timing signals and the like used in the driver circuit 450, the touch sensor controller 461, and the driver circuit included in the display unit 411.

The touch sensor controller 461 has a function of controlling the operation of the touch sensor unit 412. A signal including touch information sensed by the touch sensor unit 412 is processed in the touch sensor controller 461 and transmitted to the host 470 through the interface 421. The host 470 generates image data in accordance with the touch information and transmits the image data to the control portion 420. The control portion 420 may have a function of incorporating the touch information in the image data. The touch sensor controller 461 may be provided in the touch sensor unit 412.

The clock generation circuit 426 has a function of generating a clock signal used in the control portion 420. The controller 425 has a function of processing a variety of control signals transmitted from the host 470 through the interface 421 and controlling a variety of circuits in the control portion 420. The controller 425 also has a function of controlling power supply to the variety of circuits in the control portion 420. For example, the controller 425 can temporarily interrupt the power supply to a circuit which is not driven.

The register 443 has a function of storing data used for the operation of the control portion 420. Examples of the data stored in the register 443 include a parameter used to perform correction processing in the image processing portion 430 and parameters used to generate waveforms of a variety of timing signals in the timing controller 442. The register 443 includes a scan chain register including a plurality of registers.

The sensor controller 424 connected to a photosensor 480 can be provided in the control portion 420. The photosensor 480 has a function of sensing external light 481 and generating a sensing signal. The sensor controller 424 has a function of generating a control signal on the basis of the sensing signal. The control signal generated in the sensor controller 424 is output to the controller 425, for example.

In the case where the display units 411a and 411b display the same image, the image processing portion 430 has a function of separately generating a video signal of the display unit 411a and a video signal of the display unit 411b. In that case, in accordance with the brightness of the external light 481 measured by the photosensor 480 and the sensor controller 424, the reflection intensity of the reflective liquid crystal element included in the display unit 411a and the emission intensity of the light-emitting element included in the display unit 411b can be adjusted. Here, the adjustment can be referred to as dimming or dimming treatment. In addition, a circuit that performs the dimming treatment is referred to as a dimming circuit.

The image processing portion 430 may include another processing circuit such as an RGB-RGBW conversion circuit depending on the specifications of the display portion 410. The RGB-RGBW conversion circuit has a function of converting image data of red, green, and blue (RGB) into image signals of red, green, blue, and white (RGBW). That is, in the case where the display portion 410 includes pixels of four colors of RGBW, power consumption can be reduced by displaying a white (W) component in the image data using the white (W) pixel. Note that the image processing portion 430 may include, for example, a RGB-RGBY (red, green, blue, and yellow) conversion circuit without limitation to the RGB-RGBW conversion circuit.

As the gamma correction circuit 431 in FIG. 16, the correction circuit 22 described in the above embodiment can be used. Accordingly, gamma correction suitable for the display units 411a and 411b can be independently executed.

This embodiment can be combined with any of the other embodiments as appropriate.

Embodiment 4

In this embodiment, structure examples of a display device that can be used for the display system described in the above embodiment will be described.

A display device described below can be used in the display portion described in the above embodiment. In particular, a display device which can perform display using a reflective element and a light-emitting element will be described.

Figure 17A:
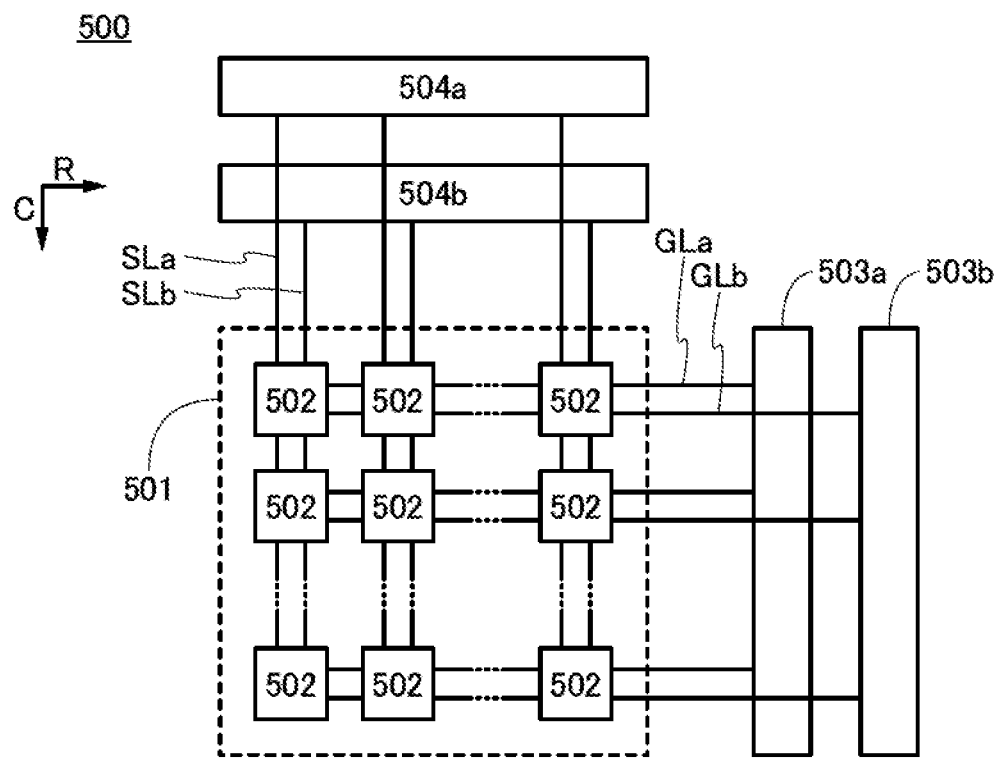
Figure 17A:
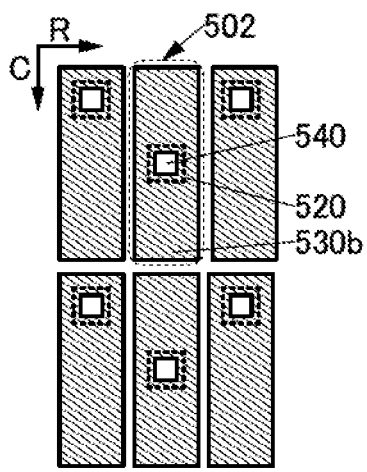
Figure 17A:
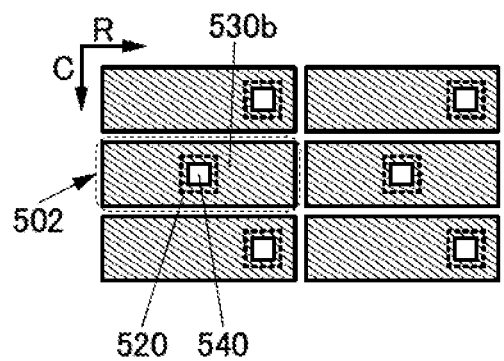

FIG. 17A is a block diagram illustrating an example of the structure of a display device 500 which can be used in the display portion. The display device 500 includes a plurality of pixel units 502 arranged in a matrix in a pixel portion 501. The display device 500 includes driver circuits 503a, 503b, 504a, and 504b. The display device 500 also includes a plurality of wirings GLa connected to the driver circuit 503a and the plurality of pixel units 502 arranged in a direction R, and a plurality of wirings GLb connected to the driver circuit 503b and the plurality of pixel units 502 arranged in the direction R. In addition, the display device 500 includes a plurality of wirings SLa connected to the driver circuit 504a and the plurality of pixel units 502 arranged in a direction C, and a plurality of wirings SLb connected to the driver circuit 504b and the plurality of pixel units 502 arranged in the direction C.

The driver circuits 503a and 503b correspond to the driver circuits 60a and 60b in FIG. 7, respectively. The driver circuits 504a and 504b correspond to the driver circuits 30a and 30b in FIG. 7, respectively. That is, in the display device 500, the driver circuits 30a and 30b in FIG. 7 are provided in the display portion 13. Note that the driver circuit 504a and 504b may also be provided in the semiconductor device 12 in FIG. 7.

The pixel unit 502 includes a reflective liquid crystal element and a light-emitting element. In the pixel unit 502, the liquid crystal element and the light-emitting element partly overlap with each other.

FIG. 17B1 illustrates a structure example of a conductive layer 530b included in the pixel unit 502. The conductive layer 530b serves as a reflective electrode of the liquid crystal element in the pixel unit 502. The conductive layer 530b includes an opening 540.

In FIG. 17B1, a light-emitting element 520 in a region overlapping with the conductive layer 530b is denoted by a dashed line. The light-emitting element 520 overlaps with the opening 540 included in the conductive layer 530b. Thus, light from the light-emitting element 520 is emitted to the display surface side through the opening 540.

In FIG. 17B1, the pixel units 502 adjacent in the direction R correspond to different emission colors. As illustrated in FIG. 17B1, the openings 540 are preferably provided in different positions in the conductive layers 530b so as not to be aligned in the two pixels adjacent to each other in the direction R. This allows the two light-emitting elements 520 to be apart from each other, thereby preventing light emitted from the light-emitting element 520 from entering a coloring layer in the adjacent pixel unit 502 (such a phenomenon is also referred to as "crosstalk"). Furthermore, since the two adjacent light-emitting elements 520 can be arranged apart from each other, a high-resolution display device can be achieved even when EL layers of the light-emitting elements 520 are separately formed with a shadow mask or the like.

Alternatively, arrangement illustrated in FIG. 17B2 may be employed.

If the ratio of the total area of the opening 540 to the total area except for the opening is too high, display performed using the liquid crystal element is dark. If the ratio of the total area of the opening 540 to the total area except for the opening is too low, display performed using the light-emitting element 520 is dark.

If the area of the opening 540 in the conductive layer 530b serving as a reflective electrode is too small, light emitted from the light-emitting element 520 is extracted less efficiently.

The shape of the opening 540 can be, for example, polygonal, quadrangular, elliptical, circular, or cross-shaped. Alternatively, the opening 540 may have a stripe shape, a slit shape, or a checkered pattern. The opening 540 may be close to the adjacent pixel. Preferably, the opening 540 is provided close to another pixel emitting light of the same color, in which case crosstalk can be suppressed.

<Configuration Example of Pixel>

Figure 18:
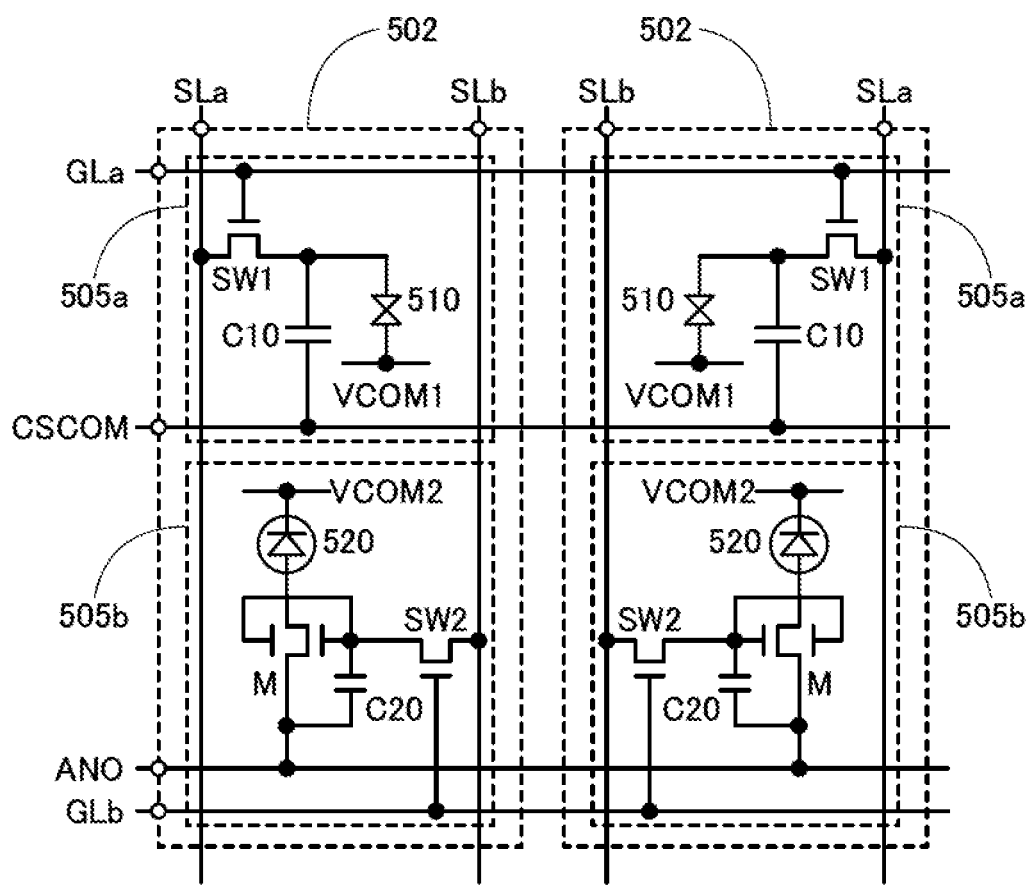
FIG. 18 illustrates a configuration example of a pixel.

FIG. 18 is a circuit diagram illustrating a configuration example of the pixel unit 502. FIG. 18 illustrates two adjacent pixel units 502. The pixel units 502 each include a pixel 505a and a pixel 505b. The pixels 505a and 505b correspond to the pixels 51a and 51b in FIG. 7, respectively.

The pixel 505a includes a switch SW1, a capacitor C10, and a liquid crystal element 510, and the pixel 505b includes a switch SW2, a transistor M, a capacitor C20, and the light-emitting element 520. The pixel 505a is connected to the wiring SLa, the wiring GLa, and a wiring CSCOM. The pixel 505b is connected to the wiring GLb, the wiring SLb, and a wiring ANO. Note that in FIG. 18, a wiring VCOM1 connected to the liquid crystal element 510 and a wiring VCOM2 connected to the light-emitting element 520 are illustrated. FIG. 18 illustrates an example in which a transistor is used as each of the switches SW1 and SW2.

A gate of the switch SW1 is connected to the wiring GLa. One of a source and a drain of the switch SW1 is connected to the wiring SLa, and the other of the source and the drain is connected to one electrode of the capacitor C10 and one electrode of the liquid crystal element 510. The other electrode of the capacitor C10 is connected to the wiring CSCOM. The other electrode of the liquid crystal element 510 is connected to the wiring VCOM1.

A gate of the switch SW2 is connected to the wiring GLb. One of a source and a drain of the switch SW2 is connected to the wiring SLb, and the other of the source and the drain is connected to one electrode of the capacitor C20 and a gate of the transistor M. The other electrode of the capacitor C20 is connected to one of a source and a drain of the transistor M and the wiring ANO. The other of the source and the drain of the transistor M is connected to one electrode of the light-emitting element 520. Furthermore, the other electrode of the light-emitting element 520 is connected to the wiring VCOM2.

FIG. 18 illustrates an example in which the transistor M includes a pair of gates which are connected to each other. This structure can increase the amount of current flowing through the transistor M.

A predetermined potential can be supplied to each of the wirings VCOM1 and CSCOM. A potential which can generate a potential difference capable of making the light-emitting element 520 emit light can be supplied to each of the wirings VCOM2 and ANO.

In the pixel unit 502 illustrated in FIG. 18, for example, in the case where display in the reflective mode is performed, an image can be displayed by driving the pixel 505a with the signals supplied to the wirings GLa and SLa and utilizing the optical modulation of the liquid crystal element 510. In the case where display is performed in the transmissive mode, an image can be displayed by driving the pixel 505b with the signals supplied to the wirings GLb and SLb and making the light-emitting element 520 emit light. In the case where driving is performed in both the modes, the pixels 505a and 505b can be driven with the signals supplied to the wirings GLa, GLb, SLa, and SLb.

Figure 19A:
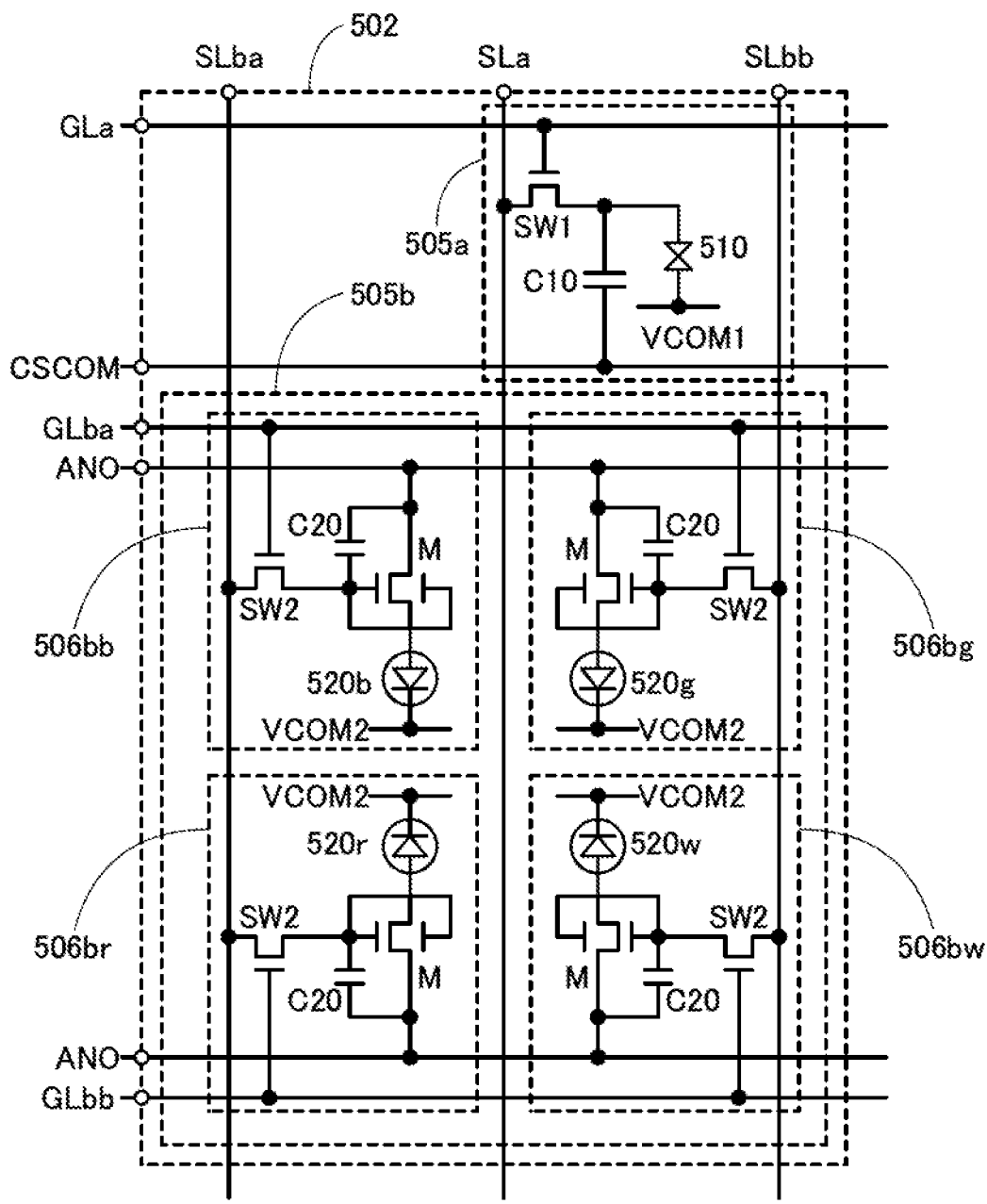
FIGS. 19A and 19B illustrate a configuration example of a pixel.

Although FIG. 18 illustrates an example in which one liquid crystal element 510 and one light-emitting element 520 are provided in one pixel unit 502, one embodiment of the present invention is not limited thereto. For example, as illustrated in FIG. 19A, the pixel 505b may include a plurality of subpixels 506b (506br, 506bg, 506bb, and 506bw). The subpixels 506br, 506bg, 506bb, and 506bw include light-emitting elements 520r, 520g, 520b, and 520w, respectively. The pixel unit 502 in FIG. 19A is capable of full color display by one pixel unit, which is different from the pixel unit in FIG. 18.

In FIG. 19A, the pixel 505b is connected to wirings GLba, GLbb, SLba, and SLbb.

In the example illustrated in FIG. 19A, for example, light-emitting elements which exhibit red (R), green (G), blue (B), and white (W) can be used as the four light-emitting elements 520. Furthermore, as the liquid crystal element 510, a reflective liquid crystal element emitting white light can be used. Thus, in the case of performing display in the reflective mode, white display with high reflectivity can be performed. In the case of performing display in the transmissive mode, images can be displayed with a higher color rendering property at low power consumption.

Figure 19B:
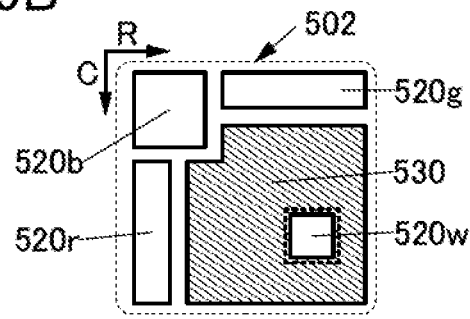

FIG. 19B illustrates a configuration example of the pixel unit 502. The pixel unit 502 includes the light-emitting element 520w overlapping with an opening of a conductive layer 530 as well as the light-emitting element 520r, the light-emitting element 520g, and the light-emitting element 520b which are provided around the conductive layer 530. It is preferable that the light-emitting elements 520r, 520g, and 520b have substantially the same light-emitting area.

As the switches SW1 and SW2, OS transistors are preferably used. With the use of an OS transistor, charge can be retained in the capacitors C10 and C20 for an extremely long time. Therefore, also in a period during which a video signal is not generated by the semiconductor device 12, an image displayed in the pixel unit can be kept for a long time. Accordingly, power gating can be performed in the semiconductor device 12 described in the above embodiment for a long time.

<Structure Example of Display Device>

Figure 20:
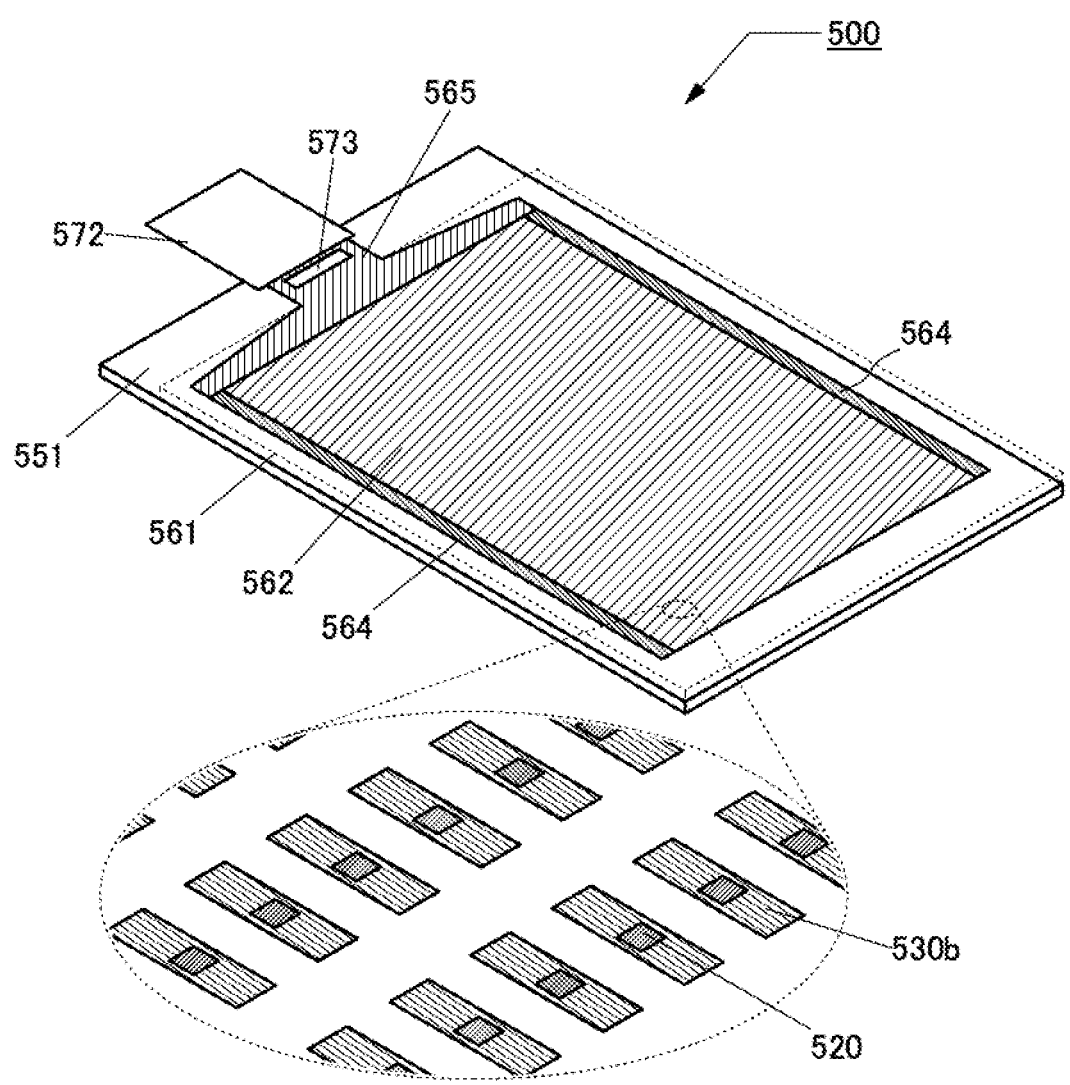
FIG. 20 illustrates a structure example of a display device.

FIG. 20 is a schematic perspective view illustrating the display device 500 of one embodiment of the present invention. In the display device 500, a substrate 551 and a substrate 561 are attached to each other. In FIG. 20, the substrate 561 is denoted by a dashed line.

The display device 500 includes a display region 562, circuits 564, a wiring 565, and the like. The substrate 551 is provided with the circuit 564, the wiring 565, the conductive layer 530b which serves as a pixel electrode, and the like. In FIG. 20, an IC 573 and an FPC 572 are mounted on the substrate 551. Thus, the structure illustrated in FIG. 20 can be referred to as a display module including the display device 500, the FPC 572, and the IC 573.

As each of the circuits 564, for example, a circuit serving as the driver circuit 504 can be used.

The wiring 565 has a function of supplying a signal or electric power to the display region 562 or the circuit 564. The signal or electric power is input to the wiring 565 from the outside through the FPC 572 or from the IC 573.

FIG. 20 illustrates an example in which the IC 573 is provided on the substrate 551 by a chip on glass (COG) method or the like. As the IC 573, an IC functioning as the driver circuit 503 or 504, or the like can be used. Note that it is possible that the IC 573 is not provided when, for example, the display device 500 includes circuits serving as the driver circuit 503 or 504 and when the circuits serving as the driver circuit 503 or 504 are provided outside and a signal for driving the display device 500 is input through the FPC 572. Alternatively, the IC 573 may be mounted on the FPC 572 by a chip on film (COF) method or the like.

FIG. 20 also illustrates an enlarged view of part of the display region 562. The conductive layers 530b included in a plurality of display elements are arranged in a matrix in the display region 562. The conductive layer 530b has a function of reflecting visible light and serves as a reflective electrode of the liquid crystal element 510 described later.

As illustrated in FIG. 20, the conductive layer 530b includes an opening. The light-emitting element 520 is provided on the substrate 551 side of the conductor layer 530b. Light is emitted from the light-emitting element 520 to the substrate 561 side through the opening in the conductive layer 530b.

Figure 21:
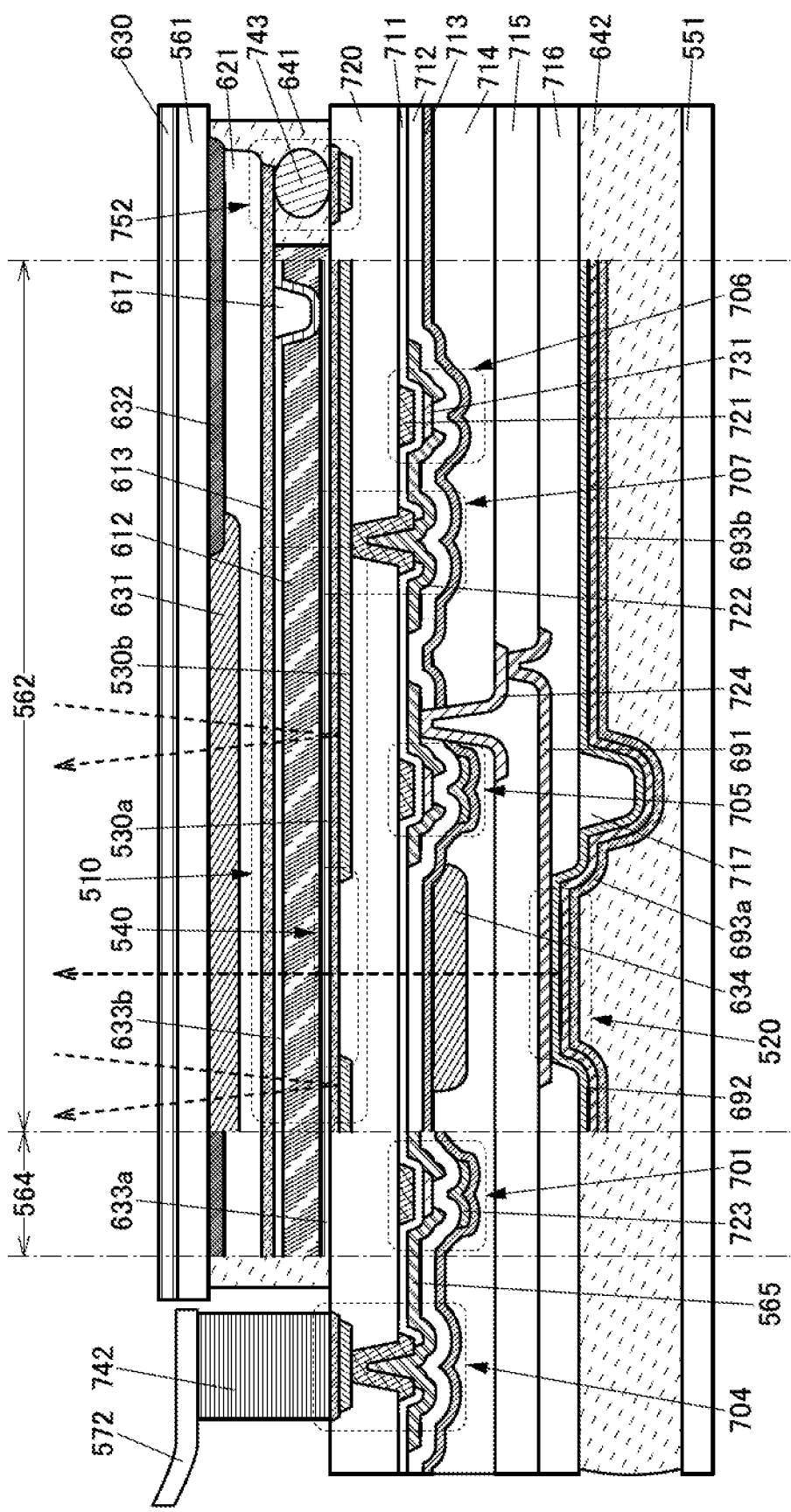
FIG. 21 illustrates a structure example of a display device.

FIG. 21 illustrates an example of cross sections of part of a region including the FPC 572, part of a region including the circuit 564, and part of a region including the display region 562 of the display device illustrated in FIG. 20.

The display device 500 includes an insulating layer 720 between the substrates 551 and 561. The display device 500 also includes the light-emitting element 520, a transistor 701, a transistor 705, a transistor 706, a coloring layer 634, and the like between the substrate 551 and the insulating layer 720. Furthermore, the display device 500 includes the liquid crystal element 510, a coloring layer 631, and the like between the insulating layer 720 and the substrate 561. The substrate 561 and the insulating layer 720 are bonded with an adhesive layer 641. The substrate 551 and the insulating layer 720 are bonded with an adhesive layer 642.

The transistor 706 is connected to the liquid crystal element 510, and the transistor 705 is connected to the light-emitting element 520. Since the transistors 705 and 706 are formed on a surface of the insulating layer 720 which is on the substrate 551 side, the transistors 705 and 706 can be formed through the same process.

The coloring layer 631, a light-blocking layer 632, an insulating layer 621, a conductive layer 613 serving as a common electrode of the liquid crystal element 510, an alignment film 633b, an insulating layer 617, and the like are provided over the substrate 561. The insulating layer 617 serves as a spacer for keeping the cell gap of the liquid crystal element 510.

Insulating layers such as an insulating layer 711, an insulating layer 712, an insulating layer 713, an insulating layer 714, an insulating layer 715, an insulating layer 716, and the like are provided on the substrate 551 side of the insulating layer 720. Part of the insulating layer 711 functions as a gate insulating layer of each transistor. The insulating layer 712, the insulating layer 713, and the insulating layer 714 are provided to cover each transistor. The insulating layer 716 is provided to cover the insulating layer 714. The insulating layers 714 and 716 each function as a planarization layer. Note that an example in which the three insulating layers, the insulating layers 712, 713, and 714, are provided to cover the transistors and the like is described here; however, one embodiment of the present invention is not limited to this example, and four or more insulating layers, a single insulating layer, or two insulating layers may be provided. The insulating layer 714 functioning as a planarization layer is not necessarily provided when not needed.

The transistors 701, 705, and 706 each include a conductive layer 721 part of which functions as a gate, conductive layers 722 part of which functions as a source and a drain, and a semiconductor layer 731. Here, a plurality of layers obtained by processing the same film are shown with the same hatching pattern.

The liquid crystal element 510 is a reflective liquid crystal element. The liquid crystal element 510 has a stacked structure of a conductive layer 530a, liquid crystal 612, and a conductive layer 613. A conductive layer 530b which reflects visible light is provided in contact with the surface of the conductive layer 530a that faces the substrate 551. The conductive layer 530b includes the opening 540. The conductive layers 530a and 613 contain a material transmitting visible light. In addition, an alignment film 633a is provided between the liquid crystal 612 and the conductive layer 530a, and the alignment film 633b is provided between the liquid crystal 612 and the conductive layer 613. A polarizing plate 630 is provided on an outer surface of the substrate 561.

In the liquid crystal element 510, the conductive layer 530b has a function of reflecting visible light, and the conductive layer 613 has a function of transmitting visible light. Light entering from the substrate 561 side is polarized by the polarizing plate 630, passes through the conductive layer 613 and the liquid crystal 612, and is reflected by the conductive layer 530b. Then, the light passes through the liquid crystal 612 and the conductive layer 613 again and reaches the polarizing plate 630. In that case, alignment of the liquid crystal is controlled with a voltage that is applied between the conductive layer 530b and the conductive layer 613, and thus, optical modulation of light can be controlled. That is, the intensity of light emitted through the polarizing plate 630 can be controlled. In addition, when light excluding light in a particular wavelength region is absorbed by the coloring layer 631, emitted light is red light, for example.

The light-emitting element 520 is a bottom-emission light-emitting element. The light-emitting element 520 has a structure in which a conductive layer 691, an EL layer 692, and a conductive layer 693b are stacked in this order from the insulating layer 720 side. In addition, a conductive layer 693a is provided to cover the conductive layer 693b. The conductive layer 693b contains a material reflecting visible light, and the conductive layers 691 and 693a contain a material transmitting visible light. Light is emitted from the light-emitting element 520 to the substrate 561 side through the coloring layer 634, the insulating layer 720, the opening 540, the conductive layer 613, and the like.

Here, as illustrated in FIG. 21, the conductive layer 530a transmitting visible light is preferably provided in the opening 540. Accordingly, the liquid crystal 612 is aligned in a region overlapping with the opening 540 as well as in the other regions, in which case an alignment defect of the liquid crystal is prevented from being generated in the boundary portion of these regions and undesired light leakage can be suppressed.

As the polarizing plate 630 provided on an outer surface of the substrate 561, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 510 are controlled depending on the kind of the polarizing plate so that a desirable contrast is obtained.

An insulating layer 717 is provided on the insulating layer 716 covering an end portion of the conductive layer 691. The insulating layer 717 has a function as a spacer for preventing the insulating layer 720 and the substrate 551 from getting closer more than necessary. In addition, in the case where the EL layer 692 or the conductive layer 693a is formed using a blocking mask (metal mask), the insulating layer 717 may have a function of preventing the blocking mask from being in contact with a surface on which the EL layer 692 or the conductive layer 693a is formed. Note that the insulating layer 717 is not necessarily provided when not needed.

One of a source and a drain of the transistor 705 is connected to the conductive layer 691 of the light-emitting element 520 through a conductive layer 724.

One of a source and a drain of the transistor 706 is connected to the conductive layer 530b through a connection portion 707. The conductive layers 530b and 530a are in contact with and connected to each other. Here, in the connection portion 707, the conductive layers provided on both surfaces of the insulating layer 720 are connected to each other through openings in the insulating layer 720.

A connection portion 704 is provided in a region where the substrates 551 and 561 do not overlap with each other. The connection portion 704 is connected to the FPC 572 through a connection layer 742. The connection portion 704 has a structure similar to that of the connection portion 707. On the top surface of the connection portion 704, a conductive layer obtained by processing the same conductive film as the conductive layer 530a is exposed. Thus, the connection portion 704 and the FPC 572 can be connected to each other through the connection layer 742.

A connection portion 752 is provided in part of a region where the adhesive layer 641 is provided. In the connection portion 752, the conductive layer obtained by processing the same conductive film as the conductive layer 530a is connected to part of the conductive layer 613 with a connector 743. Accordingly, a signal or a potential input from the FPC 572 connected to the substrate 551 side can be supplied to the conductive layer 613 formed on the substrate 561 side through the connection portion 752.

As the connector 743, a conductive particle can be used, for example. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. As the connector 743, a material capable of elastic deformation or plastic deformation is preferably used. As illustrated in FIG. 21, the connector 743 which is the conductive particle has a shape that is vertically crushed in some cases. With the crushed shape, the contact area between the connector 743 and a conductive layer electrically connected to the connector 743 can be increased, thereby reducing contact resistance and suppressing the generation of problems such as disconnection.

The connector 743 is preferably provided so as to be covered with the adhesive layer 641. For example, the connectors 743 may be dispersed in the adhesive layer 641 before curing of the adhesive layer 641.

FIG. 21 illustrates an example of the circuit 564 in which the transistor 701 is provided.

The structure in which the semiconductor layer 731 where a channel is formed is provided between a pair of gates is used as an example of the transistors 701 and 705 in FIG. 21. One gate is formed with the conductive layer 721, and the other gate is formed with a conductive layer 723 overlapping with the semiconductor layer 731 with the insulating layer 712 provided therebetween. Such a structure enables control of threshold voltages of the transistors. In that case, the two gates may be connected to each other and supplied with the same signal to operate the transistors. Such transistors can have a higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of increase in size or definition.

Note that the transistor included in the circuit 564 and the transistor included in the display region 562 may have the same structure. A plurality of transistors included in the circuit 564 may have the same structure or different structures. A plurality of transistors included in the display region 562 may have the same structure or different structures.

A material through which impurities such as water or hydrogen do not easily diffuse is preferably used for at least one of the insulating layers 712 and 713 which cover the transistors. That is, the insulating layer 712 or the insulating layer 713 can function as a barrier film. Such a structure can effectively suppress diffusion of the impurities into the transistors from the outside, and a highly reliable display device can be achieved.

The insulating layer 621 is provided on the substrate 561 side to cover the coloring layer 631 and the light-blocking layer 632. The insulating layer 621 may have a function of a planarization layer. The insulating layer 621 enables the conductive layer 613 to have an almost flat surface, resulting in a uniform alignment state of the liquid crystal 612.

An example of a method for manufacturing the display device 500 is described. For example, the conductive layer 530*a*, the conductive layer 530*b*, and the insulating layer 720 are formed in order over a support substrate provided with a separation layer, and the transistor 705, the transistor 706, the light-emitting element 520, and the like are formed. Then, the substrate 551 and the support substrate are bonded with the adhesive layer 642. After that, separation is made to occur at the interface between the separation layer and each of the insulating layer 720 and the conductive layer 530*a*, whereby the support substrate and the separation layer are removed. Separately, the coloring layer 631, the light-blocking layer 632, the conductive layer 613, and the like are formed over the substrate 561 in advance. Then, the liquid crystal 612 is dropped onto the substrate 551 or 561 and the substrates 551 and 561 are bonded with the adhesive layer 641, whereby the display device 500 can be manufactured.

A material for the separation layer can be selected as appropriate such that separation at the interface with the insulating layer 720 and the conductive layer 530*a* occurs. In particular, it is preferable that a stacked layer of a layer including a high-melting-point metal material, such as tungsten, and a layer including an oxide of the metal material be used as the separation layer, and a stacked layer of a plurality of layers, such as a silicon nitride layer, a silicon oxynitride layer, and a silicon nitride oxide layer, be used as the insulating layer 720 over the separation layer. The use of the high-melting-point metal material for the separation layer can increase the formation temperature of a layer formed in a later step, which reduces the impurity concentration and achieves a highly reliable display device.

A metal oxide, a metal nitride, or the like is preferably used for the conductive layer 530*a*. In the case of using a metal oxide, a material in which at least one of the concentrations of hydrogen, boron, phosphorus, nitrogen, and other impurities and the number of oxygen vacancies is made to be higher than those in the semiconductor layer of the transistor is used for the conductive layer 530*a*.

The above components will be described below.

[Substrate]

A material having a flat surface can be used as the substrate included in the display device. The substrate through which light emitted from the display element is extracted is formed using a material that transmits the light. For example, a material such as glass, quartz, ceramics, sapphire, or an organic resin can be used.

The weight and thickness of the display device can be decreased by using a thin substrate. Furthermore, a flexible display device can be obtained by using a substrate that is thin enough to have flexibility.

Since the substrate through which light emission is not extracted does not need to have a light-transmitting property, a metal substrate or the like can be used in addition to the above-mentioned substrates. A metal substrate, which has high thermal conductivity, is preferable because it can easily conduct heat to the whole substrate and accordingly can prevent a local temperature rise in the display device. To obtain flexibility or bendability, the thickness of a metal substrate is preferably greater than or equal to 10 μm and less than or equal to 200 μm, more preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is preferable to use a substrate subjected to insulation treatment, e.g., a metal substrate whose surface is oxidized or provided with an insulating film. The insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

Examples of a material having flexibility and a light-transmitting property with respect to visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE) resin. In particular, a material whose thermal expansion coefficient is low is preferred, and for example, a polyamide imide resin, a polyimide resin, or PET with a thermal expansion coefficient of $30 \times 10^{-6}$/K or less can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus, a display device using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, and the like can be given. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against breaking due to bending or local pressure can be increased.

Alternatively, glass, metal, or the like that is thin enough to have flexibility can be used as the substrate. Alternatively, a composite material in which glass and a resin material are attached to each other with an adhesive layer may be used.

A hard coat layer (e.g., a silicon nitride layer and an aluminum oxide layer) by which a surface of a display device is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. In particular, when a glass layer is used, a barrier property against water and oxygen can be improved, and thus, a highly reliable display device can be provided.

[Transistor]

The transistors each include a conductive layer functioning as the gate electrode, the semiconductor layer, a conductive layer functioning as the source electrode, a conductive layer functioning as the drain electrode, and an insulating layer functioning as the gate insulating layer. In the above, a bottom-gate transistor is used.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistor, and an amorphous semiconductor or a semiconductor having crystallinity (a microcrystalline semiconductor, a polycrystalline semiconductor, a single crystal semiconductor, or a semiconductor partly including crystal regions) may be used. A semiconductor having crystallinity is preferably used, in which case deterioration of the transistor characteristics can be suppressed.

As a semiconductor material used for the transistor, an element of Group 14 (e.g., silicon or germanium) or a metal oxide can be used, for example. A semiconductor containing silicon, a semiconductor containing gallium arsenide, a metal oxide containing indium, or the like can be typically used.

In particular, a metal oxide having a wider band gap than silicon is preferably used. A semiconductor material having a wider band gap and a lower carrier density than silicon is preferably used because the off-state current of the transistor can be reduced.

A transistor with a metal oxide whose band gap is wider than that of silicon can hold charge stored in a capacitor that is series-connected to the transistor for a long time, owing to a low off-state current of the transistor. The use of such a transistor in pixels allows a driver circuit to stop while the gray level of an image displayed in display regions is maintained. As a result, a display device with an extremely low power consumption can be obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electric characteristics of the transistor including the semiconductor layer, the semiconductor layer preferably contains a stabilizer in addition to the above.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As a metal oxide included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Furthermore, a metal element in addition to In, Ga, and Zn may be contained.

The semiconductor layer and the conductive layer may include the same metal elements contained in the above oxides. The use of the same metal elements for the semiconductor layer and the conductive layer can reduce the manufacturing cost. For example, the use of metal oxide targets with the same metal composition can reduce the manufacturing cost. In addition, the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the metal oxide included in the semiconductor layer is greater than or equal to 2 eV, preferably greater than or equal to 2.5 eV, more preferably greater than or equal to 3 eV. With the use of a metal oxide having such a wide energy gap, the off-state current of the transistor can be reduced.

In the case where the metal oxide contained in the semiconductor layer contains an In-M-Zn-based oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of metal elements in the formed semiconductor layer varies from the above atomic ratio of metal elements of the sputtering target within a range of ±40% as an error.

A metal oxide with a low carrier density is preferably used for the semiconductor layer. For example, the semiconductor layer is a metal oxide whose carrier density is lower than or equal to $1\times10^{17}/cm^3$, preferably lower than or equal to $1\times10^{15}/cm^3$, more preferably lower than or equal to $1\times10^{13}/cm^3$, more preferably lower than or equal to $1\times10^{11}/cm^3$, more preferably lower than $1\times10^{10}/cm^3$, and higher than or equal to $1\times10^{-9}/cm^3$. Such a semiconductor layer has a low impurity concentration and a low density of defect states and thus has stable characteristics.

Note that without limitation to the compositions and materials described above, a material with an appropriate composition can be used depending on required semiconductor characteristics and electric characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the metal oxide contained in the semiconductor layer, oxygen vacancies are increased in the semiconductor layer, and the semiconductor layer might become n-type. Thus, the concentration of silicon or carbon (measured by secondary ion mass spectrometry) in the semiconductor layer is preferably lower than or equal to $2\times10^{18}$ atoms/cm$^3$, more preferably lower than or equal to $2\times10^{17}$ atoms/cm$^3$.

An alkali metal and an alkaline earth metal might generate carriers when bonded to a metal oxide, in which case the off-state current of the transistor might be increased. Therefore, the concentration of an alkali metal or alkaline earth metal of the semiconductor layer, which is measured by secondary ion mass spectrometry, is preferably lower than or equal to $1\times10^{18}$ atoms/cm$^3$, more preferably lower than or equal to $2\times10^{16}$ atoms/cm$^3$.

The semiconductor layer may have a non-single-crystal structure, for example. Non-single-crystal structures include a polycrystalline structure, a microcrystalline structure, and an amorphous structure, for example. Among the non-single-crystal structure, the amorphous structure has the highest density of defect states.

A metal oxide having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, and a region having a single crystal structure. The mixed film has, for example, a single-layer structure or a stacked-layer structure including two or more of the above regions in some cases.

Alternatively, silicon is preferably used as a semiconductor in which a channel of the transistor is formed. Silicon may be amorphous silicon but is preferably silicon having crystallinity, such as microcrystalline silicon, polycrystalline silicon, or single crystal silicon. In particular, polycrystalline silicon can be formed at a lower temperature than single crystal silicon and has a higher field-effect mobility and higher reliability than amorphous silicon. The use of such a polycrystalline semiconductor in pixels increases the aperture ratio of the pixels. Even in the case where the display portion with an extremely high definition is provided, a driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single crystal silicon, or the like is particularly preferable.

[Conductive Layer]

As materials for a gate, a source, and a drain of a transistor, and a conductive layer such as a wiring or an electrode included in a display device, any of metals such as aluminum, titanium, chromium, nickel, copper, yttrium, zirconium, molybdenum, silver, tantalum, and tungsten, an alloy containing any of these metals as its main component, or the like can be used. A single layer structure or stacked-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of the shape by etching is increased.

As a light-transmitting conductive material, a conductive oxide such as indium oxide, indium tin oxide, indium zinc oxide, zinc oxide, or zinc oxide to which gallium is added, or graphene can be used. It is also possible to use a metal material such as gold, silver, platinum, magnesium, nickel, tungsten, chromium, molybdenum, iron, cobalt, copper, palladium, or titanium; an alloy material containing any of these metal materials; or a nitride of the metal material (e.g., titanium nitride). In the case of using the metal material or the alloy material (or the nitride thereof), the film thickness is set small enough to transmit light. Alternatively, a stacked film of any of the above materials can be used for the conductive layers. For example, a stacked film of indium tin oxide and an alloy of silver and magnesium is preferably used because the conductivity can be increased. They can also be used for conductive layers such as a variety of wirings and electrodes included in a display device, and conductive layers (e.g., conductive layers serving as a pixel electrode or a common electrode) included in a display element.

[Insulating Layer]

Examples of an insulating material that can be used for the insulating layers include a resin such as an acrylic or epoxy resin, a resin having a siloxane bond such as silicone, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be prevented.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the water vapor transmission rate of the insulating film with low water permeability is lower than or equal to $1\times10^{-5}$ [g/(m$^2$·day)], preferably lower than or equal to $1\times10^{-6}$ [g/(m$^2$·day)], more preferably lower than or equal to $1\times10^{-7}$ [g/(m$^2$·day)], more preferably lower than or equal to $1\times10^{-8}$ [g/(m$^2$·day)].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be used.

The liquid crystal element controls transmission or non-transmission of light utilizing an optical modulation action of liquid crystal. The optical modulation action of liquid crystal is controlled by an electric field applied to the liquid crystal (including a horizontal electric field, a vertical electric field, and a diagonal electric field). As the liquid crystal used for the liquid crystal element, thermotropic liquid crystal, low-molecular liquid crystal, high-molecular liquid crystal, polymer dispersed liquid crystal (PDLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either a positive liquid crystal or a negative liquid crystal may be used, and an appropriate liquid crystal material can be used depending on the mode or design to be used.

An alignment film can be provided to adjust the alignment of liquid crystal. In the case where a horizontal electric field mode is employed, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy. In addition, the liquid crystal composition that includes liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

The liquid crystal element may be a transmissive liquid crystal element, a reflective liquid crystal element, a transflective liquid crystal element, or the like. In one embodiment of the present invention, in particular, the reflective liquid crystal element is preferably used.

In the case where a transmissive or transflective liquid crystal element is used, two polarizing plates are provided such that a pair of substrates are sandwiched therebetween. Furthermore, a backlight is provided on the outer side of the polarizing plate. As the backlight, a direct-below backlight or an edge-light type backlight may be used. The direct-below backlight including a light-emitting diode (LED) is preferably used because local dimming is easily performed to improve the contrast. The edge-light type backlight is preferably used because the thickness of a module including the backlight can be reduced.

In the case where a reflective liquid crystal element is used, a polarizing plate is provided on a display surface. In addition, a light diffusion plate is preferably provided on the display surface to improve the visibility.

In the case where the reflective or the transflective liquid crystal element is used, a front light may be provided outside the polarizing plate. As the front light, an edge-light type front light is preferably used. A front light including a light-emitting diode (LED) is preferably used to reduce the power consumption.

[Light-Emitting Element]

The light-emitting element has a top emission structure, a bottom emission structure, a dual emission structure, or the like. A conductive film that transmits visible light is used as the electrode through which light is extracted. A conductive film that reflects visible light is preferably used as the electrode through which light is not extracted. In one embodiment of the present invention, in particular, a bottom-emission light-emitting element is preferably used.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, either a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., greater than or equal to 350 nm and less than or equal to 750 nm). An emission spectrum of a material emitting light having a peak in a yellow wavelength range preferably includes spectral components also in green and red wavelength ranges.

More preferably, a light-emitting layer containing a light-emitting material emitting light of one color and a light-emitting layer containing a light-emitting material emitting light of another color are stacked in the EL layer. For example, the plurality of light-emitting layers in the EL layer may be stacked in contact with each other or may be stacked with a region which does not include any light-emitting material therebetween. For example, between a fluorescent layer and a phosphorescent layer, a region containing the same material as one in the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be formed thin so as to have a light-transmitting property. Alternatively, a stacked film of any of the above materials can be used for the conductive layers. For example, a stacked film of indium tin oxide and an alloy of silver and magnesium is preferably used, in which case the conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Furthermore, lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, a quantum dot used for the light-emitting layer can function as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Adhesive Layer]

As the adhesive layers, a variety of curable adhesives such as a reactive curable adhesive, a thermosetting adhesive, an anaerobic adhesive, and a photo-curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component type resin may be used. Still alternatively, an adhesive sheet or the like may be used.

Furthermore, the resin may include a drying agent. For example, a substance that adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display device.

In addition, it is preferable to mix a filler with a high refractive index or a light-scattering member into the resin, in which case the light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

As examples of a material that can be used for the coloring layers, a metal material, a resin material, and a resin material containing a pigment or dye can be given.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of the components.

[Example of Manufacturing Method]

Next, a manufacturing method example of a display device using a flexible substrate is described.

Here, layers including a display element, a circuit, a wiring, an electrode, optical members such as a coloring layer and a light-blocking layer, an insulating layer, and the like, are collectively referred to as an element layer. The element layer includes, for example, a display element, and may additionally include a wiring electrically connected to the display element or an element such as a transistor used in a pixel or a circuit.

In addition, here, a flexible member which supports the element layer at a stage at which the display element is completed (the manufacturing process is finished) is referred to as a substrate. For example, a substrate includes an extremely thin film with a thickness greater than or equal to 10 nm and less than or equal to 300 μm and the like.

As a method for forming an element layer over a flexible substrate provided with an insulating surface, typically, there are two methods shown below. One of them is to directly form an element layer over the substrate. The other method is to form an element layer over a supporting base that is different from the substrate and then to separate the element layer from the supporting base to be transferred to the substrate. Although not described in detail here, in addition to the above two methods, there is a method in which the element layer is formed over a substrate which does not have flexibility and the substrate is thinned by polishing or the like to have flexibility.

In the case where a material of the substrate can withstand heating temperature in a process for forming the element layer, it is preferable that the element layer be formed directly over the substrate, in which case the manufacturing process can be simplified. In that case, the element layer is preferably formed in a state where the substrate is fixed to the supporting base, in which case transfer thereof in an apparatus and between apparatuses can be easy.

In the case of employing the method in which the element layer is formed over the supporting base and then transferred to the substrate, first, a separation layer and an insulating layer are stacked over the supporting base, and then, the element layer is formed over the insulating layer. Next, the element layer is separated from the supporting base and then transferred to the substrate. In that case, a material is selected that would cause separation at the interface between the supporting base and the separation layer, at the interface between the separation layer and the insulating layer, or in the separation layer. In the method, it is preferred that a material having high heat resistance be used for the supporting base or the separation layer, in which case the upper limit of the temperature applied when the element layer is formed can be higher, and an element layer including a more reliable element can be formed.

For example, it is preferable that a stack of a layer containing a high-melting-point metal material, such as tungsten, and a layer containing an oxide of the metal material be used as the separation layer, and a stack of a plurality of layers, such as a silicon oxide layer, a silicon nitride layer, a silicon oxynitride layer, and a silicon nitride oxide layer be used as the insulating layer over the separation layer. Note that in this specification, oxynitride contains more oxygen than nitrogen, and nitride oxide contains more nitrogen than oxygen.

The element layer and the supporting base can be separated by applying mechanical power, by etching the separation layer, by injecting a liquid into the separation interface, or the like. Alternatively, separation may be performed by heating or cooling two layers of the separation interface by utilizing a difference in thermal expansion coefficient.

The separation layer is not necessarily provided in the case where separation can occur at the interface between the supporting base and the insulating layer.

For example, glass and an organic resin such as polyimide can be used as the supporting base and the insulating layer, respectively. In that case, a separation trigger may be formed by, for example, locally heating part of the organic resin with laser light or the like, or by physically cutting part of or making a hole through the organic resin with a sharp tool, so that separation may be performed at the interface between the glass and the organic resin.

Alternatively, a heat-generation layer may be provided between the supporting base and the insulating layer formed of an organic resin, and separation may be performed at the interface between the heat-generation layer and the insulating layer by heating the heat-generation layer. The heat-generation layer can be formed using a variety of materials such as a material that generates heat when current flows therethrough, a material that generates heat by absorbing light, or a material that generates heat when a magnetic field is applied thereto. For example, a semiconductor, a metal, or an insulator can be selected for the heat-generation layer.

In the aforementioned methods, the insulating layer formed of an organic resin can be used as a substrate after the separation.

The above is the description of a manufacturing method of a flexible display device.

This embodiment can be combined with any of the other embodiments as appropriate.

Embodiment 5

In this embodiment, a structure example of an OS transistor that can be used in the above embodiment will be described.

<Structure Example of Transistor>

Figure 22A:
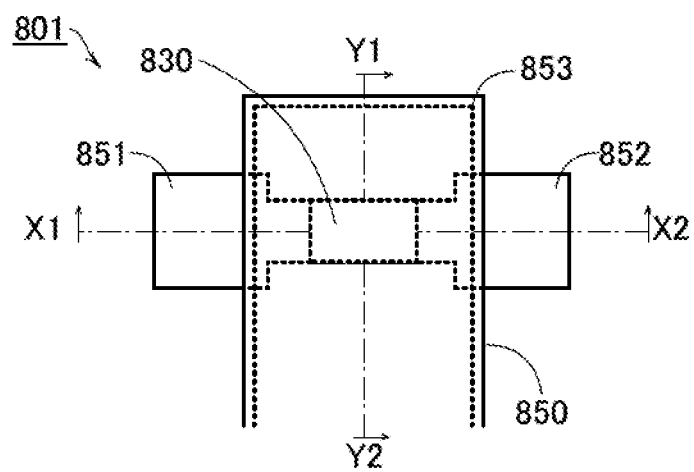
FIGS. 22A to 22C illustrate a structure example of a transistor.
Figures 22B, 22C:
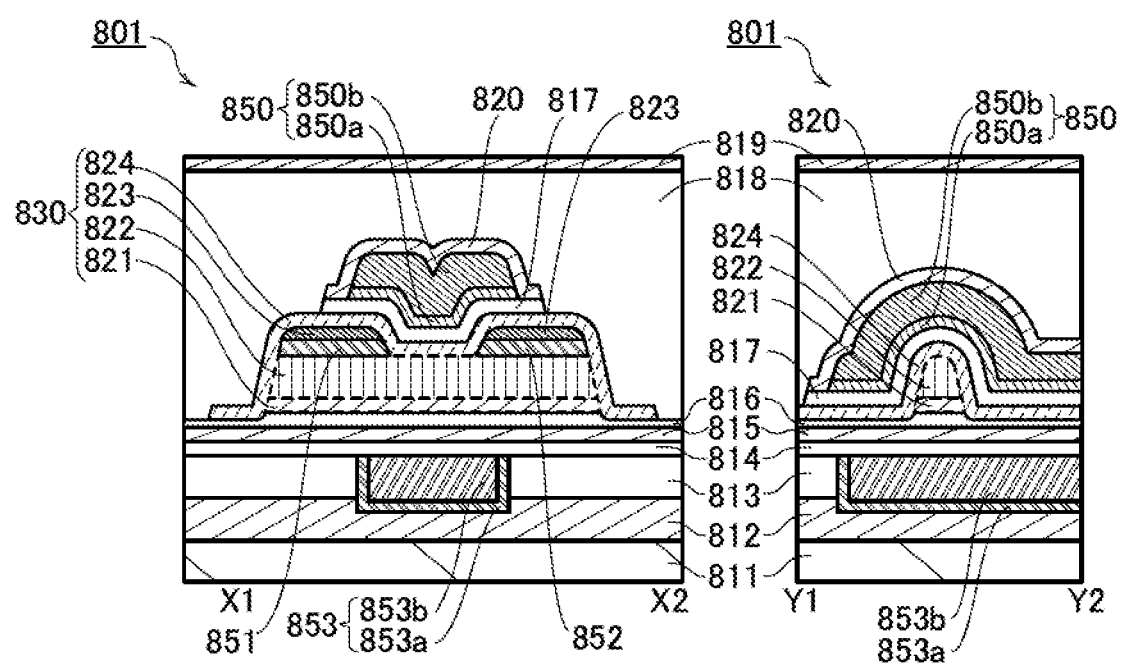

FIG. 22A is a top view illustrating a structure example of a transistor. FIG. 22B is a cross-sectional view taken along line X1-X2 in FIG. 22A. FIG. 22C is a cross-sectional view taken along line Y1-Y2 in FIG. 22A. In some cases, the direction of line X1-X2 is referred to as a channel length direction, and the direction of line Y1-Y2 is referred to as a channel width direction. FIG. 22B illustrates a cross-sectional structure of the transistor in the channel length direction, and FIG. 22C illustrates a cross-sectional structure of the transistor in the channel width direction. Note that to clarify the device structure, FIG. 22A does not illustrate some components.

The semiconductor device of one embodiment of the present invention includes insulating layers 812 to 820, metal oxide films 821 to 824, and conductive layers 850 to 853. A transistor 801 is formed over an insulating surface. FIGS. 22A to 22C illustrate the case where the transistor 801 is formed over an insulating layer 811. The transistor 801 is covered with the insulating layer 818 and the insulating layer 819.

Note that the insulating layers, the metal oxide films, the conductive layers, and the like that constitute the transistor 801 may each be a single film, or a stack including a plurality of films. They can be formed by any of a variety of deposition methods such as a sputtering method, a molecular beam epitaxy (MBE) method, a pulsed laser ablation (PLA) method, a CVD method, and an atomic layer deposition (ALD) method. Note that examples of CVD methods include a plasma-enhanced CVD method, a thermal CVD method, and a metal organic CVD method.

The conductive layer 850 includes a region that functions as a gate electrode of the transistor 801. The conductive layer 851 and the conductive layer 852 include regions that function as a source electrode and a drain electrode. The conductive layer 853 includes a region that functions as a back gate electrode. The insulating layer 817 includes a region that functions as a gate insulating layer on the gate electrode (front gate electrode) side, and an insulating layer that is a stack of the insulating layers 814 to 816 includes a region that functions as a gate insulating layer on the back gate electrode side. The insulating layer 818 functions as an interlayer insulating layer. The insulating layer 819 functions as a barrier layer.

The metal oxide films 821 to 824 are collectively referred to as an oxide layer 830. As illustrated in FIGS. 22B and 22C, the oxide layer 830 includes a region where the metal oxide film 821, the metal oxide film 822, and the metal oxide film 824 are stacked in this order. In addition, a pair of metal oxide films 823 are positioned over the conductive layer 851 and the conductive layer 852. When the transistor 801 is on, a channel formation region is mainly formed in the metal oxide film 822 of the oxide layer 830.

The metal oxide film 824 covers the metal oxide films 821 to 823, the conductive layer 851, and the conductive layer 852. The insulating layer 817 is positioned between the metal oxide film 823 and the conductive layer 850. The conductive layers 851 and 852 each include a region that overlaps with the conductive layer 850 with the metal oxide film 823, the metal oxide film 824, and the insulating layer 817 positioned therebetween.

The conductive layers 851 and 852 are formed from a hard mask that is used in the formation of the metal oxide films 821 and 822. Thus, the conductive layers 851 and 852 do not include a region that is in contact with the side surfaces of the metal oxide films 821 and 822. For example, the metal oxide films 821 and 822 and the conductive layers 851 and 852 can be formed through the following steps. First, a conductive film is formed over a metal oxide film including a stack of two layers. The conductive film is processed (etched) into a desired shape so that a hard mask is formed. The hard mask is used to process the shape of the two-layered metal oxide film, forming the metal oxide films 821 and 822 that are stacked. Next, the hard mask is processed into a desired shape, forming the conductive layers 851 and 852.

Examples of an insulating material used for the insulating layers 811 to 818 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 811 to 818 are formed using a single-layer structure or a stacked-layer structure containing any of these insulating materials. The layers used for the insulating layers 811 to 818 may include a plurality of insulating materials.

In this specification and the like, oxynitride refers to a compound in which the oxygen content is higher than the nitrogen content, and nitride oxide refers to a compound in which the nitrogen content is higher than the oxygen content.

In order to suppress an increase in oxygen vacancies in the oxide layer 830, the insulating layers 816 to 818 preferably contain oxygen. More preferably, the insulating layers 816 to 818 are formed using an insulating film from which oxygen is released by heating (hereinafter such an insulating film is also referred to as an insulating film containing excess oxygen). When oxygen is supplied from the insulating film containing excess oxygen to the oxide layer 830, the oxygen vacancies in the oxide layer 830 can be compensated. Thus, the reliability and electric characteristics of the transistor 801 can be improved.

The insulating layer containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ molecules/cm$^3$.

The insulating film containing excess oxygen can be formed by performing treatment for adding oxygen to an insulating film. The treatment for adding oxygen can be performed by heat treatment under an oxygen atmosphere, an ion implantation method, an ion doping method, a plasma immersion ion implantation method, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 812 to 819 is preferably low in order to prevent an increase in the concentration of hydrogen in the oxide layer 830. In particular, the concentration of hydrogen in the insulating layers 813 to 818 is preferably low. Specifically, the concentration of hydrogen is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, more preferably lower than or equal to $5 \times 10^{18}$ atoms/cm$^3$.

The hydrogen concentration is measured by secondary ion mass spectrometry (SIMS).

In the transistor 801, the oxide layer 830 is preferably surrounded by an insulating layer with oxygen and hydrogen barrier properties (hereinafter such an insulating layer is also referred to as a barrier layer). The use of such a structure prevents release of oxygen from the oxide layer 830 and entry of hydrogen into the oxide layer 830. Thus, the reliability and electric characteristics of the transistor 801 can be improved.

For example, the insulating layer 819 functions as a barrier layer and at least one of the insulating layers 811, 812, and 814 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

A structure example of the insulating layers 811 to 818 is described. In this example, each of the insulating layers 811, 812, 815, and 819 functions as a barrier layer. The insulating layers 816 to 818 are oxide layers containing excess oxygen. The insulating layer 811 is formed using silicon nitride. The insulating layer 812 is formed using aluminum oxide. The insulating layer 813 is formed using silicon oxynitride. The insulating layers 814 to 816 functioning as the gate insulating layers on the back gate electrode side are formed using a stack including silicon oxide, aluminum oxide, and silicon oxide. The insulating layer 817 functioning as the gate insulating layer on the front gate side is formed using silicon oxynitride. The insulating layer 818 functioning as the interlayer insulating layer is formed using silicon oxide. The insulating layer 819 is formed using aluminum oxide.

Examples of a conductive material used for the conductive layers 850 to 853 include a metal such as molybdenum, titanium, tantalum, tungsten, aluminum, copper, chromium, neodymium, or scandium; and a metal nitride containing any of the above metals as its component (e.g., tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

A structure example of the conductive layers 850 to 853 is described. The conductive layer 850 is a single layer of tantalum nitride or tungsten. Alternatively, the conductive layer 850 is a stack including tantalum nitride, tantalum, and tantalum nitride (conductive layers 850a and 850b). The conductive layer 851 is formed with a single layer of tantalum nitride, or a stack including tantalum nitride and tungsten. The structure of the conductive layer 852 is the same as that of the conductive layer 851. The conductive layer 853 is formed using tantalum nitride. Alternatively, the conductive layer 853 is a stack including tantalum nitride and tungsten (conductive layers 853a and 853b).

In order to reduce the off-state current of the transistor 801, for example, the energy gap of the metal oxide film 822 is preferably large. The energy gap of the metal oxide film 822 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 830 preferably exhibits crystallinity. At least the metal oxide film 822 preferably exhibits crystallinity. With the structure described above, the transistor 801 can have high reliability and favorable electric characteristics.

As the oxide of the metal oxide film 822, for example, an In—Ga oxide, an In—Zn oxide, or an In-M-Zn oxide (M is Al, Ga, Y, or Sn) can be used. The metal oxide film 822 is not limited to the oxide layer containing indium. The metal oxide film 822 can be formed using a Zn—Sn oxide, a Ga—Sn oxide, or a Zn—Mg oxide, for example. The metal oxide films 821, 823, and 824 can be formed using an oxide that is similar to the oxide of the metal oxide film 822. In particular, each of the metal oxide films 821, 823 and 824 can be formed with a Ga oxide.

When an interface state is formed at the interface between the metal oxide film 822 and the metal oxide film 821, a channel formation region is formed also in the vicinity of the interface, which causes a change in the threshold voltage of the transistor 801. It is preferable that the metal oxide film 821 contain at least one of the metal elements contained in the metal oxide film 822 as its component. Accordingly, an interface state is unlikely to be formed at the interface between the metal oxide film 822 and the metal oxide film 821, and variations in the electric characteristics of the transistor 801, such as the threshold voltage, can be reduced.

The metal oxide film 824 preferably contains at least one of the metal elements contained in the metal oxide film 822 as its component because interface scattering is unlikely to occur at the interface between the metal oxide film 822 and the metal oxide film 824, and carrier transfer is not inhibited. Thus, the field-effect mobility of the transistor 801 can be increased.

It is preferable that the metal oxide film 822 have the highest carrier mobility among the metal oxide films 821 to 824. Accordingly, a channel can be formed in the metal oxide film 822 that is apart from the insulating layers 816 and 817.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as the metal oxide film, so that carrier mobility can be increased.

Thus, for example, the metal oxide film 822 is formed using an In—Ga—Zn oxide, and the metal oxide films 821, 823, and 824 are formed using a Ga oxide. For example, when the metal oxide films 821 to 824 are formed using an In-M-Zn oxide, the In content of the metal oxide film 822 is made higher than the In content of the metal oxide films 821, 823, and 824. In the case where the In-M-Zn oxide is formed by a sputtering method, the In content can be changed by a change in the atomic ratio of metal elements of a target.

For example, it is preferable that the atomic ratio of metal elements of a target used for depositing the metal oxide film 822 be In:M:Zn=1:1:1, 3:1:2, or 4:2:4.1. For example, it is preferable that the atomic ratio of metal elements of a target used for depositing the metal oxide films 821 and 823 be In:M:Zn=1:3:2, or 1:3:4. The atomic ratio of an In-M-Zn oxide deposited using a target of In:M:Zn=4:2:4.1 is approximately In:M:Zn=4:2:3.

In order that the transistor 801 have stable electric characteristics, it is preferable to reduce the concentration of impurities in the oxide layer 830. In the metal oxide, hydrogen, nitrogen, carbon, silicon, and a metal element other than a main component are impurities. For example, hydrogen and nitrogen form donor states to increase the carrier density. In addition, silicon and carbon form impurity states in the metal oxide. The impurity states serve as traps and might cause the electric characteristics of the transistor to deteriorate.

For example, the oxide layer 830 includes a region where the concentration of silicon is lower than or equal to $2 \times 10^{18}$ atoms/cm$^3$, preferably lower than or equal to $2 \times 10^{17}$ atoms/cm$^3$. The same applies to the concentration of carbon in the oxide layer 830.

The oxide layer 830 includes a region where the concentration of an alkali metal is lower than or equal to $1 \times 10^{18}$ atoms/cm$^3$, preferably lower than or equal to $2 \times 10^{16}$ atoms/cm$^3$. The same applies to the concentration of an alkaline earth metal in the oxide layer 830.

The oxide layer 830 includes a region where the concentration of hydrogen is lower than $1 \times 10^{20}$ atoms/cm$^3$, preferably lower than $1 \times 10^{19}$ atoms/cm$^3$, more preferably lower than $5 \times 10^{18}$ atoms/cm$^3$, more preferably lower than $1 \times 10^{18}$ atoms/cm$^3$.

The above concentrations of the impurities in the oxide layer 830 are measured by SIMS.

In the case where the metal oxide film 822 contains oxygen vacancies, donor states are formed by entry of hydrogen into sites of oxygen vacancies in some cases. The oxygen vacancy is a factor in decreasing the on-state current of the transistor 801. Note that sites of oxygen vacancies become more stable by entry of oxygen than by entry of hydrogen. Thus, by reducing oxygen vacancies in the metal oxide film 822, the on-state current of the transistor 801 can be increased in some cases. Consequently, preventing entry of hydrogen into sites of oxygen vacancies by a reduction in hydrogen in the metal oxide film 822 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the transistor 801 is likely to be normally-on when the metal oxide film 822 contains hydrogen because the metal oxide film 822 includes a channel formation region. Accordingly, it is preferable that hydrogen in the metal oxide film 822 be reduced as much as possible.

FIGS. 22A to 22C illustrate an example in which the oxide layer 830 has a four-layer structure; however, one embodiment of the present invention is not limited thereto. For example, the oxide layer 830 can have a three-layer structure without the metal oxide film 821 or without the metal oxide film 823. Alternatively, the oxide layer 830 may include one or more metal oxide films that are similar to the metal oxide films 821 to 824 at two or more of the following positions: between given layers in the oxide layer 830, over the oxide layer 830, and below the oxide layer 830.

Figure 23:
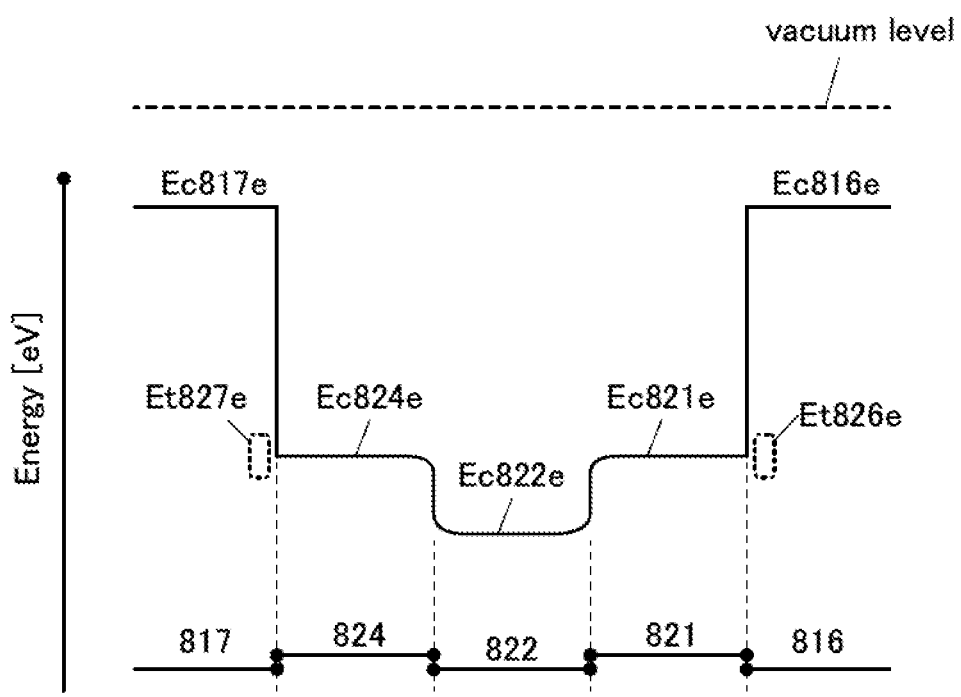
FIG. 23 shows an energy band structure.

Effects of the stack including the metal oxide films 821, 822, and 824 are described with reference to FIG. 23. FIG. 23 is a schematic diagram showing the energy band structure of a channel formation region of the transistor 801.

In FIG. 23, Ec816e, Ec821e, Ec822e, Ec824e, and Ec817e indicate the energy of the conduction band minimums of the insulating layer 816, the metal oxide film 821, the metal oxide film 822, the metal oxide film 824, and the insulating layer 817, respectively.

Here, the energy difference between the vacuum level and the conduction band minimum (the difference is also referred to as electron affinity) corresponds to a value obtained by subtracting an energy gap from the energy difference between the vacuum level and the valence band maximum (the difference is also referred to as an ionization potential). The energy gap can be measured using a spectroscopic ellipsometer (UT-300 manufactured by HORIBA JOBIN YVON S.A.S.). The energy difference between the vacuum level and the valence band maximum can be measured using an ultraviolet photoelectron spectroscopy (UPS) device (VersaProbe manufactured by ULVAC-PHI, Inc.).

Since the insulating layers 816 and 817 are insulators, Ec816e and Ec817e are closer to the vacuum level than Ec821e, Ec822e, and Ec824e (i.e., the insulating layers 816 and 817 have lower electron affinities than the metal oxide films 821, 822, and 824).

The metal oxide film 822 has a higher electron affinity than the metal oxide films 821 and 824. For example, the difference in electron affinity between the metal oxide films 822 and 821 and the difference in electron affinity between the metal oxide films 822 and 824 are each greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV. Note that the electron affinity refers to an energy difference between the vacuum level and the conduction band minimum.

When voltage is applied to the gate electrode (the conductive layer 850) of the transistor 801, a channel is mainly formed in the metal oxide film 822 having the highest electron affinity among the metal oxide films 821, 822, and 824.

An indium gallium oxide has a small electron affinity and a high oxygen-blocking property. Therefore, the metal oxide film 824 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide films 821 and 822 between the metal oxide films 821 and 822. Furthermore, in some cases, there is a mixed region of the metal oxide films 824 and 822 between the metal oxide films 824 and 822. Because the mixed region has a low interface state density, a region with a stack formed with the metal oxide films 821, 822, and 824 has a band structure where energy at each interface and in the vicinity of the interface is changed continuously (continuous junction).

Electrons transfer mainly through the metal oxide film 822 in the oxide layer 830 having such an energy band structure. Therefore, even when an interface state exists at the interface between the metal oxide film 821 and the insulating layer 816 or the interface between the metal oxide film 824 and the insulating layer 817, electron transfer in the oxide layer 830 is less likely to be inhibited and the on-state current of the transistor 801 can be increased.

Although trap states Et826e and Et827e due to impurities or defects might be formed in the vicinity of the interface between the metal oxide film 821 and the insulating layer 816 and the vicinity of the interface between the metal oxide film 824 and the insulating layer 817 as illustrated in FIG. 23, the metal oxide film 822 can be separated from the trap states Et826e and Et827e owing to the existence of the metal oxide films 821 and 824.

Note that when a difference between Ec821e and Ec822e is small, an electron in the metal oxide film 822 might reach the trap state Et826e by passing over the difference in energy. Since the electron is trapped at the trap state Et826e, negative fixed charge is generated at the interface with the insulating film, causing the threshold voltage of the transistor to be shifted in a positive direction. The same applies to the case where a difference in energy between Ec822e and Ec824e is small.

Each of the difference in energy between Ec821e and Ec822e and the difference in energy between Ec824e and Ec822e is preferably greater than or equal to 0.1 eV, more preferably greater than or equal to 0.15 eV so that a change in the threshold voltage of the transistor 801 can be reduced and the transistor 801 can have favorable electric characteristics.

Note that the transistor 801 does not necessarily include a back gate electrode.

<Example of Stacked-Layer Structure>

Next, a stacked-layer structure of an OS transistor and another transistor is described. A stacked-layer structure described below can be used for the various circuits described in any of the above embodiments.

Figure 24:
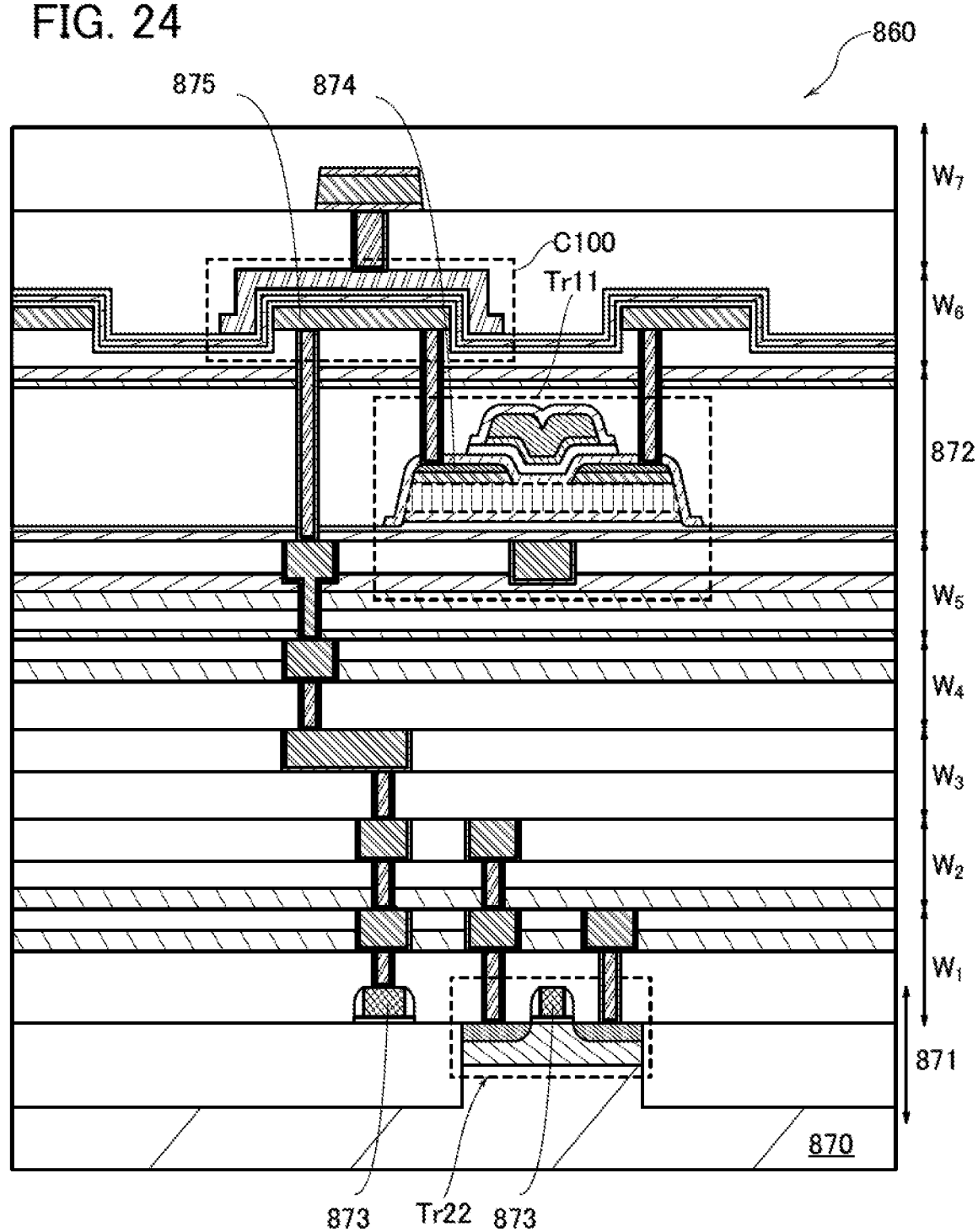
FIG. 24 illustrates a structure example of a circuit.

FIG. 24 illustrates an example of a stacked-layer structure of a circuit 860 in which a transistor Tr22 that is a Si Transistor, a transistor Tr11 that is an OS transistor, and a capacitor C100 are stacked.

A memory cell MC includes a stack including a CMOS layer 871, wiring layers $W_1$ to $W_5$, a transistor layer 872, and wiring layers $W_6$ and $W_7$.

The transistor Tr22 is provided in the CMOS layer 871. A channel formation region of the transistor Tr22 is provided in a single crystal silicon wafer 870. A gate electrode 873 of the transistor Tr22 is connected to one electrode 875 of the capacitor C100 through the wiring layers $W_1$ to $W_5$.

The transistor Tr11 is provided in the transistor layer 872. In FIG. 24, the transistor Tr11 has a structure similar to that of the transistor 801 (FIGS. 22A to 22C). An electrode 874 corresponding to one of a source and a drain of the transistor Tr11 is connected to the one electrode 875 of the capacitor C100. Note that in FIG. 24, the transistor Tr11 includes its back gate electrode in the wiring layer $W_5$. The capacitor C100 is formed in the wiring layer $W_6$.

The structure of the circuit 860 can be used, for example, in the case where the transistors other than the OS transistors in the circuits illustrated in FIGS. 11A and 11B, FIG. 12, FIGS. 13A and 13B, and FIGS. 15A to 15C are Si transistors. In the case where the stacked-layer structure in FIG. 24 is applied to the circuits illustrated in FIGS. 11A and 11B, FIG. 12, and FIGS. 13A and 13B and the circuit illustrated in FIGS. 15A to 15C, all the Si transistors can be formed through the same process; this also applies to the OS transistors and the capacitors. Accordingly, the PLD and the memory device can be fabricated at the same time.

The OS transistor and other components are stacked in this manner, whereby the area of the circuit can be reduced.

<Metal Oxide>

Next, a metal oxide that can be used in the OS transistor is described. In particular, the details of a metal oxide and a cloud-aligned composite (CAC)-OS are described below.

A CAC-OS or a CAC metal oxide has a conducting function in part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or CAC-metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size greater than or equal to 0.5 nm and less than or equal to 10 nm, preferably greater than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, the CAC-OS or the CAC-metal oxide can be called a matrix composite or a metal matrix composite.

The CAC-OS has, for example, a composition in which elements included in a metal oxide are unevenly distributed. The unevenly distributed elements each have a size greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, one or more of aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ (−1≤x0≤1; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different compositions is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and lower than 30%, more preferably higher than or equal to 0% and low than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or InO$_{X1}$ complement each other, whereby high on-state current (Ion) and high field-effect mobility (μ) can be achieved.

A semiconductor element including a CAC-OS has high reliability. Thus, the CAC-OS is suitably used in a variety of semiconductor devices.

This embodiment can be combined with any of the other embodiments as appropriate.

Embodiment 6

In this embodiment, a structure example of a display module including any of the display devices described in the above embodiments will be described.

Figure 25:
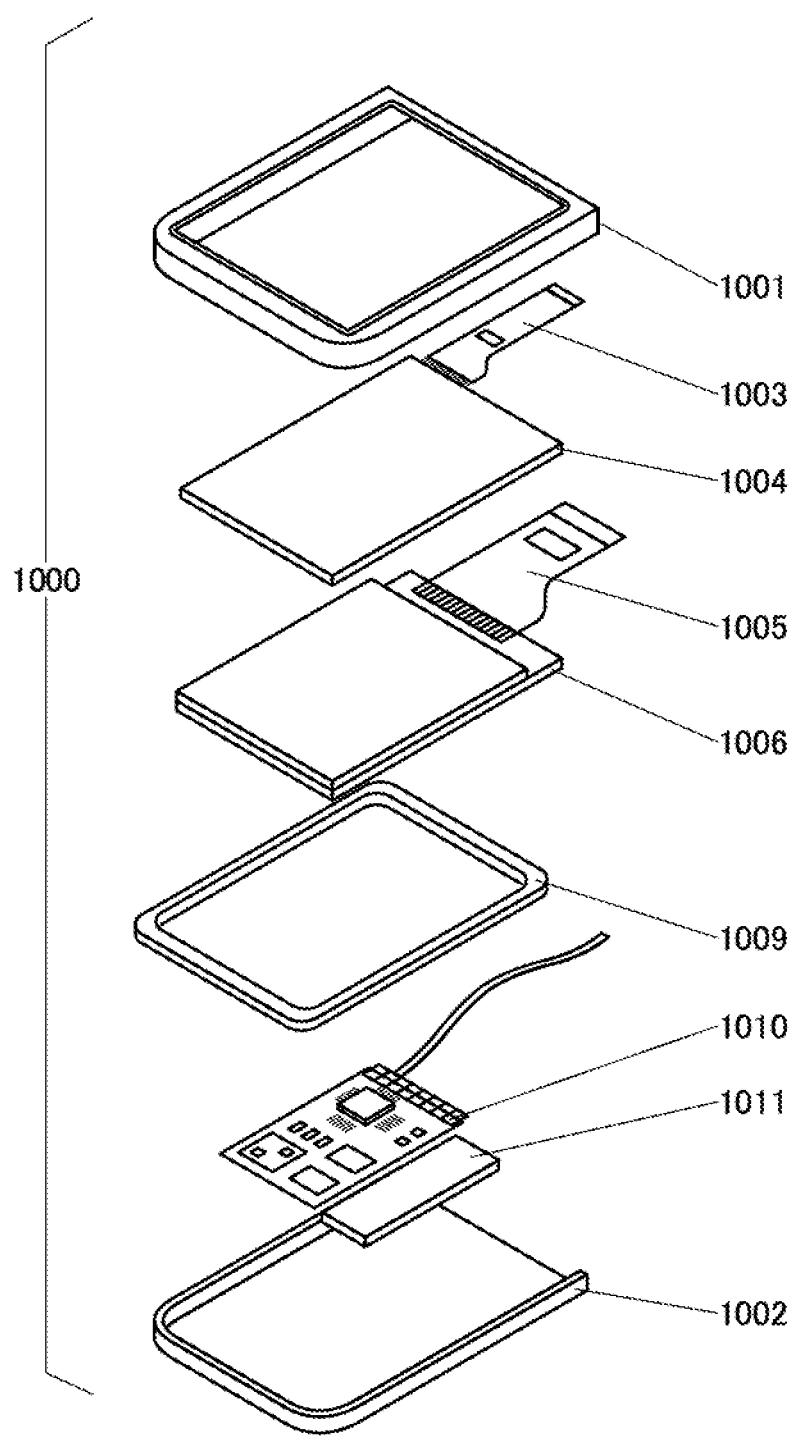
FIG. 25 illustrates a structure example of a display module.

In a display module 1000 illustrated in FIG. 25, a touch panel 1004 connected to an FPC 1003, a display device 1006 connected to an FPC 1005, a frame 1009, a printed circuit board 1010, and a battery 1011 are provided between an upper cover 1001 and a lower cover 1002.

The display device described in the above embodiment can be used as the display device 1006.

The shapes and sizes of the upper cover 1001 and the lower cover 1002 can be changed as appropriate in accordance with the sizes of the touch panel 1004 and the display device 1006.

The touch panel 1004 can be a resistive touch panel or a capacitive touch panel and may be formed to overlap with the display device 1006. Instead of providing the touch panel 1004, the display device 1006 can have a touch panel function.

The frame 1009 protects the display device 1006 and also functions as an electromagnetic shield for blocking electromagnetic waves generated by the operation of the printed circuit board 1010. The frame 1009 may also function as a radiator plate.

The printed circuit board 1010 is provided with a power supply circuit and a signal processing circuit for outputting a video signal and a clock signal. As a power source for supplying power to the power supply circuit, an external commercial power source or a power source using the battery 1011 provided separately may be used. The battery 1011 can be omitted in the case of using a commercial power source.

The display module 1000 may be additionally provided with a member such as a polarizing plate, a retardation plate, or a prism sheet.

This embodiment can be combined with any of the other embodiments as appropriate.

Embodiment 7

In this embodiment, electronic devices to which the display system of one embodiment of the present invention can be applied will be described.

The display device of one embodiment of the present invention can achieve high visibility regardless of the intensity of external light. Therefore, the display device of one embodiment of the present invention can be favorably used in portable electronic devices, wearable electronic devices (wearable devices), e-book readers, and the like. FIGS. 26A to 26D illustrate examples of an electronic device including the display device of one embodiment of the present invention.

Figure 26A:
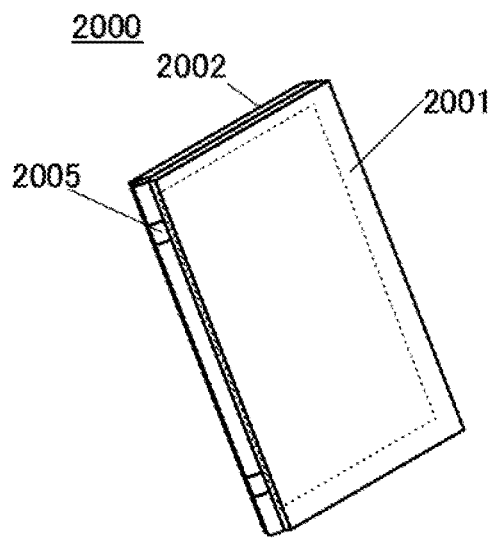
FIGS. 26A to 26D each illustrate a structure example of an electronic device.
Figure 26B:
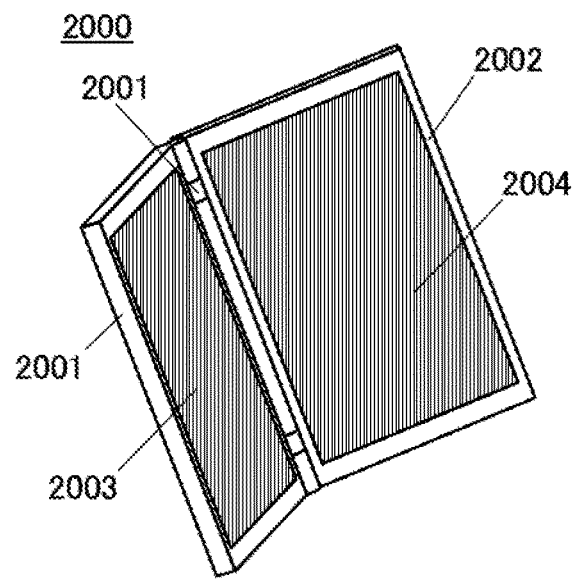

FIGS. 26A and 26B illustrate an example of a portable information terminal 2000. The portable information terminal 2000 includes a housing 2001, a housing 2002, a display portion 2003, a display portion 2004, a hinge portion 2005, and the like.

The housing 2001 and the housing 2002 are connected with the hinge portion 2005. The portable information terminal 2000 folded as in FIG. 26A can be changed into the state illustrated in FIG. 26B, in which the housing 2001 and the housing 2002 are opened.

For example, the portable information terminal 2000 can also be used as an e-book reader, in which the display portion 2003 and the display portion 2004 can each display text data. In addition, the display portion 2003 and the display portion 2004 can each display a still image or a moving image. Furthermore, the display portion 2003 may be provided with a touch panel.

In this manner, the portable information terminal 2000 has high versatility because it can be folded when carried.

Note that the housing 2001 and the housing 2002 may include a power switch, an operation button, an external connection port, a speaker, a microphone, and/or the like.

Note that the portable information terminal 2000 may have a function of identifying a character, a figure, or an image using a touch sensor provided in the display portion 2003. In that case, learning in the following mode becomes possible, for example: an answer is written with a finger, a stylus pen, or the like on an information terminal that displays a workbook or the like for studying mathematics or for learning language, and then, the portable information terminal 2000 determines whether the answer is correct or not. The portable information terminal 2000 may have a function of performing speech interpretation. In that case, for example, the portable information terminal 2000 can be used in learning a foreign language. Such a portable information terminal is suitable for use as a teaching material such as a textbook, a notebook, or the like.

Figure 26C:
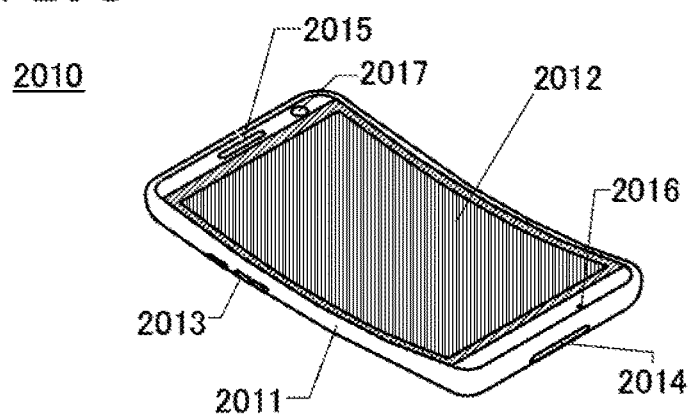

FIG. 26C illustrates an example of a portable information terminal. A portable information terminal 2010 illustrated in FIG. 26C includes a housing 2011, a display portion 2012, an operation button 2013, an external connection port 2014, a speaker 2015, a microphone 2016, a camera 2017, and the like.

The portable information terminal 2010 includes a touch sensor in the display portion 2012. Operations such as making a call and inputting a letter can be performed by touch on the display portion 2012 with a finger, a stylus, or the like.

With the operation button 2013, power on or off can be switched. In addition, types of images displayed on the display portion 2012 can be switched; for example, switching images from a mail creation screen to a main menu screen is performed.

When a sensing device such as a gyroscope sensor or an acceleration sensor is provided inside the portable information terminal 2010, the direction of display on the screen of the display portion 2012 can be automatically changed by determining the orientation of the portable information terminal 2010 (whether the portable information terminal 2010 is placed horizontally or vertically). Furthermore, the direction of display on the screen can be changed by touch on the display portion 2012, operation with the operation button 2013, sound input using the microphone 2016, or the like.

The portable information terminal 2010 functions as, for example, one or more of a telephone set, a notebook, and an information browsing system. For example, the portable information terminal 2010 can be used as a smartphone. The portable information terminal 2010 is capable of executing a variety of applications such as mobile phone calls, e-mailing, viewing and editing texts, music reproduction, reproducing a moving image, Internet communication, and computer games, for example.

Figure 26D:
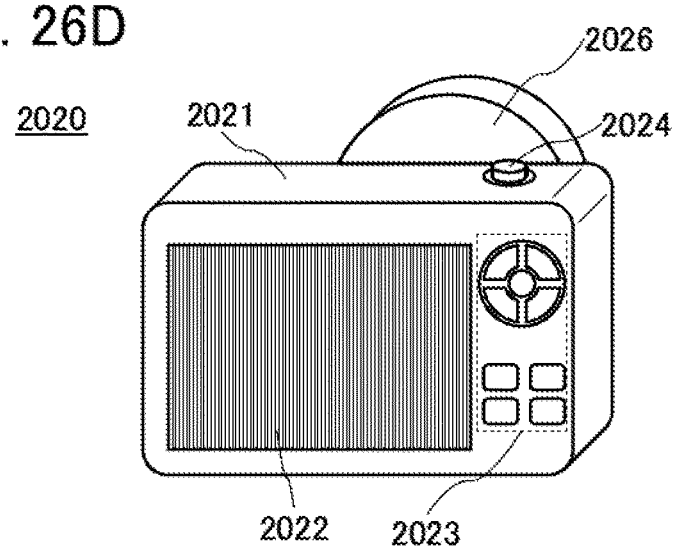

FIG. 26D illustrates an example of a camera. A camera 2020 includes a housing 2021, a display portion 2022, operation buttons 2023, a shutter button 2024, and the like. Furthermore, a detachable lens 2026 is attached to the camera 2020.

Although the lens 2026 of the camera 2020 here is detachable from the housing 2021 for replacement, the lens 2026 may be included in the housing.

Still and moving images can be taken with the camera 2020 at the press of the shutter button 2024. In addition, images can be taken at the touch of the display portion 2022 which serves as a touch panel.

Note that a stroboscope, a viewfinder, and the like can be additionally attached to the camera 2020. Alternatively, these components may be included in the housing 2021.

The display system described in the above embodiment can be provided in any of the electronic devices illustrated in FIGS. 26A to 26D. The display portion described in the above embodiment can be used as the display portion of any of the electronic devices illustrated in FIGS. 26A to 26D. Thus, the display system of one embodiment of the present invention can be mounted on any of the electronic devices.

This embodiment can be combined with any of the other embodiments as appropriate.

This application is based on Japanese Patent Application Serial No. 2016-149119 filed with Japan Patent Office on Jul. 29, 2016, the entire contents of which are hereby incorporated by reference.

What is claimed is:

1. A semiconductor device comprising:
an image processing portion comprising a correction circuit,
wherein the correction circuit comprises a programmable logic device,
wherein the programmable logic device is configured to be reconfigured so as to be capable of executing first gamma correction by input of first configuration data,
wherein the programmable logic device is configured to be reconfigured so as to be capable of executing second gamma correction by input of second configuration data,
wherein the first gamma correction is performed by a first method and the second gamma correction is performed by a second method,
wherein the first method is table approximation, and
wherein the second method is polygonal line approximation.

2. The semiconductor device according to claim 1,
wherein the programmable logic device comprises a first context and a second context,
wherein the first context is capable of configuring a circuit configured to execute the first gamma correction, and
wherein the second context is capable of configuring a circuit configured to execute the second gamma correction.

3. The semiconductor device according to claim 1,
wherein the correction circuit comprises a memory device and a switch circuit, and
wherein the memory device comprises a transistor comprising a metal oxide in a channel formation region.

4. The semiconductor device according to claim 1,
wherein the programmable logic device comprises a configuration memory, and
wherein the configuration memory comprises a transistor comprising a metal oxide in a channel formation region.

5. A semiconductor device comprising:
an image processing portion; and
a driver circuit,
wherein the image processing portion comprises a processor and a correction circuit,
wherein the correction circuit comprises a programmable logic device,
wherein the correction circuit is capable of correcting data input from the processor using the programmable logic device,
wherein the processor is capable of outputting data corrected by the correction circuit to the driver circuit as a video signal,
wherein the programmable logic device is configured to be reconfigured so as to be capable of executing first gamma correction by input of first configuration data,
wherein the programmable logic device is configured to be reconfigured so as to be capable of executing second gamma correction by input of second configuration data,
wherein the first gamma correction is performed by a first method and the second gamma correction is performed by a second method,
wherein the first method is table approximation, and
wherein the second method is polygonal line approximation.

6. The semiconductor device according to claim 5,
wherein the programmable logic device comprises a first context and a second context,
wherein the first context is capable of configuring a circuit configured to execute the first gamma correction, and
wherein the second context is capable of configuring a circuit configured to execute the second gamma correction.

7. The semiconductor device according to claim 5,
wherein the programmable logic device comprises a configuration memory, and
wherein the configuration memory comprises a transistor comprising a metal oxide in a channel formation region.

8. The semiconductor device according to claim 5,
wherein the correction circuit comprises a memory device and a switch circuit,
wherein the memory device is capable of storing a lookup table used for the first gamma correction,
wherein the switch circuit is capable of stopping power supply to the memory device in a period during which the second gamma correction is executed, and
wherein the memory device comprises a transistor comprising a metal oxide in a channel formation region.

9. A display device comprising a display portion and the semiconductor device according to claim 5,
wherein the display portion comprises a first pixel group comprising a plurality of first pixels and a second pixel group comprising a plurality of second pixels,
wherein the plurality of first pixels each comprise a light-emitting element,
wherein the plurality of second pixels each comprise a reflective liquid crystal element,
wherein the driver circuit is configured to supply a video signal subjected to the first gamma correction using table approximation to the first pixel group, and wherein the driver circuit is configured to supply a video signal subjected to the second gamma correction using polygonal line approximation to the second pixel group.

10. A display device comprising a display portion and the semiconductor device according to claim 5.

11. A display system comprising:
a control portion comprising an image processing portion and a driver circuit; and
a display portion,
wherein the image processing portion comprises a processor and a correction circuit,
wherein the correction circuit comprises a programmable logic device,
wherein the correction circuit is capable of correcting data input from the processor using the programmable logic device,
wherein the processor is capable of outputting data corrected by the correction circuit to the driver circuit as a video signal,
wherein the programmable logic device is configured to be reconfigured so as to be capable of executing first gamma correction by input of first configuration data,
wherein the programmable logic device is configured to be reconfigured so as to be capable of executing second gamma correction by input of second configuration data,
wherein the first gamma correction is performed by a first method and the second gamma correction is performed by a second method,
wherein the first method is table approximation,
wherein the second method is polygonal line approximation,
wherein the control portion is capable of generating the video signal using image data input to the control portion, and
wherein the display portion is capable of performing display using the video signal generated in the control portion.

12. The display system according to claim 11,
wherein the programmable logic device comprises a first context and a second context,
wherein the first context is capable of configuring a circuit configured to execute the first gamma correction, and
wherein the second context is capable of configuring a circuit configured to execute the second gamma correction.

13. The display system according to claim 11,
wherein the correction circuit comprises a memory device and a switch circuit,
wherein the memory device is capable of storing a look-up table used for the first gamma correction,
wherein the switch circuit is capable of stopping power supply to the memory device in a period during which the second gamma correction is executed, and
wherein the memory device comprises a transistor comprising a metal oxide in a channel formation region.

14. The display system according to claim 11,
wherein the display portion comprises a first pixel group comprising a plurality of first pixels and a second pixel group comprising a plurality of second pixels,
wherein the plurality of first pixels each comprise a light-emitting element,
wherein the plurality of second pixels each comprise a reflective liquid crystal element,
wherein a video signal subjected to the first gamma correction using table approximation is supplied to the first pixel group, and
wherein a video signal subjected to the second gamma correction using polygonal line approximation is supplied to the second pixel group.

15. The display system according to claim 11,
wherein the programmable logic device comprises a configuration memory, and
wherein the configuration memory comprises a transistor comprising a metal oxide in a channel formation region.

16. An electronic device comprising the display system according to claim 11,
wherein a character, a figure, or an image is identified using a touch sensor provided in the display portion.

* * * * *